(12) United States Patent
Nishi et al.

(10) Patent No.: US 7,611,821 B2
(45) Date of Patent: Nov. 3, 2009

(54) POSITIVE RESIST COMPOSITIONS AND PATTERNING PROCESS

(75) Inventors: Tsunehiro Nishi, Joetsu (JP); Takeshi Kinsho, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 11/774,300

(22) Filed: Jul. 6, 2007

(65) Prior Publication Data

US 2008/0008961 A1    Jan. 10, 2008

(30) Foreign Application Priority Data

Jul. 6, 2006    (JP) .............................. 2006-186302

(51) Int. Cl.
*G03F 7/00* (2006.01)
*G03F 7/004* (2006.01)

(52) U.S. Cl. .................... 430/270.1; 430/913; 526/281; 526/282

(58) Field of Classification Search ................. 430/311, 430/270.1
See application file for complete search history.

(56) References Cited

U.S. PATENT DOCUMENTS

| | | | |
|---|---|---|---|
| 5,714,625 A | 2/1998 | Hada et al. | |
| 6,004,724 A | 12/1999 | Yamato et al. | |
| 6,063,953 A | 5/2000 | Hada et al. | |
| 6,261,738 B1 | 7/2001 | Asakura et al. | |
| 6,312,867 B1 | 11/2001 | Kinsho et al. | |
| 6,329,125 B2 | 12/2001 | Takechi et al. | |
| 6,639,036 B2 * | 10/2003 | Park et al. ................... 526/284 |
| 6,710,148 B2 * | 3/2004 | Harada et al. ................ 526/245 |
| 6,788,477 B2 * | 9/2004 | Lin .............................. 359/820 |
| 6,916,591 B2 | 7/2005 | Ohsawa et al. | |
| 7,232,639 B2 * | 6/2007 | Maeda et al. ............ 430/270.1 |

FOREIGN PATENT DOCUMENTS

| | | |
|---|---|---|
| JP | 9-73173 A | 3/1997 |
| JP | 9-90637 A | 4/1997 |
| JP | 9-95479 A | 4/1997 |
| JP | 9-208554 A | 8/1997 |
| JP | 9-230588 A | 9/1997 |
| JP | 9-301948 A | 11/1997 |
| JP | 2906999 B2 | 6/1999 |
| JP | 2000-314956 A | 11/2000 |
| JP | 2000-336121 A | 12/2000 |
| WO | 2004-074242 B2 | 9/2004 |

OTHER PUBLICATIONS

Koji Arimitsu et al.; "Effect of Phenolic Hydroxyl Residues on the Improvement of Acid-Proliferation-Type Photoimaging Materials", Journal of Photopolymer Science and Technology, vol. 9, No. 1, 1996, pp. 29-30.

Koji Arimitsu et al.; "Sensitivity Enhancement of Chemical-Amplification-Type Photoimaging Materials by Acetoacetic Acid Derivativates"; Journal of Photopolymer Science and Technology, vol. 8, No. 1, 1995, pp. 43-44.

Kazuaki Kudo et al.; "Enhancement of the Senesitivity of Chemical-Amplification-Type Photoimaging Materials by B-Tosyloxyketone Acetals"; Journal of Photopolymer Science and Technology, vol. 8, No. 1, 1995, pp. 45-46.

* cited by examiner

*Primary Examiner*—Amanda C. Walke
(74) *Attorney, Agent, or Firm*—Westerman, Hattori, Daniels & Adrian, LLP.

(57) ABSTRACT

A positive resist composition is provided comprising (A) a resin component having a carboxylic acid moiety protected with an acetal protective group which is decomposable under the action of an acid, wherein in the carboxylic acid moiety protected with an acetal protective group, deprotection occurs not by way of β-elimination, and (B) a photoacid generator. The resist composition exhibits a high resolution when processed by ArF lithography.

2 Claims, No Drawings

POSITIVE RESIST COMPOSITIONS AND PATTERNING PROCESS

CROSS-REFERENCE TO RELATED APPLICATION

This non-provisional application claims priority under 35 U.S.C. §119(a) on Patent Application No. 2006-186302 filed in Japan on Jul. 6, 2006, the entire contents of which are hereby incorporated by reference.

TECHNICAL FIELD

This invention relates resist compositions suitable for microfabrication lithography with advantages of resolution, pattern density dependence and mask fidelity, and a patterning process using the same.

BACKGROUND OF THE INVENTION

In the recent drive for higher integration and operating speeds in LSI devices, the pattern rule is made drastically finer. Active efforts have been made on the development of microfabrication technology using deep ultraviolet and vacuum ultraviolet lithography. The photolithography using a light source in the form of a KrF excimer laser of wavelength 248 nm has reached a level enough to play a main role in the commercial production of semiconductor devices. Investigations are made on the use of an ArF excimer laser of wavelength 193 nm in order to achieve a further reduction of feature size and the technology has challenged for prototype production of some devices. Since the ArF excimer laser lithography has not matured as the micropatterning technology, a number of problems must be overcome before it can enter the commercial phase of device production.

Resist materials adapted for the ArF excimer laser lithography must meet several characteristics including transparency at wavelength 193 nm and dry etch resistance. As the resist material satisfying both the requirements, JP-A 9-73173 and JP-A 9-90637 disclose resist compositions comprising as a base resin a polymer of (meth)acrylic acid derivative having bulky acid-labile protective groups as typified by 2-ethyl-2-adamantyl and 2-methyl-2-adamantyl. While a number of resist materials have been proposed since then, they are almost common in that the resin used has a highly transparent backbone and a carboxylic acid moiety protected with a tertiary alkyl group.

While these resist materials suffer from many problems, a shortage of resolution is regarded a fatal deficiency in forming micro-size patterns. Specifically, tertiary alkyl groups which are often used as the protective group for carboxylic acids are generally less reactive, and their performance is absolutely short in the application where a high resolution is required as in forming fine trenches. Reactivity can be enhanced to some extent by increasing the temperature of heat treatment following exposure. However, the elevated temperature encourages acid diffusion, thereby exacerbating pattern density dependency and mask fidelity. An overall evaluation does not reach the conclusion that the resolution performance is enhanced. Unless the resolution performance is enhanced, it is impossible to fabricate finest feature semiconductor devices.

DISCLOSURE OF THE INVENTION

An object of the present invention is to provide a resist composition suitable for photolithography using high-energy radiation such as ArF excimer laser and having significantly improved resolution, and a patterning process using the same.

The inventors have discovered that a positive resist composition comprising as a base resin a polymer comprising a carboxylic acid moiety protected with an acetal protective group having a high reactivity, wherein deprotection of the acetal protective group occurs by a mechanism other than beta-elimination exhibits a significantly enhanced resolution performance and is thus a resist material quite useful in precise microfabrication.

Accordingly, the present invention provides a resist composition and a patterning process as defined below.

In a first aspect, the invention provides a positive resist composition comprising (A) a resin component having a carboxylic acid moiety protected with an acetal protective group which is decomposable under the action of an acid, and (B) a compound which generates an acid in response to actinic light or radiation. In the carboxylic acid moiety protected with an acetal protective group included in resin component (A), deprotection occurs by a mechanism other than beta-elimination, i.e., not by way of beta-elimination.

In one embodiment, the carboxylic acid moiety protected with an acetal protective group included in resin component (A) is (I) a structure having a carbon atom at an alpha-position having an oxygen atom substituted thereon, but no carbon atom at a beta-position to the alpha carbon atom and/or (II) a structure having a carbon atom at an alpha-position having an oxygen atom substituted thereon, a carbon atom at a beta-position to the alpha carbon atom, but no hydrogen atom on the beta carbon atom.

In a preferred embodiment, resin component (A) comprises recurring units each having a carboxylic acid moiety protected with an acetal protective group, said recurring units being units of at least one type having the general formula (1-1):

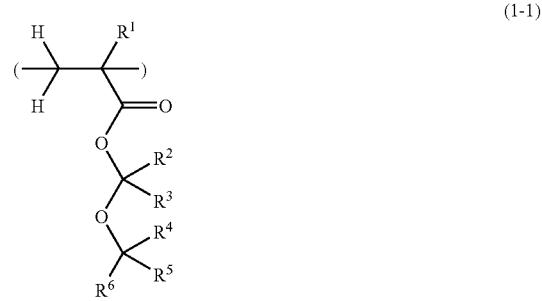

(1-1)

le;.5qwherein $R^1$ is hydrogen, methyl or trifluoromethyl; $R^2$, $R^3$, $R^4$, $R^5$ and $R^6$ are each independently hydrogen or $CR^7R^8R^9$; and $R^7$, $R^8$ and $R^9$ are each independently a straight, branched or cyclic monovalent hydrocarbon group of 1 to 20 carbon atoms optionally containing a heteroatom, or two or three of $R^7$, $R^8$ and $R^9$ on the same or different carbon atoms may bond together to form a ring with the carbon atoms to which they are attached, and in that event, a combination of two or three bonded stands for a di- or trivalent hydrocarbon group of 1 to 20 carbon atoms optionally containing a heteroatom.

In another preferred embodiment, resin component (A) comprises recurring units each having a carboxylic acid moiety protected with an acetal protective group, said recurring units being units of at least one type having the general formula (1-2):

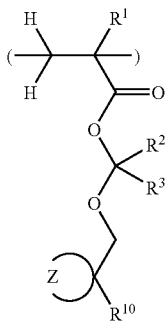
(1-2)

wherein $R^1$ is hydrogen, methyl or trifluoromethyl; $R^2$ and $R^3$ are each independently hydrogen or $CR^7R^8R^9$; $R^7$, $R^8$ and $R^9$ are each independently a straight, branched or cyclic monovalent hydrocarbon group of 1 to 20 carbon atoms optionally containing a heteroatom, or two or three of $R^7$, $R^8$ and $R^9$ on the same or different carbon atoms may bond together to form a ring with the carbon atoms to which they are attached, and in that event, a combination of two or three bonded stands for a di- or trivalent hydrocarbon group of 1 to 20 carbon atoms optionally containing a heteroatom; $R^{10}$ is a straight, branched or cyclic monovalent hydrocarbon group of 1 to 20 carbon atoms optionally containing a heteroatom; and Z is a divalent hydrocarbon group which forms an alicyclic structure of 3 to 20 carbon atoms with the carbon atom to which it is attached.

In another embodiment, the carboxylic acid moiety protected with an acetal protective group included in resin component (A) is (III) a structure having a fused ring structure containing a carbon atom at an alpha-position having an oxygen atom substituted thereon as a bridgehead and a carbon atom at a beta-position to the alpha carbon atom, wherein a hydrogen atom on the beta carbon atom is not eliminatable so as to avoid formation of a double bond at the bridgehead.

In a further embodiment, the carboxylic acid moiety is protected with an acetal protective group included in resin component (A) is (IV) a structure having a fused ring containing a carbon atom at an alpha-position having an oxygen atom substituted thereon, having one to three carbon atoms at a beta-position as a bridgehead, and having no hydrogen atoms on the remaining carbon atoms at beta-position, wherein a hydrogen atom on the beta carbon atom is not eliminatable so as to avoid formation of a double bond at the bridgehead. In a preferred embodiment, resin component (A) comprises recurring units each having a carboxylic acid moiety protected with an acetal protective group, said recurring units being units of at least one type having the general formula (1-3):

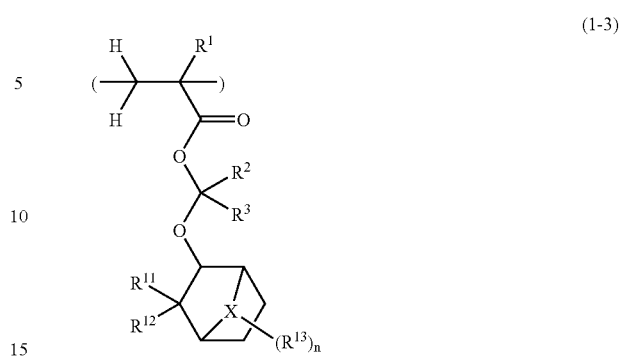
(1-3)

wherein $R^1$ is hydrogen, methyl or trifluoromethyl; $R^2$ and $R^3$ are each independently hydrogen or $CR^7R^8R^9$; $R^7$, $R^8$ and $R^9$ are each independently a straight, branched or cyclic monovalent hydrocarbon group of 1 to 20 carbon atoms optionally containing a heteroatom, or two or three of $R^7$, $R^8$ and $R^9$ on the same or different carbon atoms may bond together to form a ring with the carbon atoms to which they are attached, and in that event, a combination of two or three bonded stands for a di- or trivalent hydrocarbon group of 1 to 20 carbon atoms optionally containing a heteroatom; $R^{11}$, $R^{12}$ and $R^{13}$ are each independently a straight, branched or cyclic monovalent hydrocarbon group of 1 to 20 carbon atoms optionally containing a heteroatom, a number "n" of $R^{13}$ may bond to the ring at any position, or two of $R^{11}$, $R^{12}$ and $R^{13}$ or any two of $R^{13}$ may bond together to form a ring with the carbon atoms to which they are attached, and in that event, a combination of two bonded stands for a divalent hydrocarbon group of 1 to 20 carbon atoms optionally containing a heteroatom; X is —$CH_2$—, —$CH_2CH_2$—, —O— or —S—, and n is an integer of 0 to 4.

Also preferably, resin component (A) further comprises recurring units of at least one type selected from the general formulae (2), (3), (4) and (5):

(2)

(3)

(4)

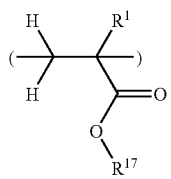

(5)

wherein $R^1$ is independently hydrogen, methyl or trifluoromethyl; $R^{14}$ is hydrogen or a monovalent hydrocarbon group of 1 to 15 carbon atoms containing at least one group selected from fluorinated substituent groups, carboxyl groups and hydroxyl groups; $R^{15}$ is a monovalent hydrocarbon group of 3 to 15 carbon atoms containing a —$CO_2$— partial structure; $R^{16}$ is a polycyclic hydrocarbon group of 7 to 15 carbon atoms or an alkyl group containing such a polycyclic hydrocarbon group; and $R^{17}$ is an acid labile group.

In a second aspect, the invention provides a process for forming a pattern, comprising the steps of applying the resist composition defined above onto a substrate to form a resist coating; heat treating the coating and exposing to high-energy radiation or electron beam through a photomask; and heat treating the exposed coating and developing with a developer. In one preferred embodiment, the exposing step is immersion lithography with a high refractive index liquid having a refractive index of at least 1.0 interposed between the resist coating and a projection lens. In another preferred embodiment, the process further comprises the step of applying a protective coating on the resist coating, and the exposing step is immersion lithography with a high refractive index liquid having a refractive index of at least 1.0 interposed between the protective coating and a projection lens.

BENEFITS OF THE INVENTION

The resist composition of the invention exhibits a significantly enhanced resolution when processed by microfabrication lithography, especially ArF lithography, and is quite useful in precise microfabrication.

DESCRIPTION OF THE PREFERRED EMBODIMENTS

The singular forms "a," "an and "the" include plural referents unless the context clearly dictates otherwise.

The notation (Cn-Cm) means a group containing from n to m carbon atoms per group.

Below the resist composition of the invention is described in detail. It is understood that for some structures represented by chemical formulae, there can exist enantiomers and diastereomers because of the presence of asymmetric carbon atoms. In such a case, a single formula collectively represents all such isomers. The isomers may be used alone or in admixture.

The resist material of the invention is a positive resist composition comprising (A) a resin component having a carboxylic acid moiety protected with an acetal protective group which is decomposable under the action of an acid, and (B) a compound which generates an acid in response to actinic light or radiation. In the carboxylic acid moiety protected with an acetal protective group included in resin component (A), deprotection occurs by a mechanism other than beta-elimination, i.e., not by way of beta-elimination.

In one preferred embodiment, the carboxylic acid moiety protected with an acetal protective group in resin component (A) is (I) a structure having a carbon atom at an alpha-position having an oxygen atom substituted thereon, but no carbon atom at a beta-position to the alpha carbon atom and/or (II) a structure having a carbon atom at an alpha-position having an oxygen atom substituted thereon, a carbon atom at a beta-position to the alpha carbon atom, but no hydrogen atom on the beta carbon atom. It is noted that the definition of a carbon atom at α-position (simply referred to as Cα, hereinafter) and a carbon atom at β-position (simply referred to as Cβ, hereinafter) is as shown by the following formula. Hydrogen atoms substituting on Cα and Cβ are simply referred to as Hα and Hβ, respectively.

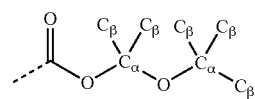

In the formula, the broken line designates a valence bond.

Where a hydrogen atom (Hβ) is present on Cβ, deprotection proceeds via β-elimination reaction according to the scheme A, shown below, forming a carboxylic acid and a corresponding olefin compound. Since this β-elimination reaction can proceed, in principle, solely in the presence of an acid catalyst, the reaction continues to occur as long as the protected carboxylic acid as the substrate is available. In contrast, in the case of the present invention, which employs structure (I) where Cβ is absent or structure (II) where a hydrogen atom (Hβ) is absent on Cβ, it is believed that deprotection does not proceed via β-elimination reaction unless the structure is converted into a structure where Hβ is present as a result of transition or the like of the carbon skeleton of carbocation regarded to be an intermediate. It is believed that decomposition reaction proceeds where a nucleophile is present within the resist system. In an example where the nucleophile is water or alcohol, probable decomposition is by the scheme B, shown below. Since the reaction of scheme B proceeds in the co-presence of a nucleophile such as water or alcohol, that reaction does not proceed beyond the available level of the nucleophile even when the acid catalyst is present in plenty. Accordingly, a resist composition comprising as the base resin a resin component having a carboxylic acid moiety protected with an acetal protective group according to the invention provides a high resolution performance that is backed by rapid deprotection reaction due to the very high reactivity of acetal protective group. At the same time, the limited amount of nucleophile co-present holds down the extent of reaction to an appropriate limit, so that no extreme chemical amplification does occur. That is, the composition performs well with respect to the required characteristics including pattern density dependency and mask fidelity.

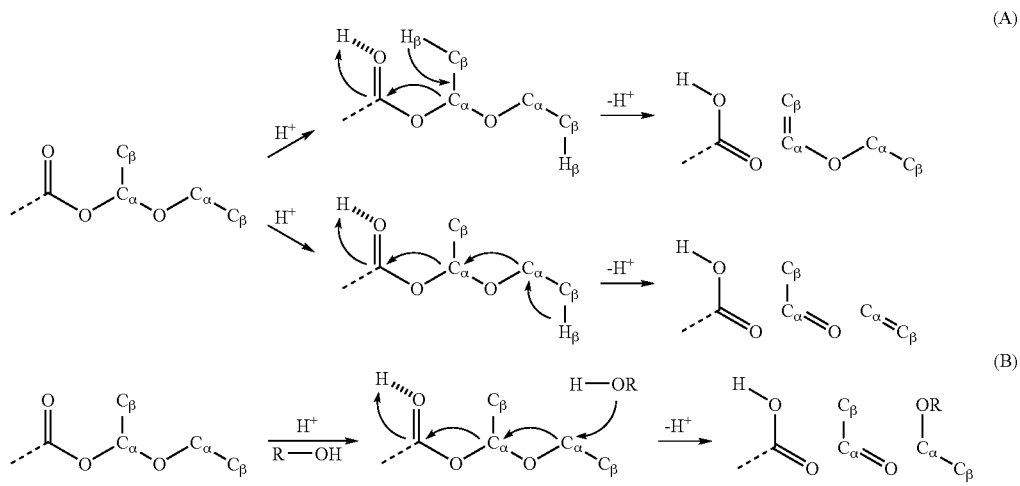

(A)

(B)

Note that the broken line indicates a valence bond, and R is a hydrogen atom or a monovalent substituent group.

For the above reason, the acetal protective group used herein which is deprotected by a mechanism other than β-elimination is distinguishable from other acetal protective groups merely characterized by high reactivity. Although the acetal protective group which is deprotected by a mechanism other than β-elimination falls, in a broad sense, within the concept of "acetal protective group," it should be essentially managed as a distinct species because it has so different chemical properties that it exerts unique effects when used in resist material. Since the concept of "acetal protective group" per se is already known in the art, neither novelty nor inventive step is found in the acetal protective group itself. By contrast, the concept of acetal protective group being deprotected not by way of β-elimination substantially deviates from the general understanding of acetal protective group. It is emphasized herein that even if the acetal protective group of the present invention accidentally falls within the scope of general formulae described and defined in the past patents and references, which are not intended to teach the unique concept of the present invention, the predominance of the present invention is not denied at all.

When resin component (A) comprises recurring units each having a carboxylic acid moiety protected with an acetal protective group which is deprotected by a mechanism other than β-elimination wherein the carboxylic acid moiety assumes structure (I) and/or (II), the preferred recurring units are units of the general formula (1-1).

Herein, $R^1$ is hydrogen, methyl or trifluoromethyl. $R^2$, $R^3$, $R^4$, $R^5$ and $R^6$ are each independently hydrogen or $CR^7R^8R^9$. $R^7$, $R^8$ and $R^9$ are each independently a straight, branched or cyclic monovalent hydrocarbon group of 1 to 20 carbon atoms optionally containing a heteroatom, examples of which include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl, and modified forms of the foregoing in which any carbon-carbon bond is separated by a hetero atomic group such as —O—, —S—, —SO—, —SO$_2$—, —NH—, —C(=O)—, —C(=O)O— or —C(=O)NH— or in which any hydrogen atom is substituted by a functional group such as —OH, —NH$_2$, —CHO, or —CO$_2$H. Alternatively, two or three of $R^7$, $R^8$ and $R^9$ on the same or different carbon atoms may bond together to form a ring with the carbon atoms to which they are attached, and in that event, a combination of two or three bonded stands for a di- or trivalent hydrocarbon group of 1 to 20 carbon atoms optionally containing a heteroatom, examples of which are di- or trivalent groups obtained by eliminating one or two hydrogen atoms from the exemplary groups illustrated above.

Of the recurring units each having a carboxylic acid moiety protected with an acetal protective group (which is deprotected by a mechanism other than β-elimination) wherein the carboxylic acid moiety assumes structure (I) and/or (II), units of the general formula (1-2) are more preferred.

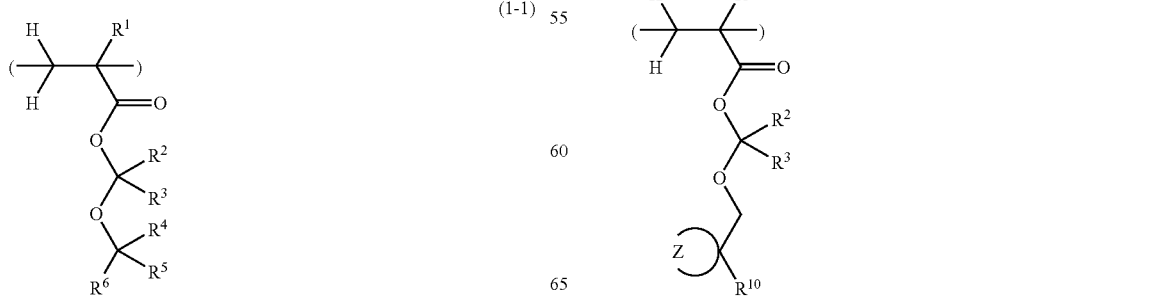

Herein $R^1$ is hydrogen, methyl or trifluoromethyl. $R^2$ and $R^3$ are each independently hydrogen or $CR^7R^8R^9$. $R^7$, $R^8$ and $R^9$ are each independently a straight, branched or cyclic monovalent hydrocarbon group of 1 to 20 carbon atoms optionally containing a heteroatom, or two or three of $R^7$, $R^8$ and $R^9$ on the same or different carbon atoms may bond together to form a ring with the carbon atoms to which they are attached, and in that event, a combination of two or three stands for a di- or trivalent hydrocarbon group of 1 to 20 carbon atoms optionally containing a heteroatom. Illustrative examples of $R^7$, $R^8$ and $R^9$ are as exemplified above for formula (1-1). $R^{10}$ is a straight, branched or cyclic monovalent hydrocarbon group of 1 to 20 carbon atoms optionally containing a heteroatom, examples of which are as exemplified above as the monovalent groups of $R^7$, $R^8$ and $R^9$. Z is a divalent hydrocarbon group which forms an alicyclic structure of 3 to 20 carbon atoms with the carbon atom to which it is attached. Examples of suitable rings formed by Z include cyclopentane, cyclohexane, norbornane, oxanorbornane, bicyclo[2.2.2]octane, adamantane, tricyclo[5.2.1.0$^{2,6}$]decane, tetracyclo[4.4.0.1$^{2,5}$.1$^{7,10}$]dodecane, and substituted forms of these groups in which any hydrogen atom is substituted by an alkyl group such as methyl, ethyl or the like.

Illustrative non-limiting examples of suitable recurring units having formulae (1-1) and (1-2) are given below.

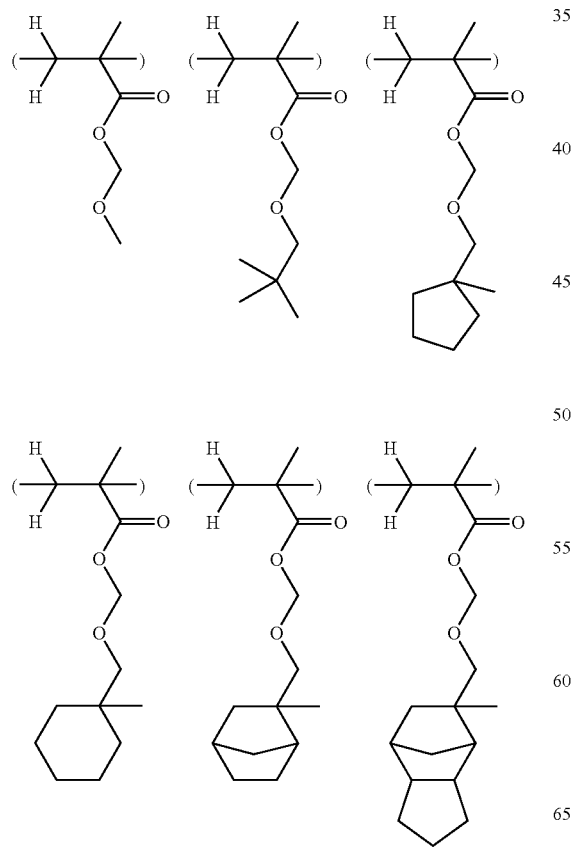

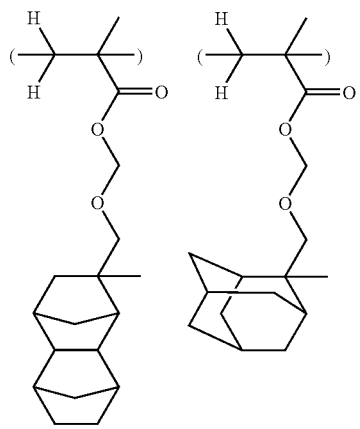

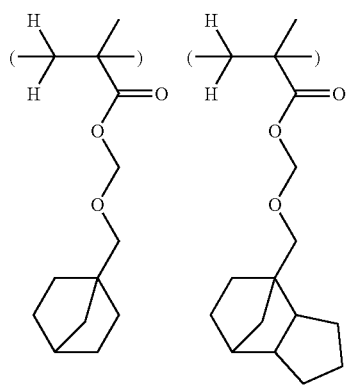

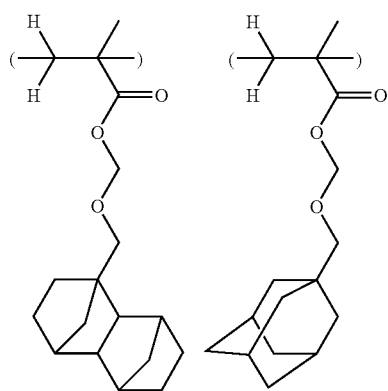

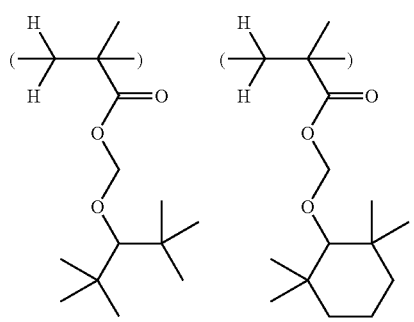

-continued
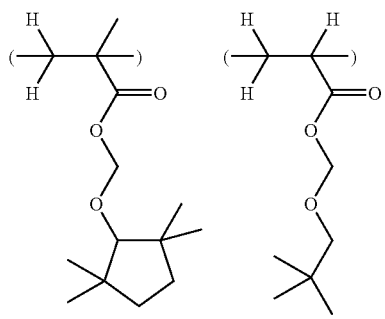
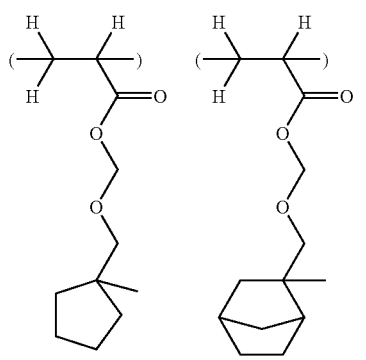
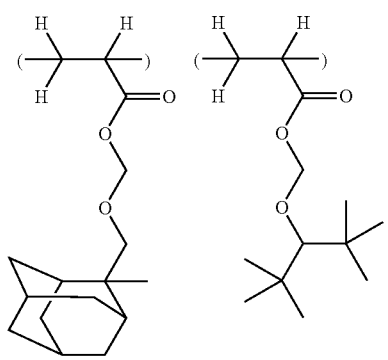
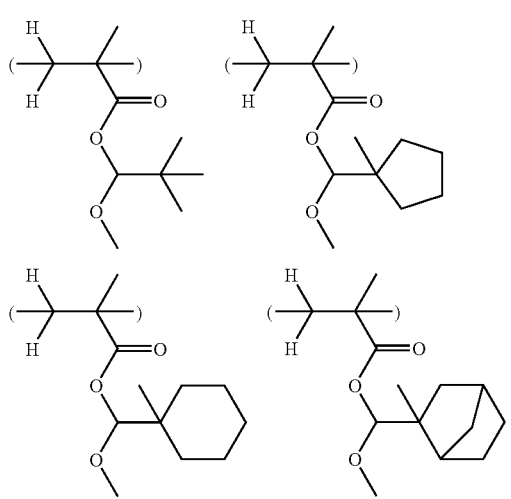
-continued
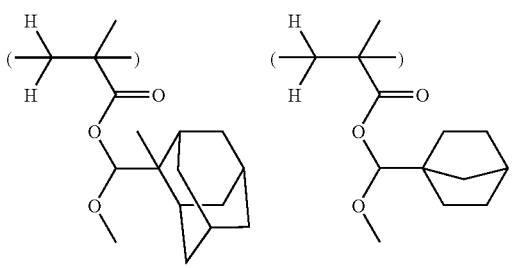
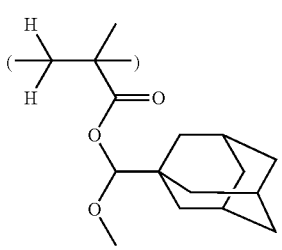
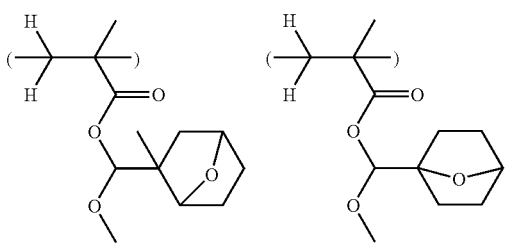
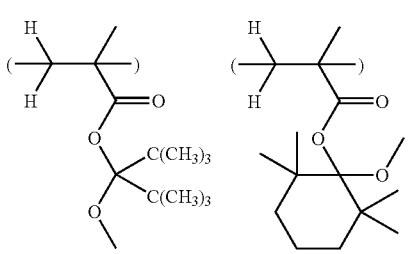
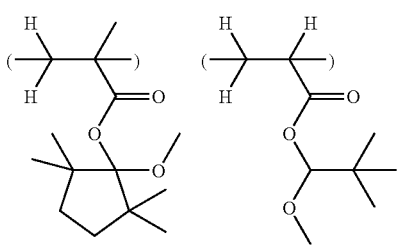

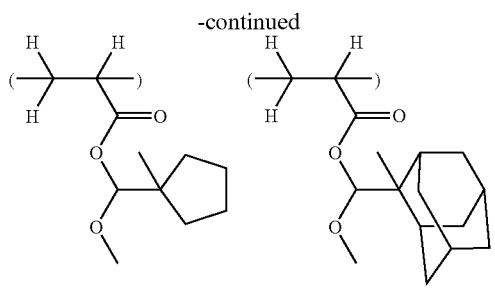
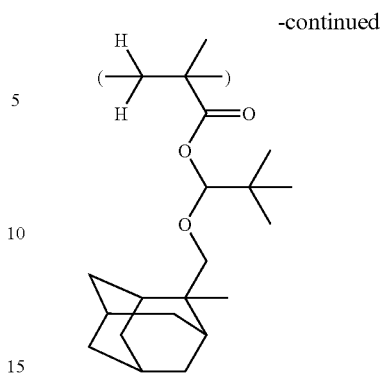
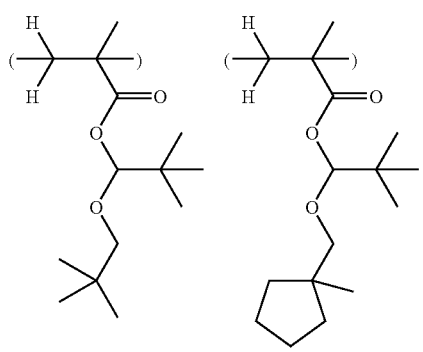
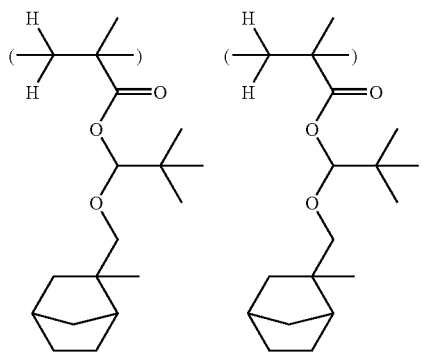

In a further preferred embodiment of resin component (A), the carboxylic acid moiety protected with an acetal protective group is (III) a structure having a fused ring structure containing Cα as a bridgehead and Cβ wherein a hydrogen atom on the Cβ is not eliminatable so as to avoid formation of a double bond at the bridgehead and/or (IV) a structure having a fused ring containing Cα, having one to three Cβ as a bridgehead, and having no hydrogen atoms on the remaining Cβ wherein a hydrogen atom on Cβ is not eliminatable so as to avoid formation of a double bond at the bridgehead.

In structure (III), as shown in scheme (C) below, a hydrogen atom on Cβ is apparently eliminatable on a look at the planar formula. In fact, however, a double bond cannot be introduced at the bridgehead due to a steric factor unless the carbon skeleton alters due to transition or the like, and deprotection by way of β-elimination cannot occur. This is also true for structure (IV). As shown in scheme (D) below, a hydrogen atom on Cβ is not eliminated, meaning that deprotection by way of β-elimination does not occur. In either of structures (III) and (IV), deprotection proceeds in the co-presence of a nucleophile. The reaction itself proceeds rapidly due to high reactivity, but does not spread randomly. When applied to resist material, this leads to high resolution, improved pattern density dependency and mask fidelity. Although norbornane (i.e., bicyclo[2.2.1]heptane) is illustrated as a typical fused ring in the schemes below, other preferred fused rings include bicyclo[2.2.2]octane, adamantane, tricyclo[5.2.1.0$^{2,6}$]decane and tetracyclo[4.4.0.1$^{2,5}$.1$^{7,10}$]dodecane.

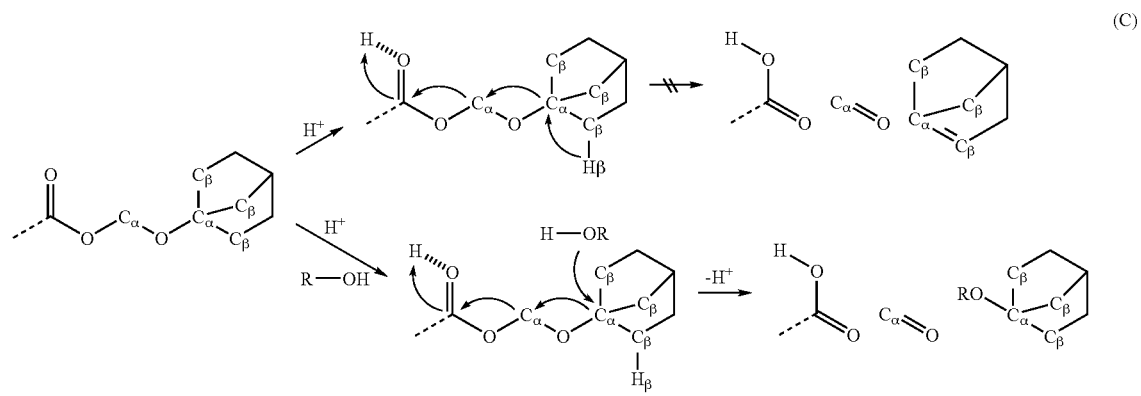

(C)

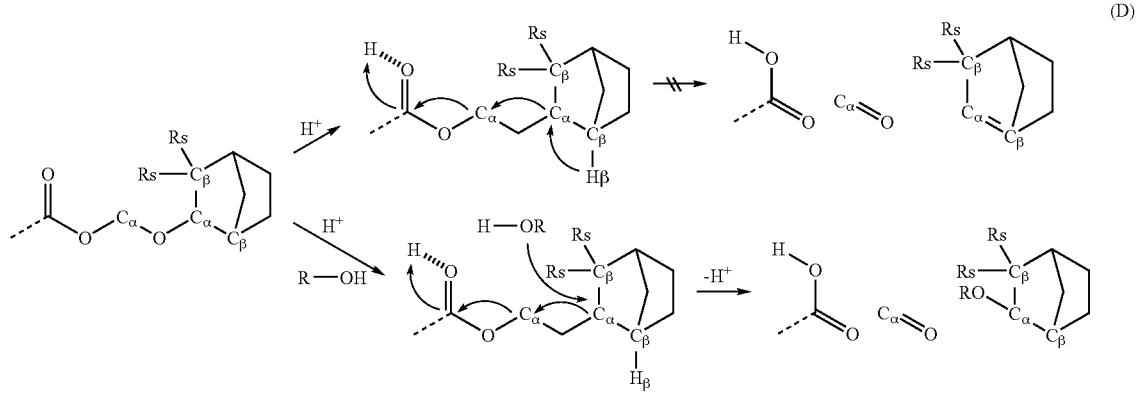

(D)

Note that the broken line indicates a valence bond, R is a hydrogen atom or a monovalent substituent group, and Rs is a monovalent substituent group.

Preferred recurring units having a carboxylic acid moiety protected with an acetal protective group which is deprotected by a mechanism other than β-elimination wherein the carboxylic acid moiety assumes structure (III) and/or (IV) are units of the general formula (1-3).

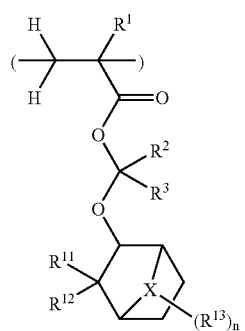

(1-3)

Herein, $R^1$ is hydrogen, methyl or trifluoromethyl. $R^2$ and $R^3$ are each independently hydrogen or $CR^7R^8R^9$. $R^7$, $R^8$ and $R^9$ are each independently a straight, branched or cyclic monovalent hydrocarbon group of 1 to 20 carbon atoms optionally containing a heteroatom, examples of which include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl, and modified forms of the foregoing in which any carbon-carbon bond is separated by a hetero atomic group such as —O—, —S—, —SO—, —SO$_2$—, —NH—, —C(=O)—, —C(=O)O— or —C(=O)NH— or in which any hydrogen atom is substituted by a functional group such as —OH, —NH$_2$, —CHO, or —CO$_2$H. Alternatively, two or three of $R^7$, $R^8$ and $R^9$ on the same or different carbon atoms may bond together to form a ring with the carbon atoms to which they are attached, and in that event, a combination of two or three stands for a di- or trivalent hydrocarbon group of 1 to 20 carbon atoms optionally containing a heteroatom, examples of which are di- or trivalent groups obtained by eliminating one or two hydrogen atoms from the exemplary groups illustrated above. $R^{11}$, $R^{12}$ and $R^{13}$ are each independently a straight, branched or cyclic monovalent hydrocarbon group of 1 to 20 carbon atoms optionally containing a heteroatom, examples of which are as exemplified above as the monovalent groups of $R^7$, $R^8$ and $R^9$. A number "n" of $R^{13}$ may bond to the ring at any position. Alternatively, two of $R^{11}$, $R^{12}$ and $R^{13}$ or any two of $R^{13}$ may bond together to form a ring with the carbon atoms to which they are attached, and in that event, a combination of two stands for a divalent hydrocarbon group of 1 to 20 carbon atoms optionally containing a heteroatom, examples of which are as exemplified above as the divalent groups of $R^7$, $R^8$ and $R^9$. X is —CH$_2$—, —CH$_2$CH$_2$—, —O— or —S—, and n is an integer of 0 to 4.

Shown below are illustrative non-limiting examples of suitable recurring units having a carboxylic acid moiety protected with an acetal protective group which is deprotected by a mechanism other than β-elimination wherein the carboxylic acid moiety assumes structure (III) and/or (IV), including recurring units of the general formula (1-3).

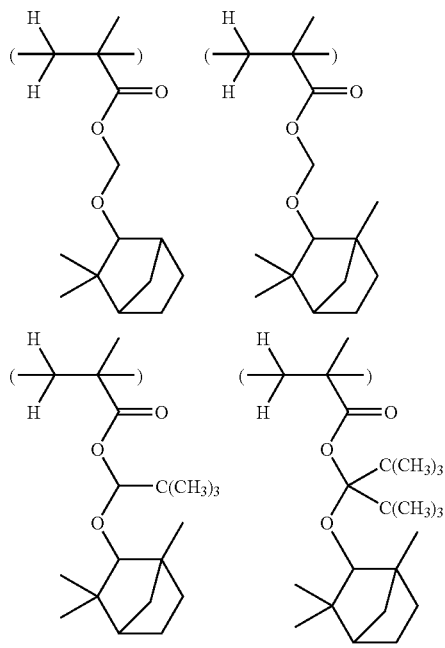

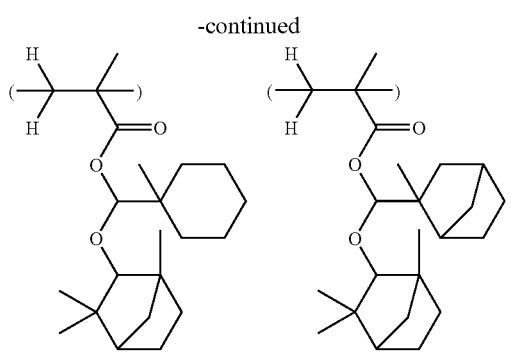
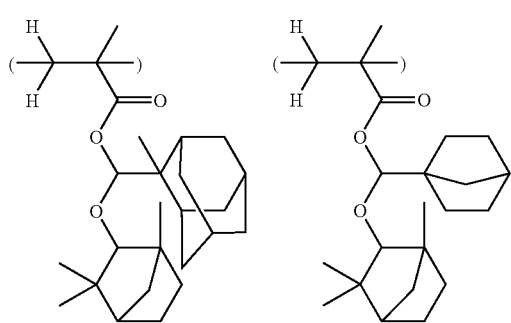
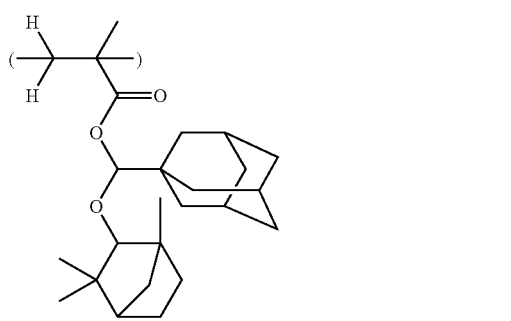
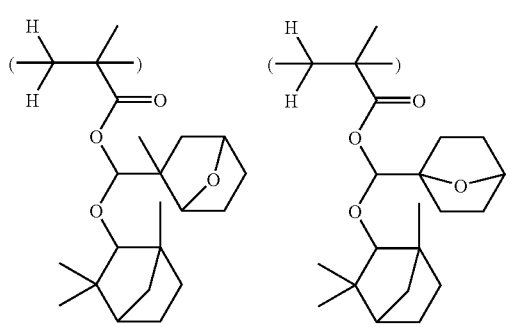
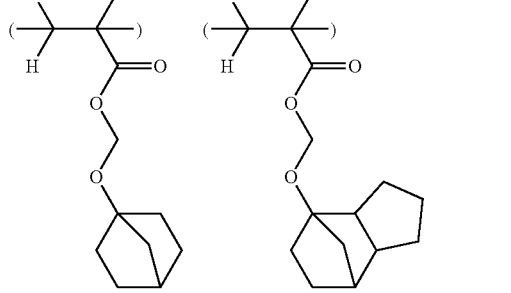
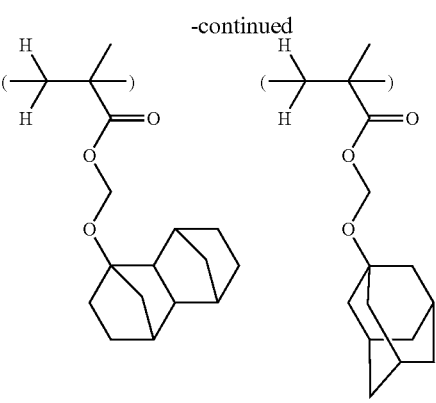
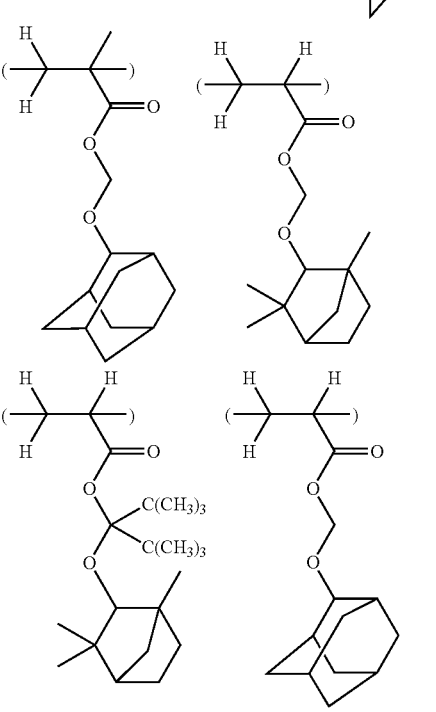
In addition to recurring units having a carboxylic acid moiety protected with an acetal protective group which is deprotected by a mechanism other than β-elimination, the resin component (A) may further comprise recurring units of at least one type selected from the following general formulae (2), (3), (4) and (5).
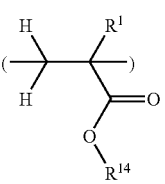
(2)
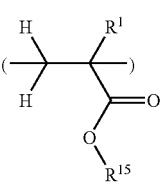
(3)

-continued

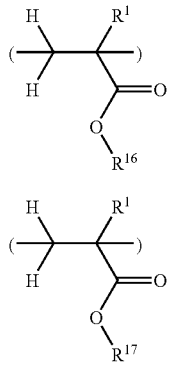

(4)

(5)

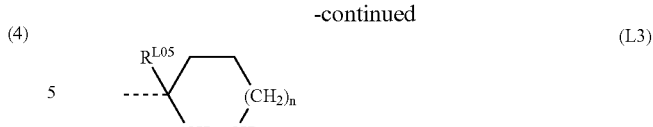

(L3)

(L4)

Herein R¹ is independently hydrogen, methyl or trifluoromethyl.

$R^{14}$ is hydrogen or a monovalent hydrocarbon group of 1 to 15 carbon atoms having at least one group selected from among fluorinated substituent groups, carboxyl groups and hydroxyl groups. Examples include hydrogen, carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, hydroxyadamantyl, [2,2,2-trifluoro-1-hydroxy-1-(trifluoromethyl)ethyl]-cyclohexyl, and bis[2,2,2-trifluoro-1-hydroxy-1-(trifluoromethyl)ethyl]-cyclohexyl.

$R^{15}$ is a monovalent hydrocarbon group of 3 to 15 carbon atoms containing a —CO₂— partial structure. Examples include 2-oxooxolan-3-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

$R^{16}$ is a polycyclic hydrocarbon group having 7 to 15 carbon atoms or an alkyl group containing such a polycyclic hydrocarbon group. Examples include norbornyl, bicyclo[3.3.1]nonyl, tricyclo[5.2.1.0²,⁶]decyl, adamantyl, ethyladamantyl, butyladamantyl, norbornylmethyl, adamantylmethyl and the like.

$R^{17}$ is an acid labile group. The acid labile group may be selected from a variety of such groups. It is a group to be deprotected by the acid generated from the photoacid generator to be described later and may be any of well-known acid labile groups which are commonly used in prior art resist compositions, especially chemically amplified resist compositions. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

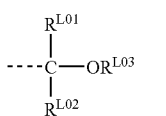

(L1)

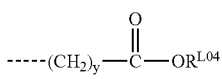

(L2)

Herein the broken line denotes a valence bond. $R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a hetero atom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like. Illustrative examples of the straight, branched or cyclic alkyl groups are as exemplified above for $R^{L01}$ and $R^{L02}$, and examples of the substituted alkyl groups are as shown below.

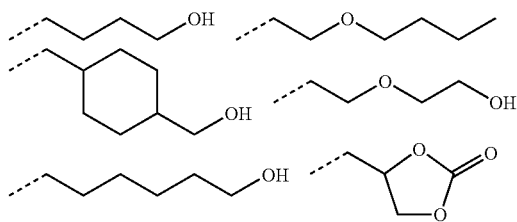

A pair of $R^{L01}$ and $R^{L02}$, $R^{L01}$ and $R^{L03}$, or $R^{L02}$ and $R^{L03}$ may together form a ring with carbon and oxygen atoms to which they are attached. The cyclization group of $R^{L01}$, $R^{L02}$ and $R^{L03}$ is a straight or branched alkylene group of 1 to 18 carbon atoms, preferably 1 to 10 carbon atoms when they form a ring.

$R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 2-(tricyclo[5.2.1.0²,⁶]decan-8-yl)propan-2-yl, 2-(tetracyclo[4.4.0.1²,⁵.1⁷,¹⁰]dodecan-3-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl, 8-methyl-8-tricyclo[5.2.1.0²,⁶]decyl, 8-ethyl-8-tricyclo[5.2.1.0²,⁶]decyl, 3-methyl-3-tetracyclo[4.4.0.1²,⁵.1⁷,¹⁰]dodecyl, 3-ethyl-3-tetracyclo[4.4.0.1²,⁵.1⁷,¹⁰]dodecyl, and the like. Exemplary trialkylsilyl groups are trimethylsilyl, triethylsilyl, and dimethyl-tert-butylsilyl.

Exemplary oxoalkyl groups are 3-oxocyclohexyl, 4-methyl-2-oxooxan-4-yl, and 5-methyl-2-oxooxolan-5-yl. Letter y is an integer of 0 to 6.

In formula (L3), $R^{L05}$ is an optionally substituted, straight, branched or cyclic $C_1$-$C_{10}$ alkyl group or an optionally substituted $C_6$-$C_{20}$ aryl group. Examples of the optionally substituted alkyl groups include straight, branched or cyclic alkyl groups such as methyl, ethyl, propyl, isopropyl, n-butyl, sec-butyl, tert-butyl, tert-amyl, n-pentyl, n-hexyl, cyclopentyl, cyclohexyl, and bicyclo[2.2.1]heptyl, and substituted forms of such groups in which some hydrogen atoms are replaced by hydroxyl, alkoxy, carboxy, alkoxycarbonyl, oxo, amino, alkylamino, cyano, mercapto, alkylthio, sulfo or other groups or in which some methylene groups are replaced by oxygen or sulfur atoms. Examples of optionally substituted aryl groups include phenyl, methylphenyl, naphthyl, anthryl, phenanthryl, and pyrenyl. Letter m is equal to 0 or 1, n is equal to 0, 1, 2 or 3, and 2m+n is equal to 2 or 3.

In formula (L4), $R^{L06}$ is an optionally substituted, straight, branched or cyclic $C_1$-$C_{10}$ alkyl group or an optionally substituted $C_6$-$C_{20}$ aryl group. Examples of these groups are the same as exemplified for $R^{L05}$. $R^{L07}$ to $R^{L16}$ independently represent hydrogen or monovalent hydrocarbon groups of 1 to 15 carbon atoms. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxy, alkoxycarbonyl, oxo, amino, alkylamino, cyano, mercapto, alkylthio, sulfo or other groups. Alternatively, $R^{L07}$ to $R^{L16}$ may bond together to form a ring (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are those exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or a similar pair).

Of the acid labile groups of formula (L1), the straight and branched ones are exemplified by the following groups.

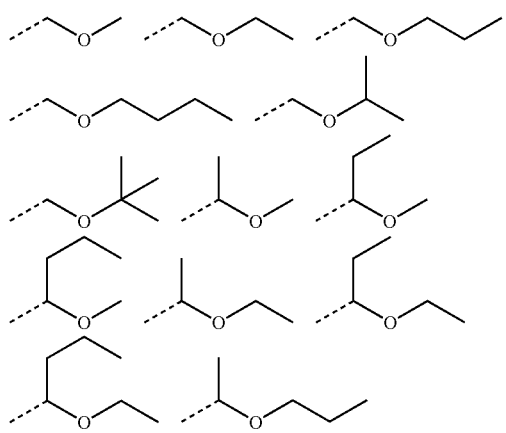

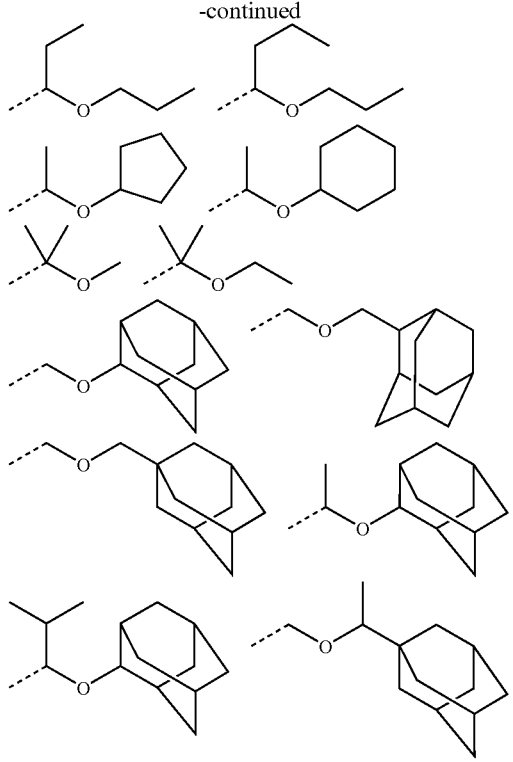

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxybutyl)cyclopentyl, 1-(bicyclo[2.2.1]heptan-2-yl)cyclopentyl, 1-(7-oxabicyclo[2.2.1]heptan-2-yl)cyclopentyl, 1-methylcyclohexyl, 1-ethylcyclohexyl, 1-methyl-2-cyclopentenyl, 1-ethyl-2-cyclopentenyl, 1-methyl-2-cyclohexenyl, and 1-ethyl-2-cyclohexenyl groups.

Of the acid labile groups of formula (L4), those groups of the following formulae (L4-1) to (L4-4) are preferred.

(L4-1)

-continued

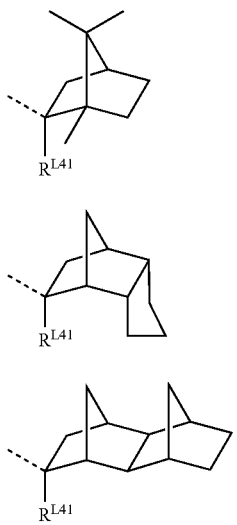

(L4-2)

(L4-3)

(L4-4)

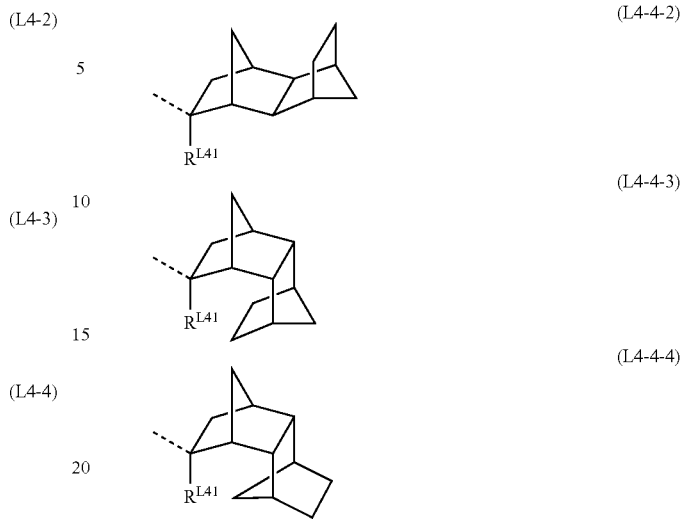

(L4-4-2)

(L4-4-3)

(L4-4-4)

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two or more selected from groups having the following general formulas (L4-3-1) and (L4-3-2).

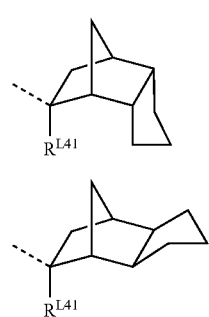

(L4-3-1)

(L4-3-2)

Similarly, the general formula (L4-4) represents one or a mixture of two or more selected from groups having the following general formulas (L4-4-1) to (L4-4-4).

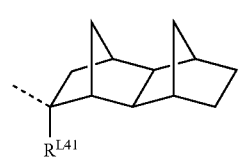

(L4-4-1)

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1]heptane ring, which ensures high reactivity for acid catalyzed elimination reaction (see JP-A 2000-336121). In preparing these monomers having a tertiary exo-alkyl group of bicyclo[2.2.1]heptane skeleton as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

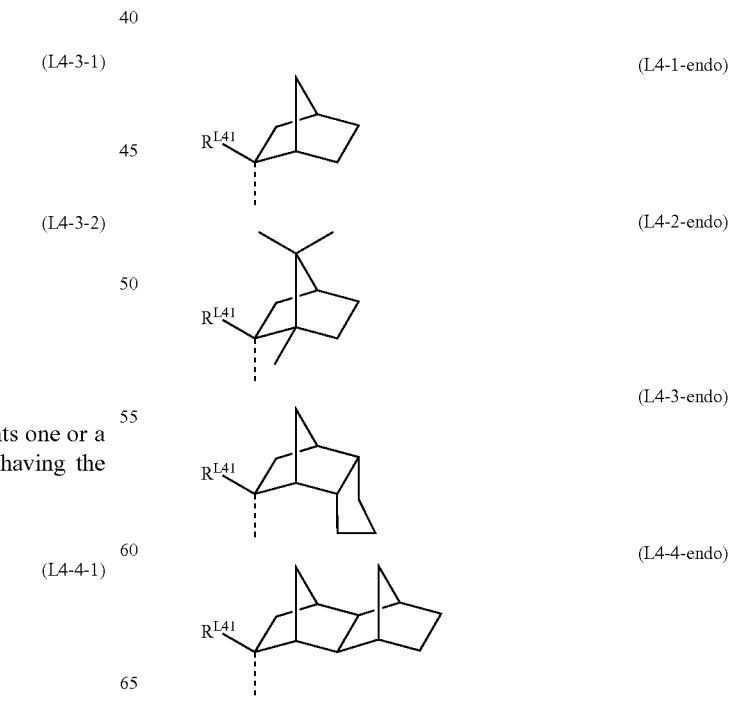

(L4-1-endo)

(L4-2-endo)

(L4-3-endo)

(L4-4-endo)

Illustrative examples of the acid labile group of formula (L4) are given below.

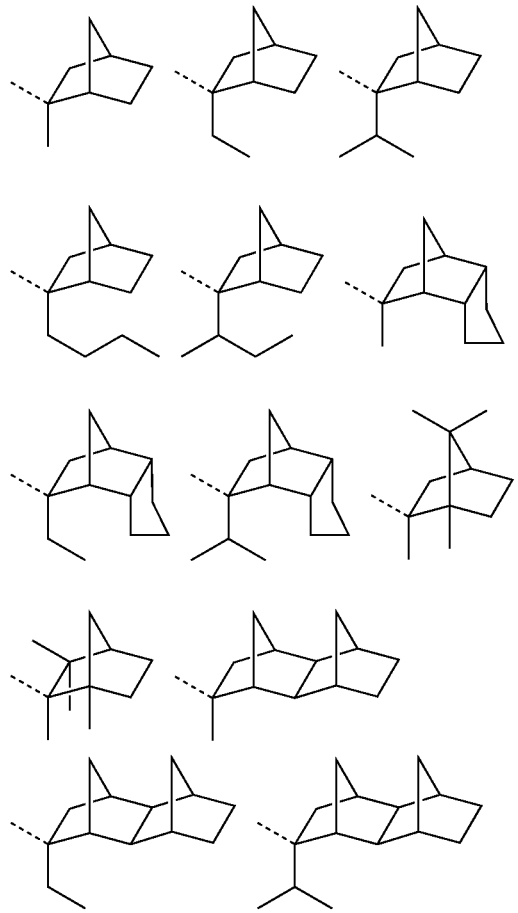

Examples of the tertiary $C_4$-$C_{20}$ alkyl groups, trialkylsilyl groups in which each alkyl moiety has 1 to 6 carbon atoms, and $C_4$-$C_{20}$ oxoalkyl groups are as exemplified for $R^{LO4}$ and the like.

With respect to the recurring units of formulae (2) to (5), units of more than one type may be incorporated at the same time. Incorporation of units of more than one type enables to adjust the performance of a resist material in which the resulting polymer is formulated.

Examples of the recurring units having formula (2) are given below, but not limited thereto.

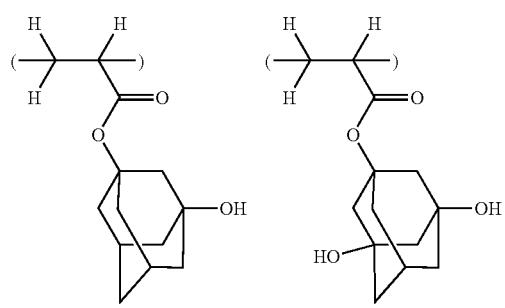

-continued

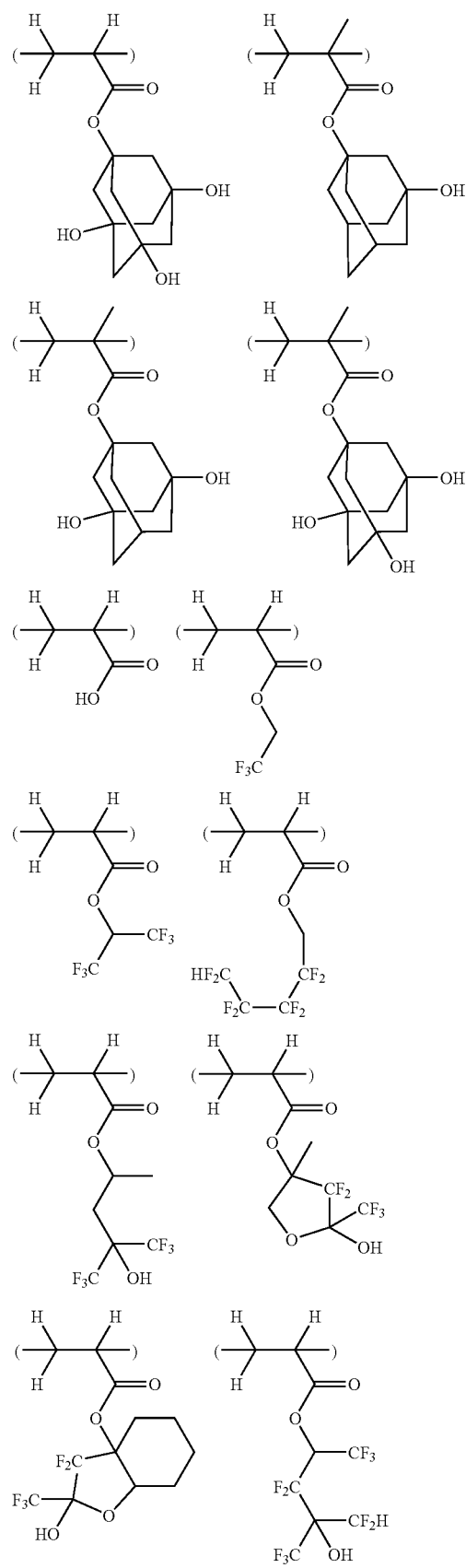

-continued
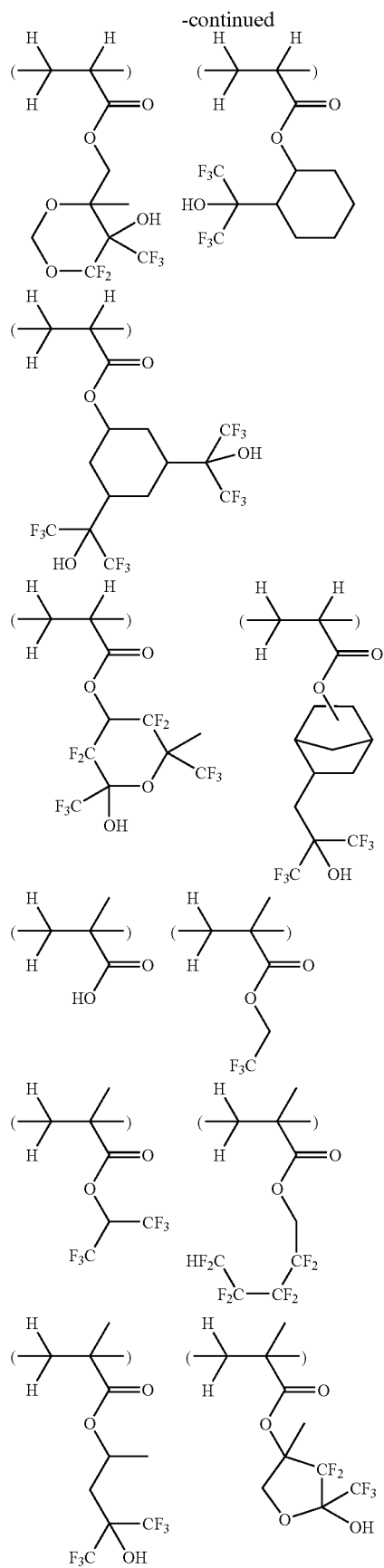
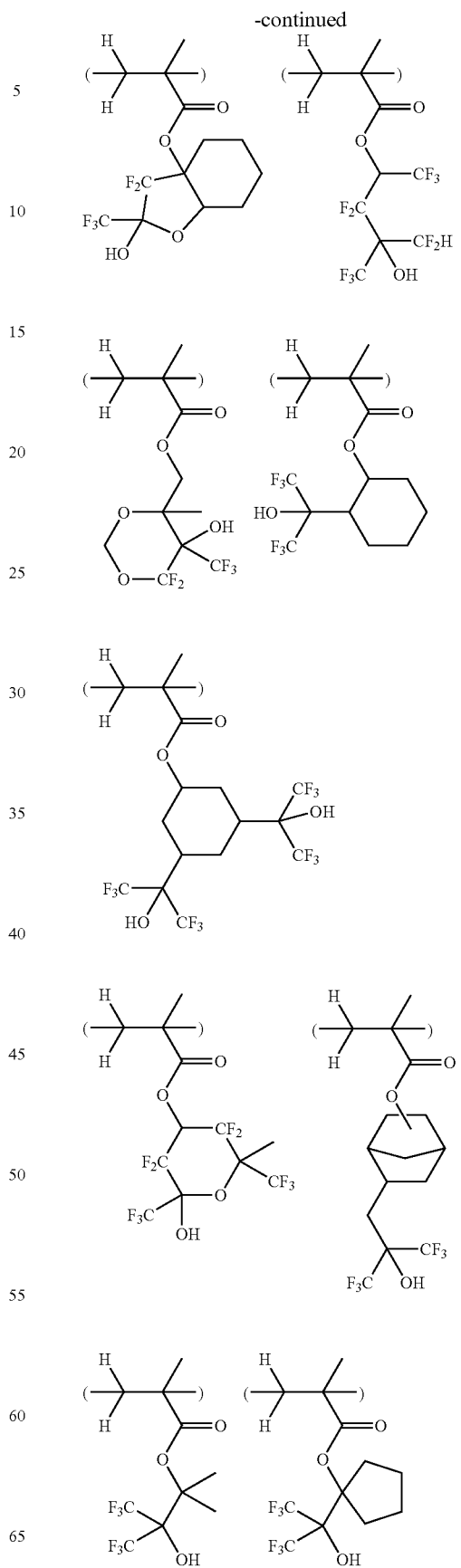

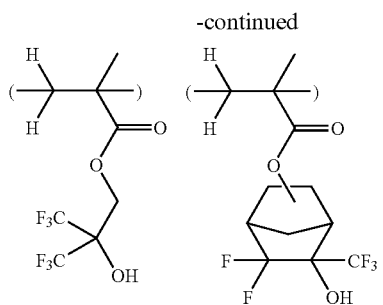
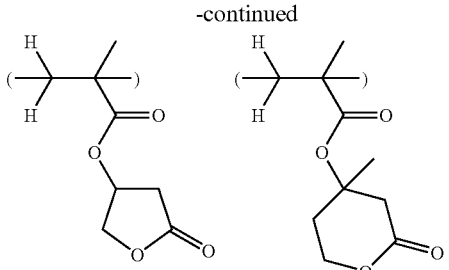
Examples of the recurring units having formula (3) are given below, but not limited thereto.
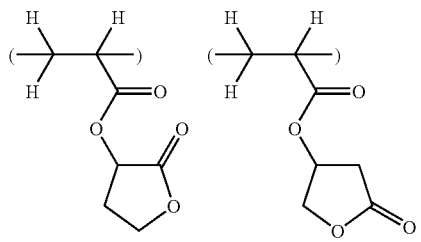
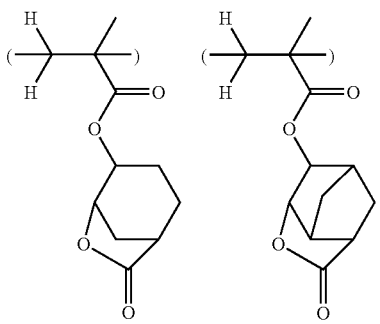
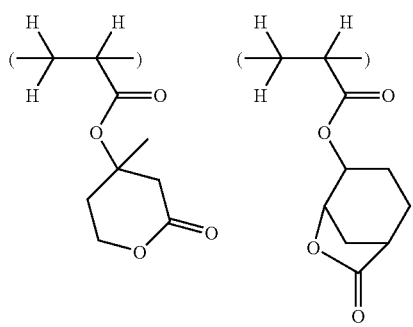
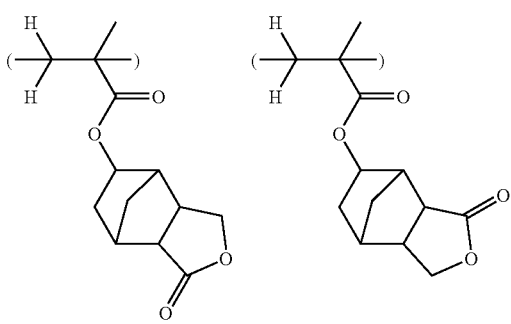
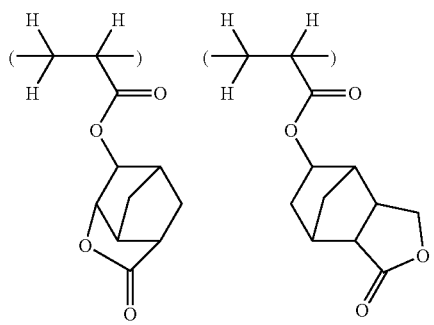
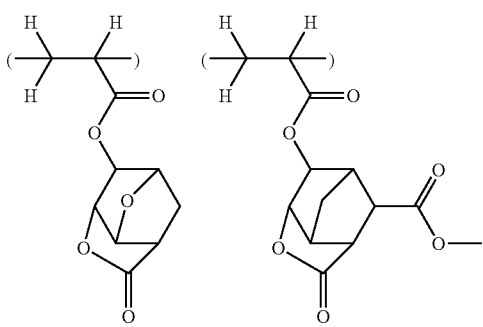
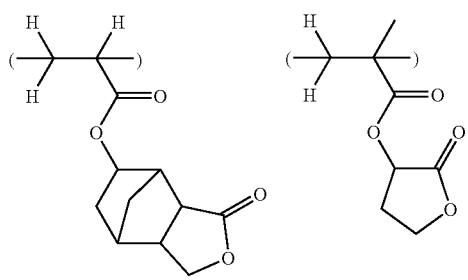
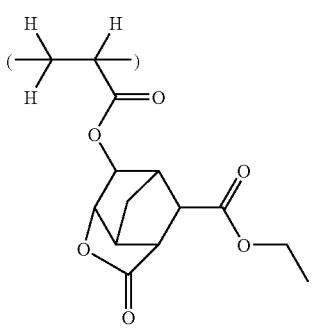

-continued
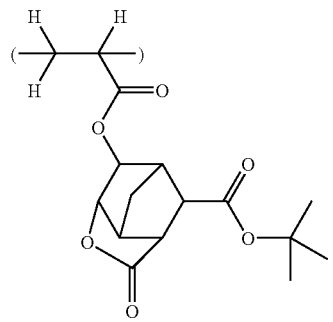
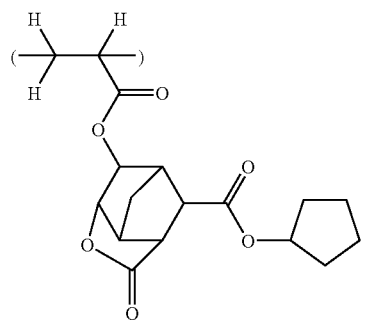
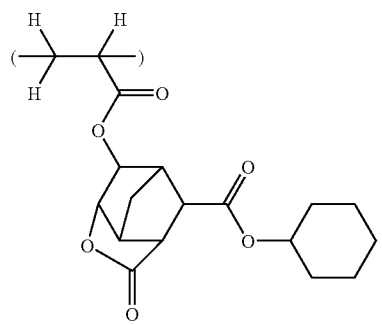
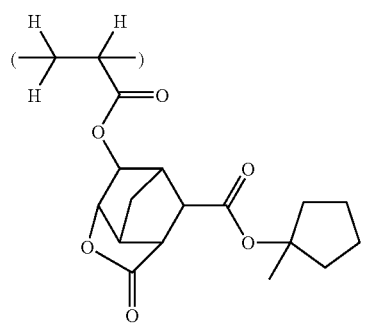
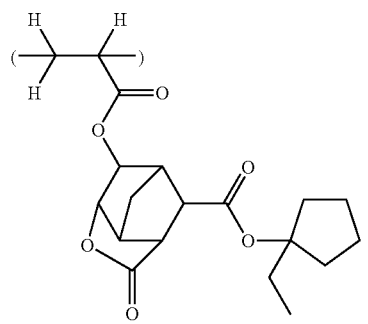
-continued
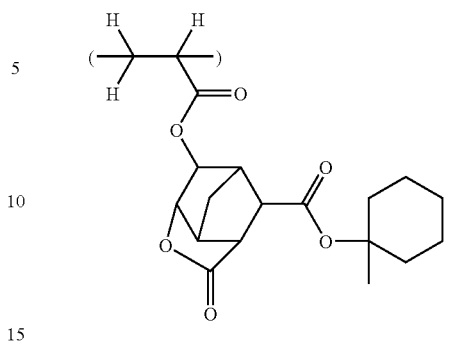
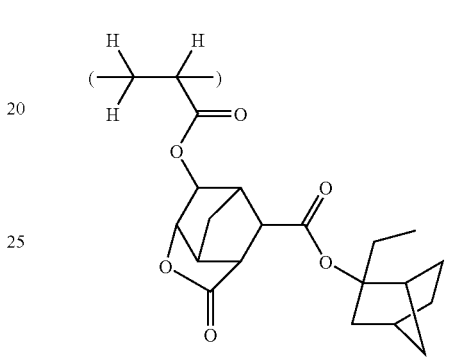
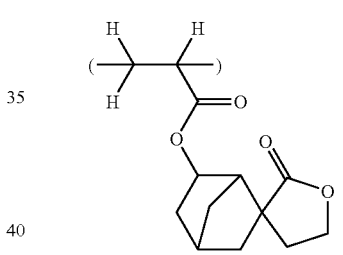
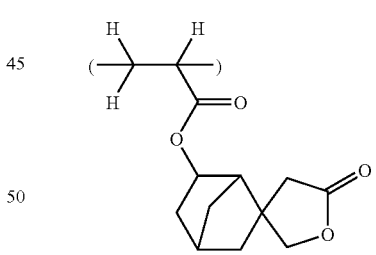
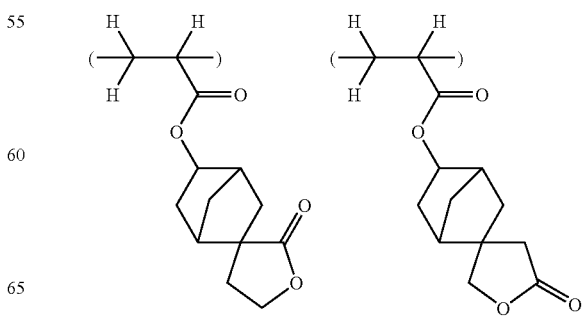

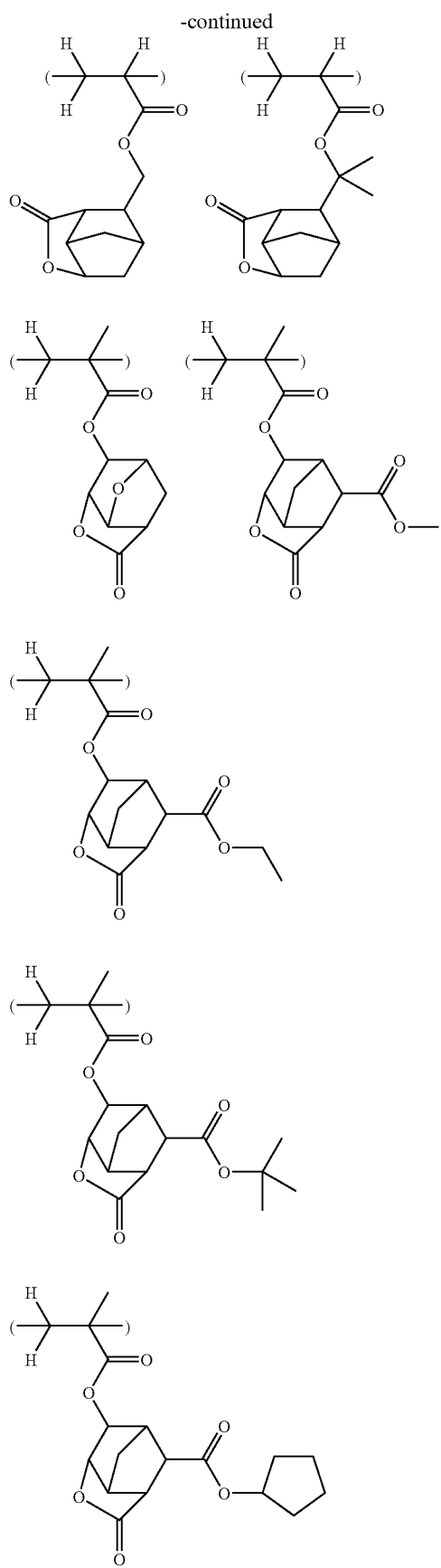
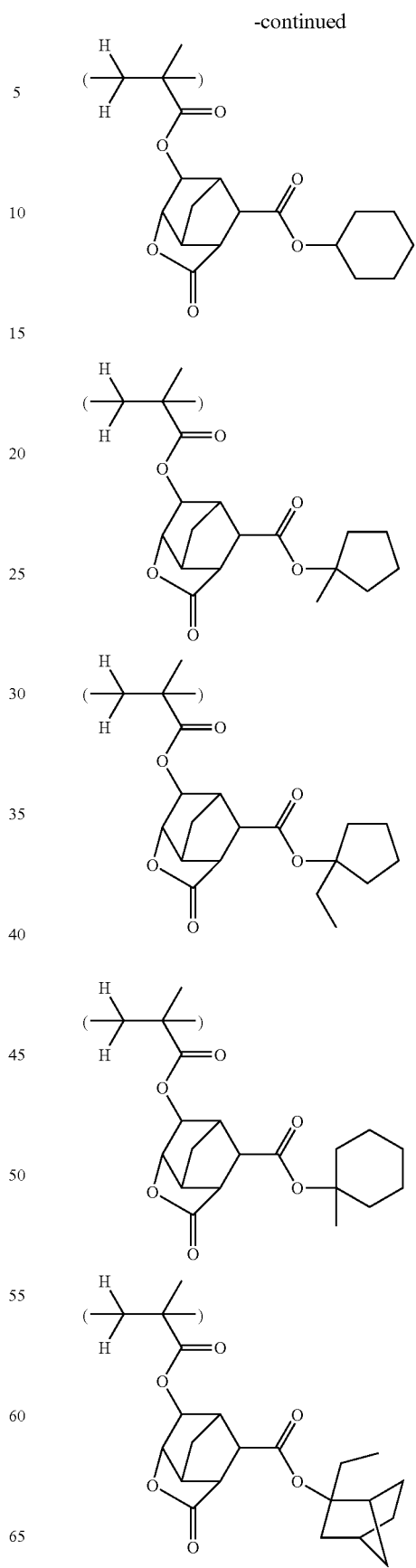

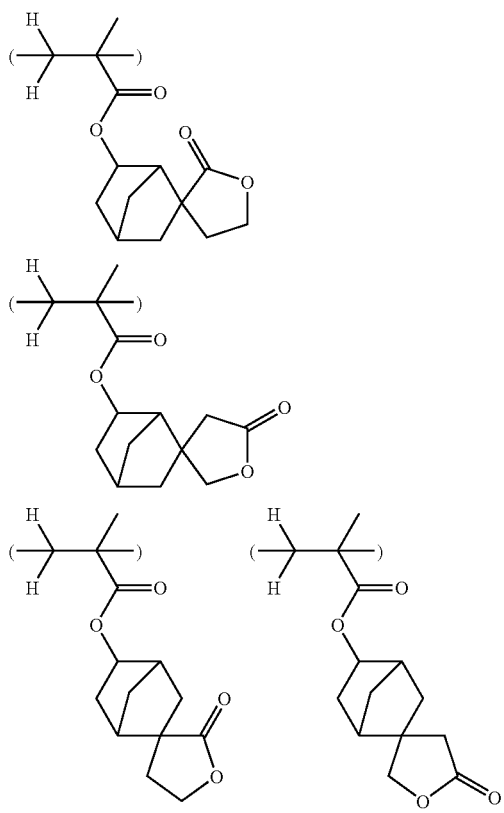
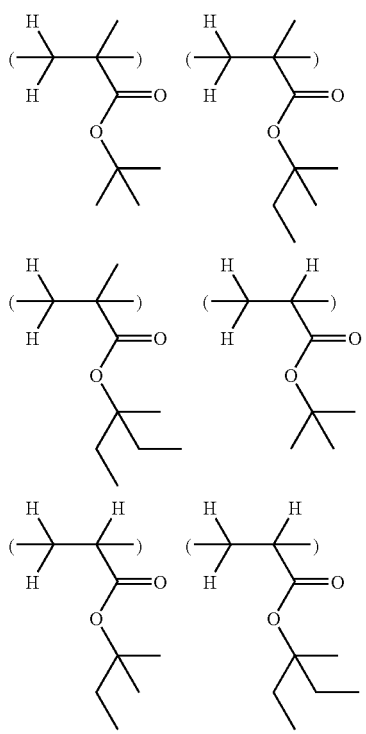
Examples of the recurring units having formula (5) are given below, but not limited thereto.
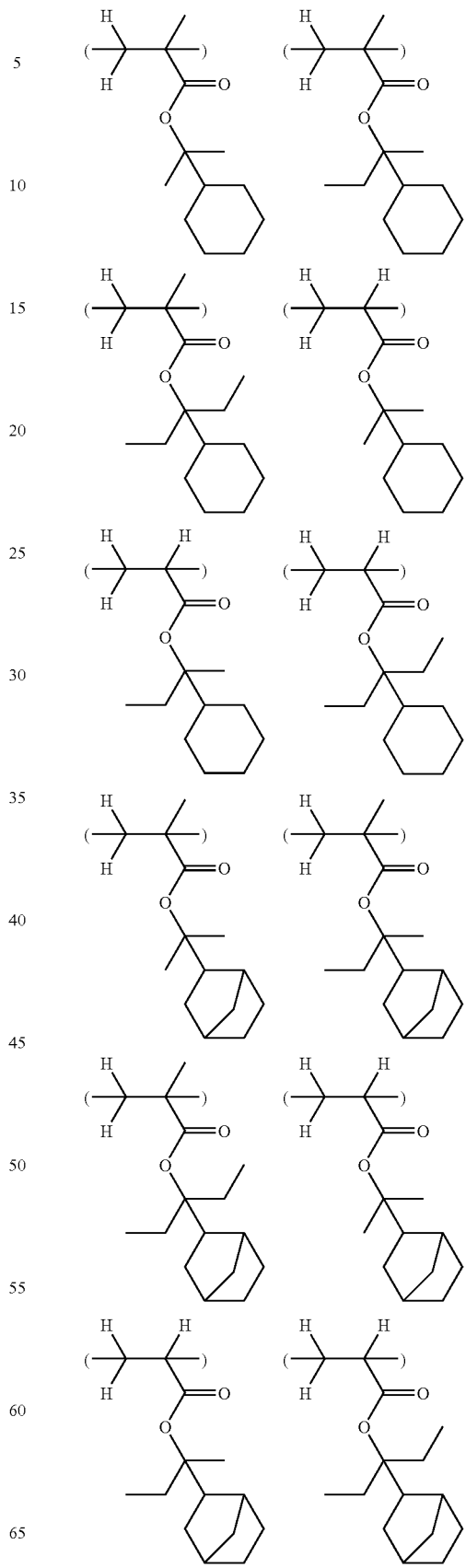

-continued
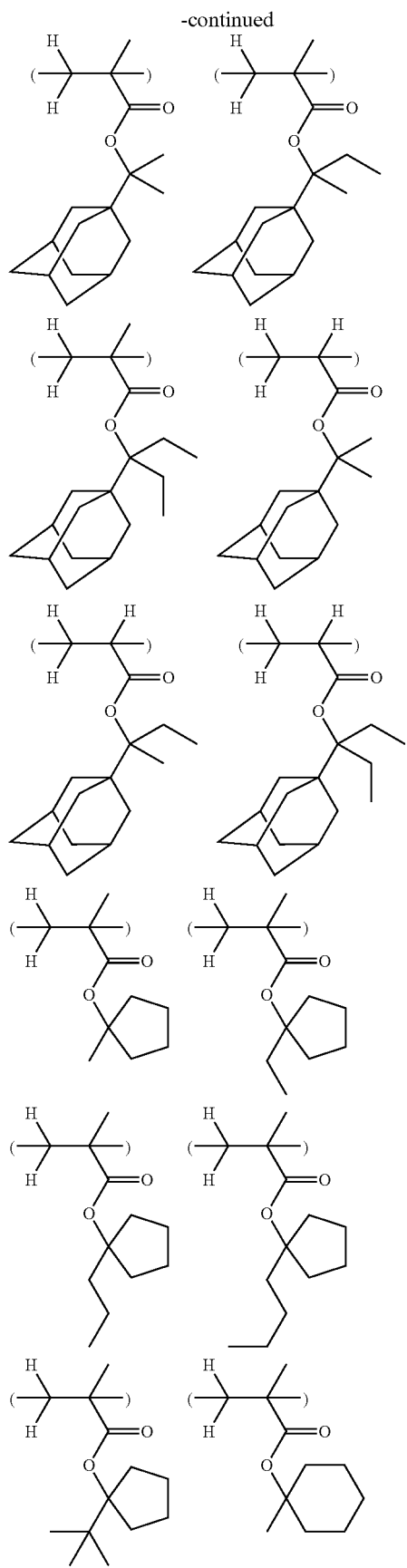
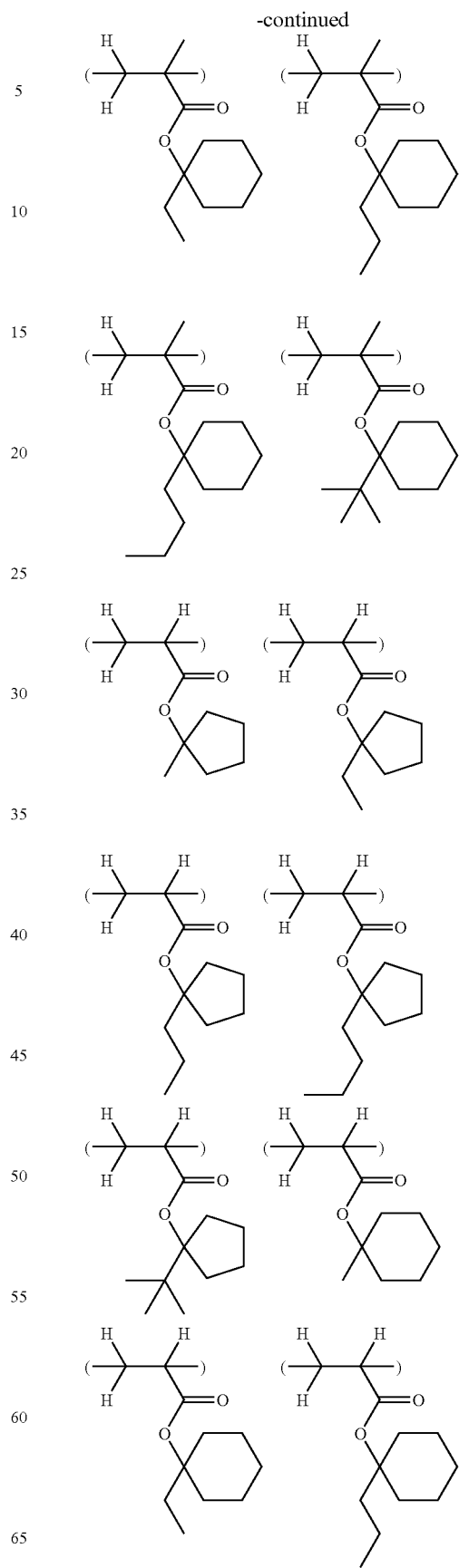

-continued
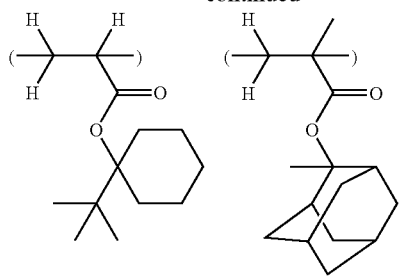
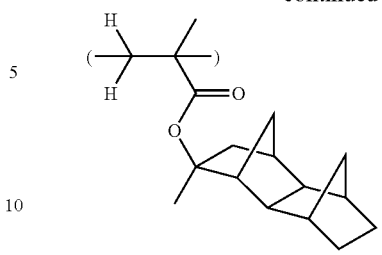
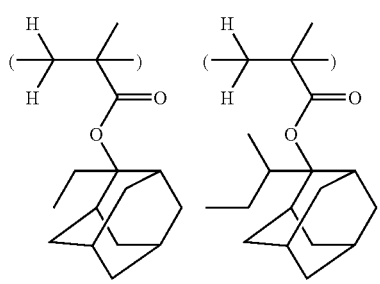
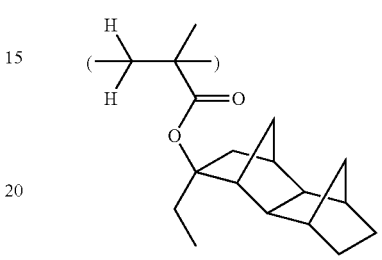
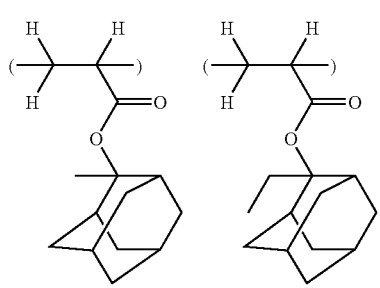
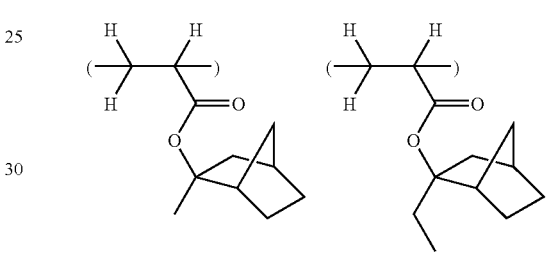
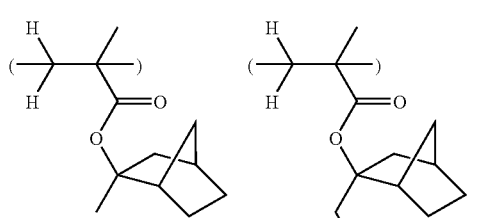
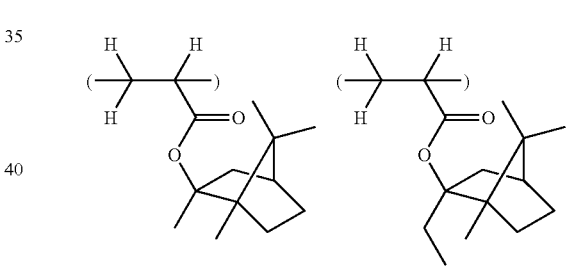
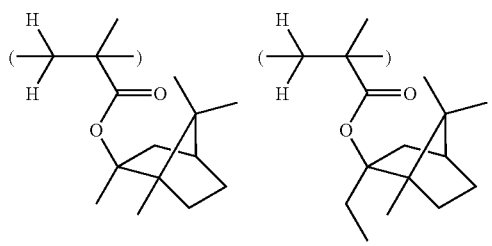
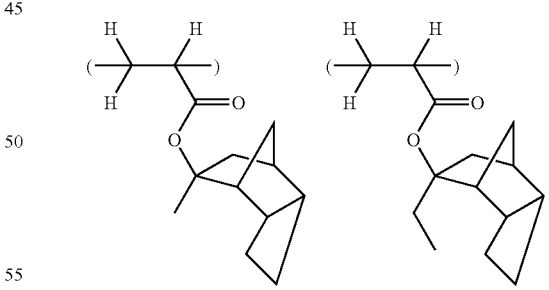
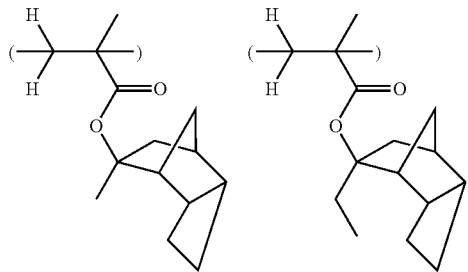
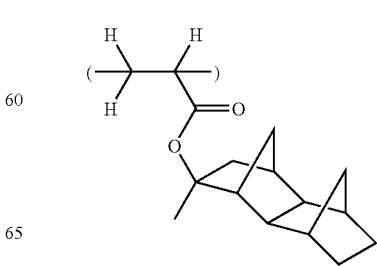

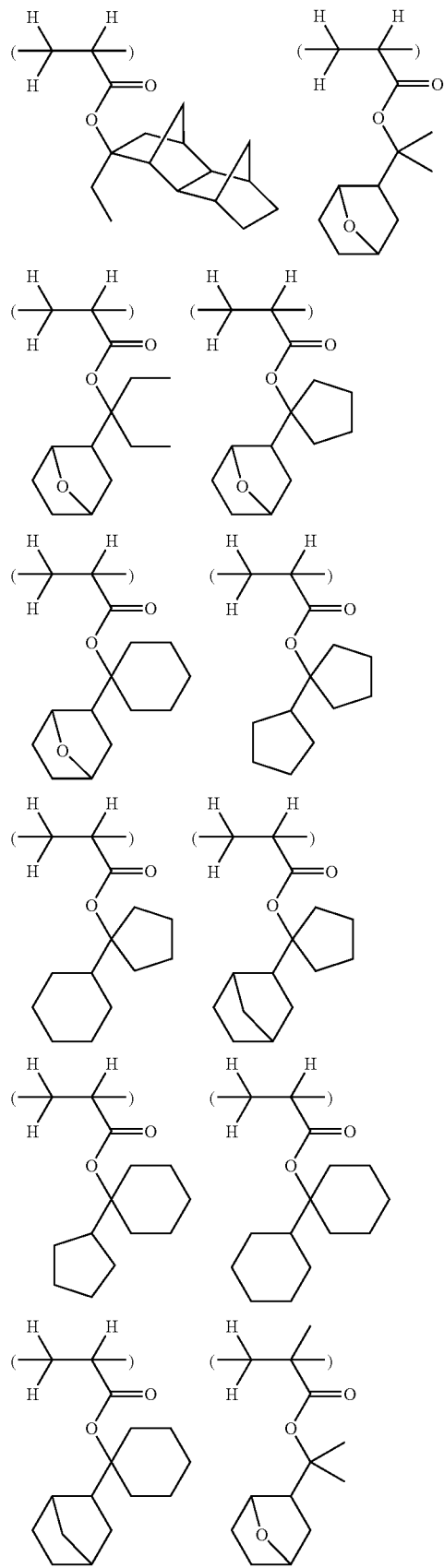
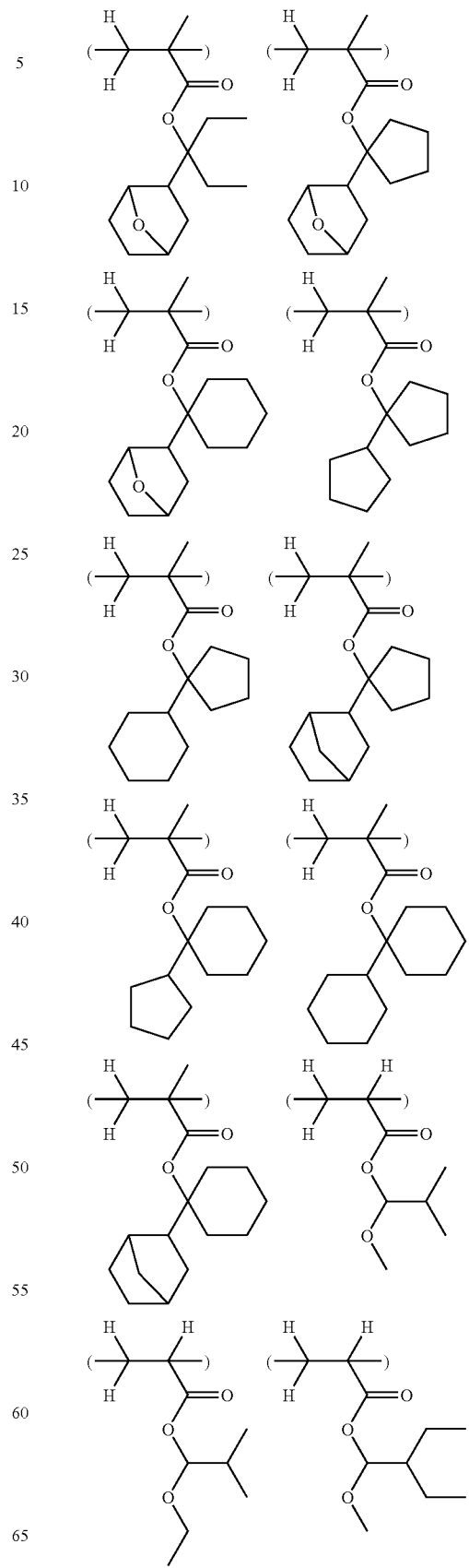

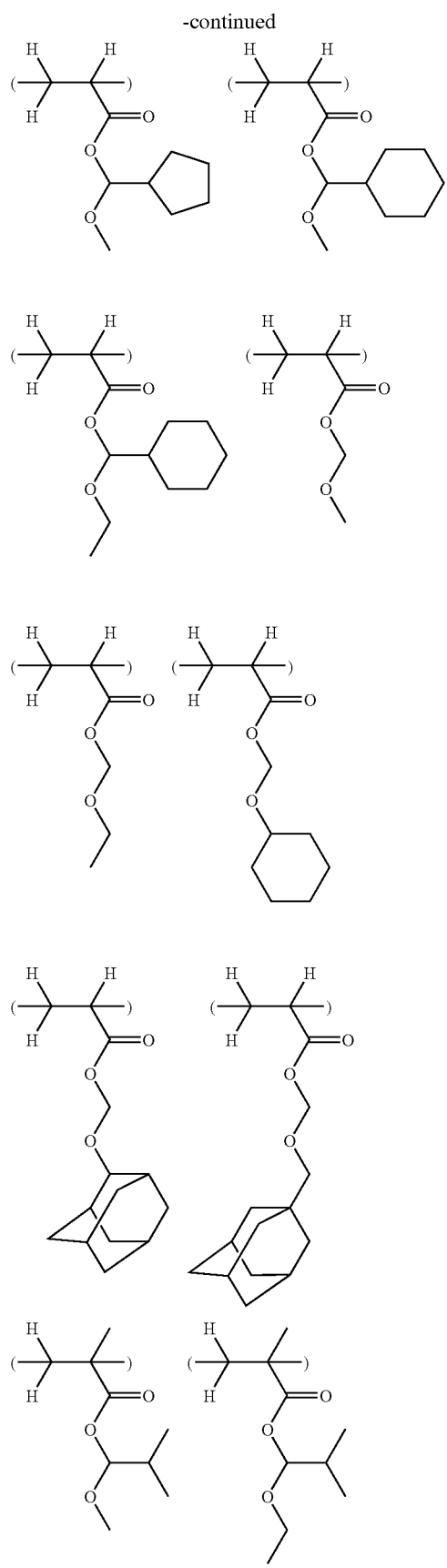
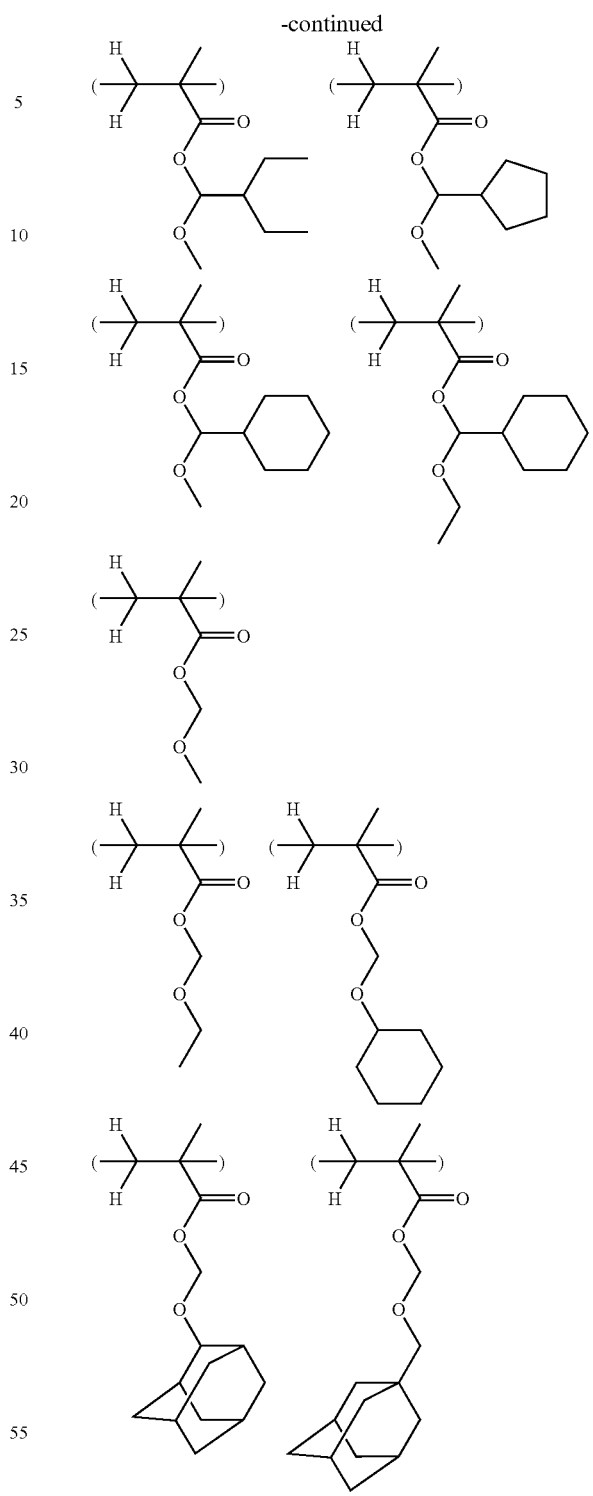
Provided that recurring units having formula (1-1), (1-2), (1-3), (2), (3), (4), and (5) are incorporated in a polymer at proportions a, b, c, d, e, f and g, respectively, and a+b+c+d+e+f+g=1, these proportions a, b, c, d, e, f and g are preferably in the following range:
$0 \leq a \leq 0.8$, more preferably $0.05 \leq a \leq 0.7$, and even more preferably $0.1 \leq a \leq 0.6$;

$0 \leq b \leq 0.8$, more preferably $0.05 \leq b \leq 0.7$, and even more preferably $0.1 \leq b \leq 0.6$;

$0 \leq c \leq 0.8$, more preferably $0.05 \leq c \leq 0.7$, and even more preferably $0.1 \leq c \leq 0.6$;

$0 < a+b+c \leq 0.8$, more preferably $0.05 \leq a+b+c \leq 0.7$, and even more preferably $0.1 \leq a+b+c \leq 0.6$;

$0 \leq d \leq 0.6$, more preferably $0 \leq d \leq 0.5$, and even more preferably $0 \leq d \leq 0.4$;

$0 \leq e \leq 0.8$, more preferably $0.05 \leq e \leq 0.7$, and even more preferably $0.1 \leq e \leq 0.6$;

$0 \leq f \leq 0.6$, more preferably $0 \leq f \leq 0.5$, and even more preferably $0 \leq f \leq 0.4$;

$0 \leq g \leq 0.6$, more preferably $0 \leq g \leq 0.5$, and even more preferably $0 \leq g \leq 0.4$.

Understandably, $a+b+c+d+e+f+g=1$ means that in a polymer comprising recurring units a, b, c, d, e, f and g, the total of these recurring units a, b, c, d, e, f and g is 100 mol % relative to the total of entire recurring units.

The resin component (A) should preferably have a weight average molecular weight (Mw) of 1,000 to 50,000, and more preferably 2,000 to 30,000, as measured by gel permeation chromatography (GPC) versus polystyrene standards.

Other Resin Component

In addition to the resin component (A) having a carboxylic acid moiety protected with an acetal protective group which is deprotected by a mechanism other than β-elimination, the resist composition of the invention may further comprise another resin component.

The resin component other than resin component (A) that can be added to the resist composition includes, but is not limited to, polymers comprising units of the following formula (R1) and/or (R2) and having a weight average molecular weight of 1,000 to 100,000, especially 3,000 to 30,000, as measured by GPC versus polystyrene standards.

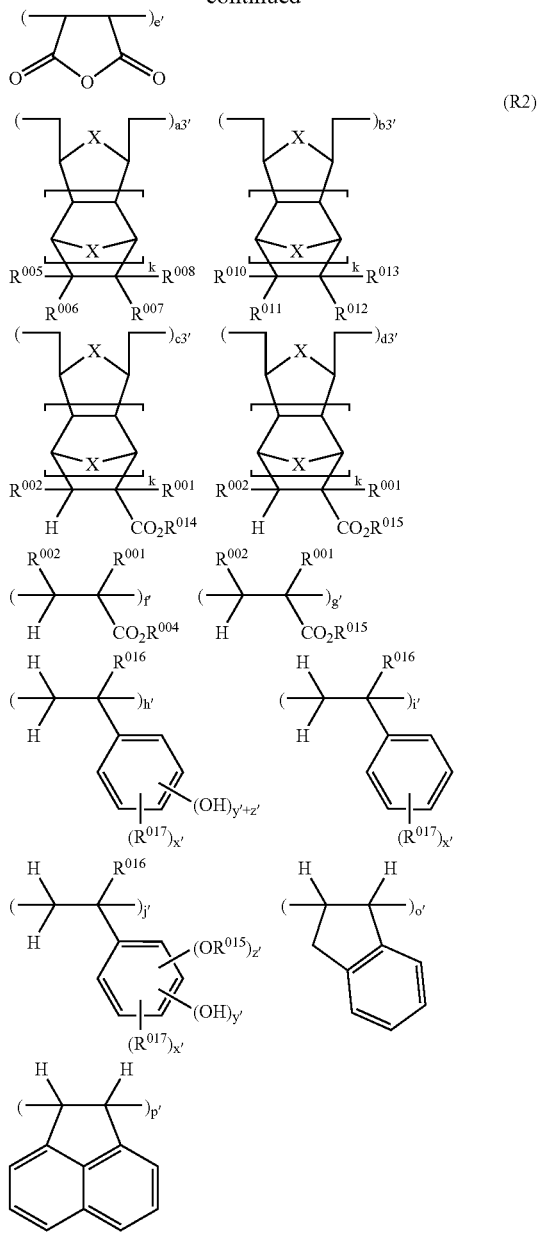

Herein, $R^{001}$ is hydrogen, methyl or $CH_2CO_2R^{003}$.

$R^{002}$ is hydrogen, methyl or $CO_2R^{003}$.

$R^{003}$ is a straight, branched or cyclic $C_1$-$C_{15}$ alkyl group, examples of which include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl.

$R^{004}$ is hydrogen or a monovalent hydrocarbon group of 1 to 15 carbon atoms having at least one group selected from among fluorinated substituent groups, carboxyl groups and hydroxyl groups. Examples include hydrogen, carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, hydroxyadamantyl, [2,2,2-trifluoro-1-hydroxy-1-

(trifluoromethyl)ethyl]-cyclohexyl, and bis[2,2,2-trifluoro-1-hydroxy-1-(trifluoromethyl)ethyl]-cyclohexyl.

At least one of $R^{005}$ to $R^{008}$ represents a carboxyl group or a monovalent hydrocarbon group of 1 to 15 carbon atoms having at least one group selected from among fluorinated substituent groups, carboxyl groups and hydroxyl groups while the remaining R's independently represent hydrogen or straight, branched or cyclic $C_1$-$C_{15}$ alkyl groups. Examples of suitable monovalent $C_1$-$C_{15}$ hydrocarbon groups having at least one group selected from among fluorinated substituent groups, carboxyl groups and hydroxyl groups include carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, hydroxyadamantyloxycarbonyl, [2,2,2-trifluoro-1-hydroxy-1-(trifluoromethyl)ethyl]-cyclohexyloxycarbonyl, and bis[2,2,2-trifluoro-1-hydroxy-1-(trifluoromethyl)ethyl]-cyclohexyloxycarbonyl. Suitable straight, branched or cyclic $C_1$-$C_{15}$ alkyl groups are as exemplified for $R^{003}$.

Two of $R^{005}$ to $R^{008}$ (for example, a pair of $R^{005}$ and $R^{006}$, $R^{006}$ and $R^{007}$, or $R^{007}$ and $R^{008}$) may bond together to form a ring with the carbon atom(s) to which they are attached, and in that event, at least one of $R^{005}$ to $R^{008}$ is a divalent hydrocarbon group of 1 to 15 carbon atoms having at least one group selected from fluorinated substituent groups, carboxyl groups and hydroxyl groups, while the remaining R's are independently single bonds, hydrogen atoms or straight, branched or cyclic $C_1$-$C_{15}$ alkyl groups. Suitable divalent $C_1$-$C_{15}$ hydrocarbon groups having at least one group selected from fluorinated substituent groups, carboxyl groups and hydroxyl groups include those exemplified above as the monovalent hydrocarbon groups having at least one group selected from fluorinated substituent groups, carboxyl groups and hydroxyl groups, with one hydrogen atom eliminated therefrom. Suitable straight, branched or cyclic $C_1$-$C_{15}$ alkyl groups are as exemplified for $R^{003}$.

$R^{009}$ is a monovalent hydrocarbon group of 3 to 15 carbon atoms containing a —$CO_2$— partial structure. Examples include 2-oxooxolan-3-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

At least one of $R^{010}$ to $R^{013}$ is a monovalent hydrocarbon group of 2 to 15 carbon atoms containing a —$CO_2$— partial structure, while the remaining R's are independently hydrogen atoms or straight, branched or cyclic $C_1$-$C_{15}$ alkyl groups. Illustrative examples of suitable monovalent $C_2$-$C_{15}$ hydrocarbon groups containing a —$CO_2$— partial structure include 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl-2-oxooxolan-5-yloxycarbonyl. Suitable straight, branched or cyclic $C_1$-$C_{15}$ alkyl groups are as exemplified for $R^{003}$.

Two of $R^{010}$ to $R^{013}$ (for example, a pair of $R^{010}$ and $R^{011}$, $R^{011}$ and $R^{012}$, or $R^{012}$ and $R^{013}$) may bond together to form a ring with the carbon atom(s) to which they are attached, and in that event, at least one of $R^{010}$ to $R^{013}$ is a divalent hydrocarbon group of 1 to 15 carbon atoms containing a —$CO_2$— partial structure, while the remaining R's are independently single bonds, hydrogen atoms or straight, branched or cyclic $C_1$-$C_{15}$ alkyl groups. Illustrative examples of suitable divalent $C_1$-$C_{15}$ hydrocarbon groups containing a —$CO_2$— partial structure include 1-oxo-2-oxapropane-1,3-diyl, 1,3-dioxo-2-oxapropane-1,3-diyl, 1-oxo-2-oxabutane-1,4-diyl, and 1,3-dioxo-2-oxabutane-1,4-diyl, as well as those exemplified as the monovalent hydrocarbon groups containing a —$CO_2$— partial structure, with one hydrogen atom eliminated therefrom. Suitable straight, branched or cyclic $C_1$-$C_{15}$ alkyl groups are as exemplified for $R^{003}$.

$R^{014}$ is a polycyclic hydrocarbon group having 7 to 15 carbon atoms or an alkyl group containing such a polycyclic hydrocarbon group. Examples include norbornyl, bicyclo[3.3.1]nonyl, tricyclo[5.2.1.0$^{2,6}$]decyl, adamantyl, ethyladamantyl, butyladamantyl, norbornylmethyl, and adamantylmethyl.

$R^{015}$ is an acid labile group, which will be described later in detail.

$R^{016}$ is hydrogen or methyl.

$R^{017}$ is a straight, branched or cyclic $C_1$-$C_8$ alkyl group, examples of which include methyl, ethyl, propyl, isopropyl, n-butyl, sec-butyl, tert-butyl, tert-amyl, n-pentyl, n-hexyl, cyclopentyl and cyclohexyl.

X is $CH_2$ or an oxygen atom. Letter k is 0 or 1.

The acid labile group represented by $R^{015}$ may be selected from a variety of such groups. It may be any of well-known acid labile groups. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

(L1)

(L2)

(L3)

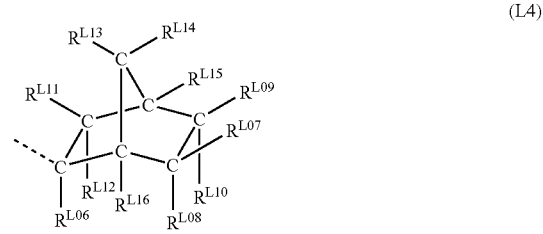

(L4)

Herein, the broken line denotes a valence bond. $R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a hetero atom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like. Illustrative examples of the straight, branched or cyclic alkyl groups are as exemplified above for $R^{L01}$ and $R^{L02}$, and examples of the substituted alkyl groups are as shown below.

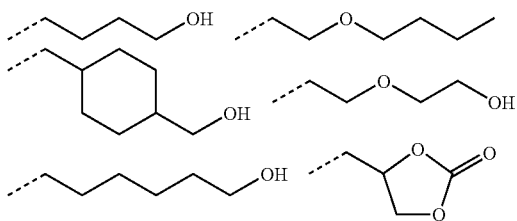

A pair of $R^{L01}$ and $R^{L02}$, $R^{L01}$ and $R^{L03}$, or $R^{L02}$ and $R^{L03}$ may together form a ring with carbon and oxygen atoms to which they are attached. The cyclization group of $R^{L01}$, $R^{L02}$ and $R^{L03}$ is a straight or branched alkylene group of 1 to 18 carbon atoms, preferably 1 to 10 carbon atoms when they form a ring.

$R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 2-(tricyclo[5.2.1.0$^{2,6}$]decan-8-yl)propan-2-yl, 2-(tetracyclo[4.4.0.1$^{2,5}$.1$^{7,10}$]dodecan-3-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl, 8-methyl-8-tricyclo[5.2.1.0$^{2,6}$]decyl, 8-ethyl-8-tricyclo[5.2.1.0$^{2,6}$]decyl, 3-methyl-3-tetracyclo[4.4.0.1$^{2,5}$.1$^{7,10}$]dodecyl, 3-ethyl-3-tetracyclo[4.4.0.1$^{2,5}$.1$^{7,10}$]dodecyl, and the like. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter y is an integer of 0 to 6.

In formula (L3), $R^{L05}$ is an optionally substituted, straight, branched or cyclic $C_1$-$C_{10}$ alkyl group or an optionally substituted $C_6$-$C_{20}$ aryl group. Examples of the optionally substituted alkyl groups include straight, branched or cyclic alkyl groups such as methyl, ethyl, propyl, isopropyl, n-butyl, sec-butyl, tert-butyl, tert-amyl, n-pentyl, n-hexyl, cyclopentyl, cyclohexyl, and bicyclo[2.2.1]heptyl, and substituted forms of such groups in which some hydrogen atoms are replaced by hydroxyl, alkoxy, carboxy, alkoxycarbonyl, oxo, amino, alkylamino, cyano, mercapto, alkylthio, sulfo or other groups or in which some methylene groups are replaced by oxygen or sulfur atoms. Examples of optionally substituted aryl groups include phenyl, methylphenyl, naphthyl, anthryl, phenanthryl, and pyrenyl. Letter m is equal to 0 or 1, n is equal to 0, 1, 2 or 3, and 2 m+n is equal to 2 or 3.

In formula (L4), $R^{L06}$ is an optionally substituted, straight, branched or cyclic $C_1$-$C_{10}$ alkyl group or an optionally substituted $C_6$-$C_{20}$ aryl group. Examples of these groups are the same as exemplified for $R^{L05}$. $R^{L07}$ to $R^{L16}$ independently represent hydrogen or monovalent hydrocarbon groups of 1 to 15 carbon atoms. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxy, alkoxycarbonyl, oxo, amino, alkylamino, cyano, mercapto, alkylthio, sulfo or other groups. Alternatively, $R^{L07}$ to $R^{L16}$ may bond together to form a ring (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are those exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or a similar pair).

Of the acid labile groups of formula (L1), the straight and branched ones are exemplified by the following groups.

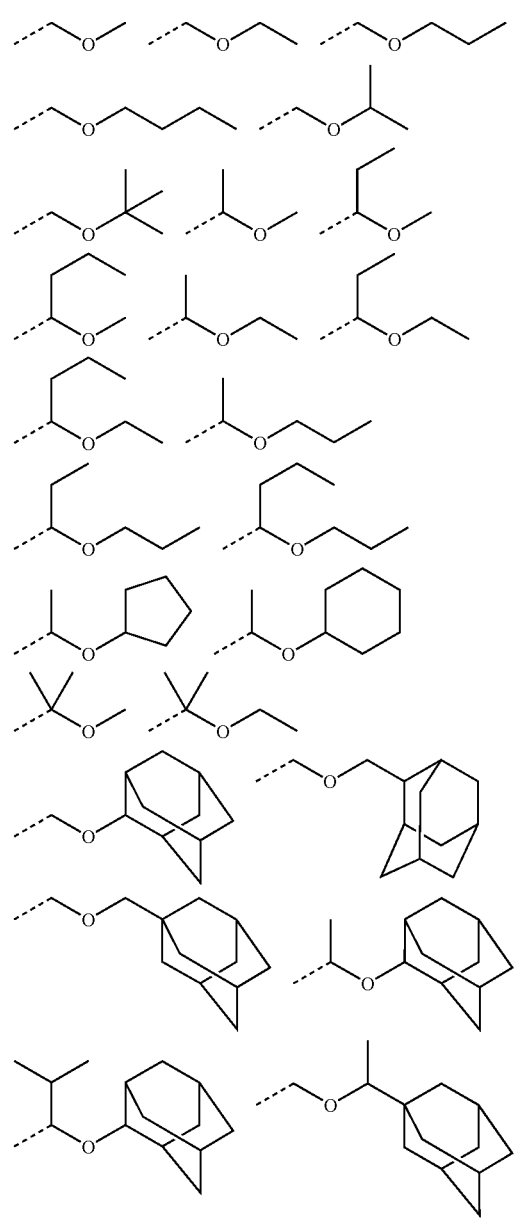

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxybutyl)cyclopentyl, 1-(bicyclo[2.2.1]heptan-2-yl)cyclopentyl, 1-(7-oxabicyclo[2.2.1]heptan-2-yl)cyclopentyl, 1-methylcyclohexyl, 1-ethylcyclohexyl, 1-methyl-2-cyclopentenyl, 1-ethyl-2-cyclopentenyl, 1-methyl-2-cyclohexenyl, and 1-ethyl-2-cyclohexenyl groups.

Of the acid labile groups of formula (L4), those groups of the following formulae (L4-1) to (L4-4) are preferred.

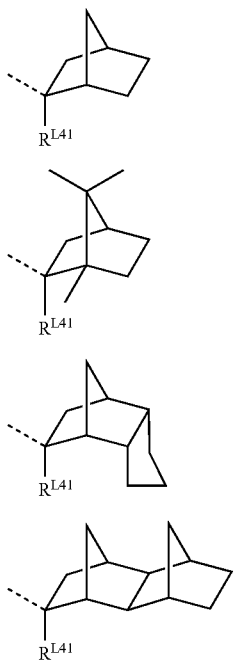

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two or more selected from groups having the following general formulas (L4-3-1) and (L4-3-2).

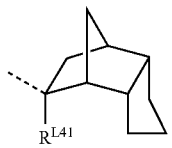

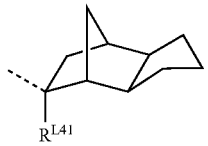

Similarly, the general formula (L4-4) represents one or a mixture of two or more selected from groups having the following general formulas (L4-4-1) to (L4-4-4).

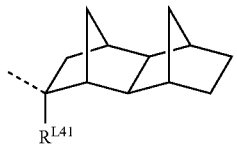

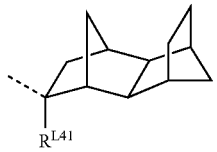

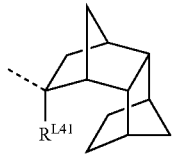

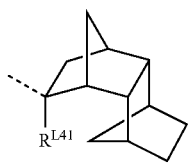

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1] heptane ring, which ensures high reactivity for acid catalyzed elimination reaction (see JP-A 2000-336121). In preparing these monomers having a tertiary exo-alkyl group of bicyclo [2.2.1]heptane skeleton as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

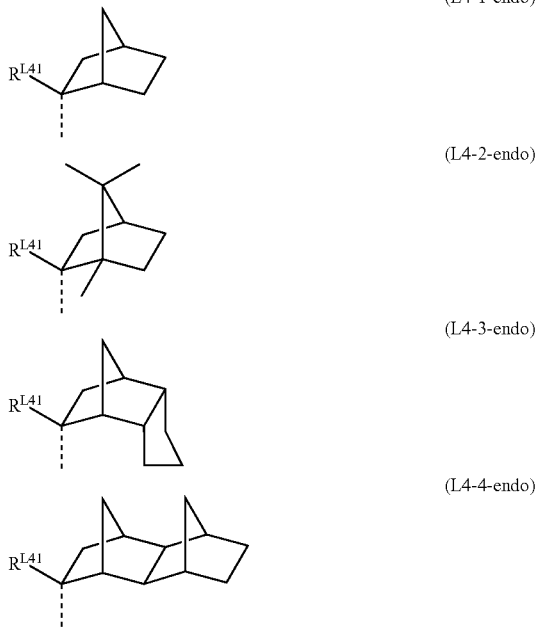

(L4-1-endo)
(L4-2-endo)
(L4-3-endo)
(L4-4-endo)

Illustrative examples of the acid labile group of formula (L4) are given below

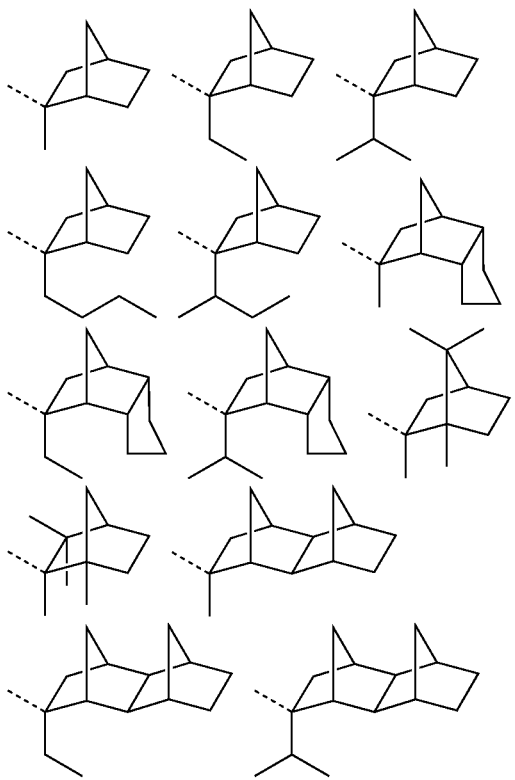

Examples of the tertiary $C_4$-$C_{20}$ alkyl groups, trialkylsilyl groups in which each alkyl moiety has 1 to 6 carbon atoms, and $C_4$-$C_{20}$ oxoalkyl groups are as exemplified for $R^{L04}$ and the like.

In formula (R2), $R^{016}$ is hydrogen or methyl. $R^{017}$ is a straight, branched or cyclic $C_1$-$C_8$ alkyl group.

In formulae (R1) and (R2), letters a1', a2', a3', b1', b2', b3', c1', c2', c3', d1', d2', d3', and e' are numbers from 0 to less than 1, satisfying a1'+a2'+a3'+b1'+b2'+b3'+c1'+c2'+c3'+d1'+d2'+d3'+e'=1; f', g', h', i', j', o', and p' are numbers from 0 to less than 1, satisfying f'+g'+h'+i'+j'+o'+p'=1; x', y' and z' are each an integer of 0 to 3, satisfying $1 \leq x'+y'+z' \leq 5$ and $1 \leq y'+z' \leq 3$.

With respect to the recurring units of formula (R1) and (R2), units of more than one type may be incorporated at the same time. Incorporation of units of more than one type enables to adjust the performance of a resist material in which the resulting polymer is formulated.

Understandably, the sum of respective units=1 means that in a polymer comprising recurring units, the total of the indicated recurring units is 100 mol % relative to the total of entire recurring units.

Examples of the recurring units incorporated at compositional ratio a1' in formula (R1) and the recurring units incorporated at compositional ratio f' in formula (R2) are given below, but not limited thereto.

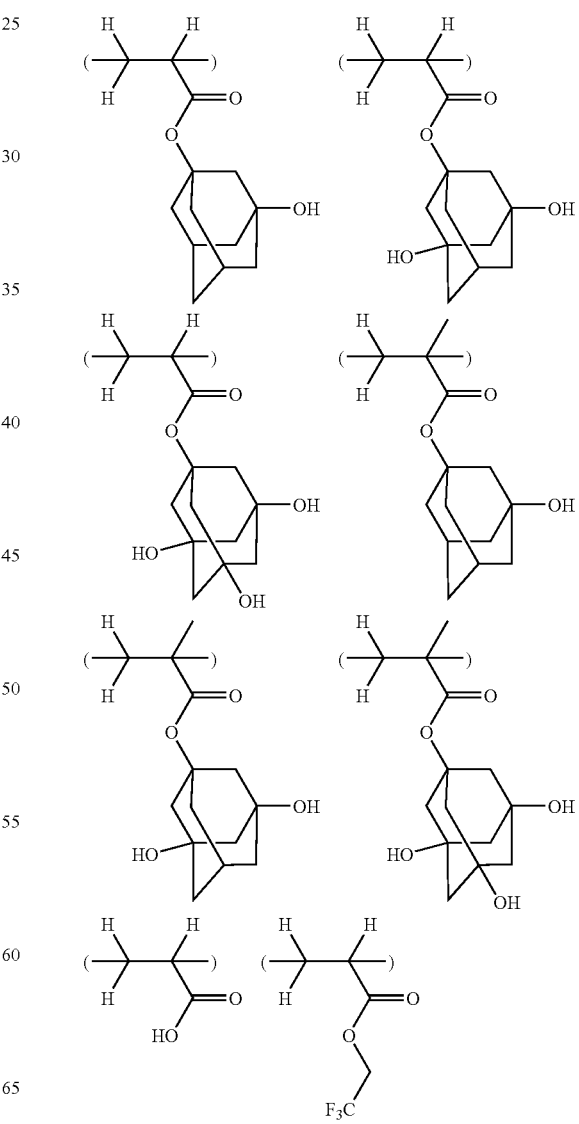

-continued
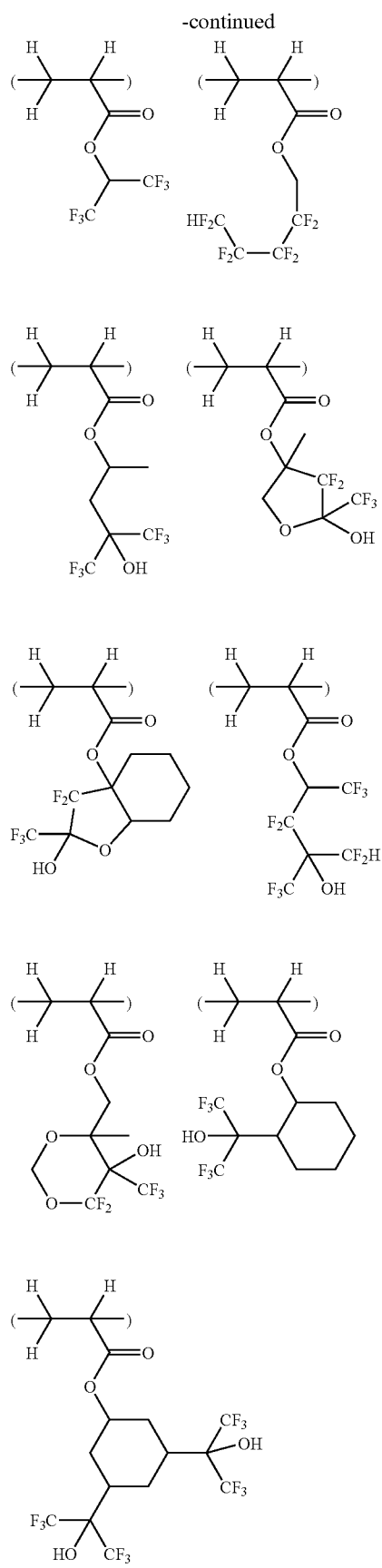
-continued
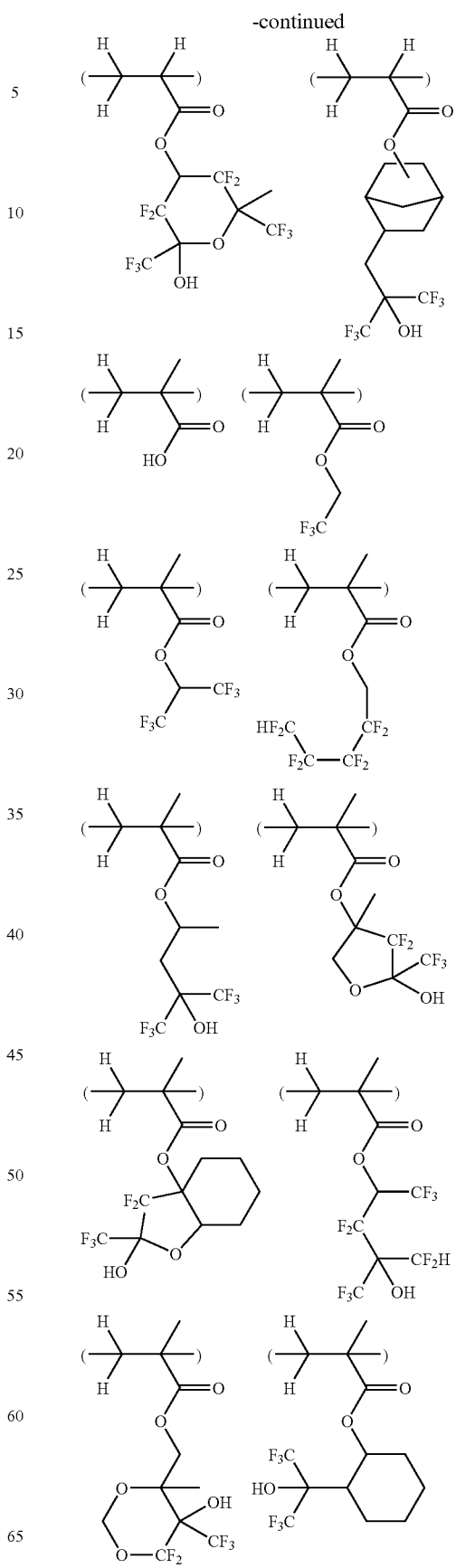

-continued
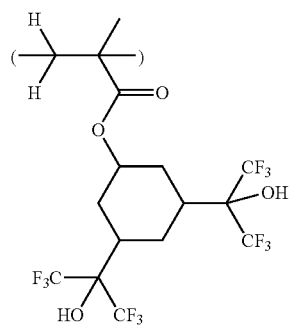
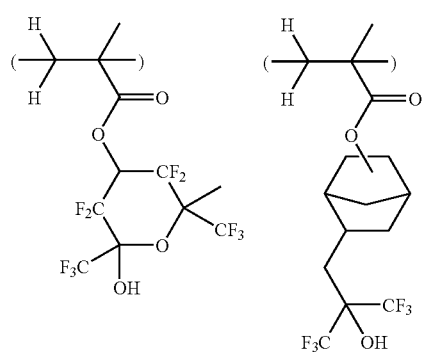
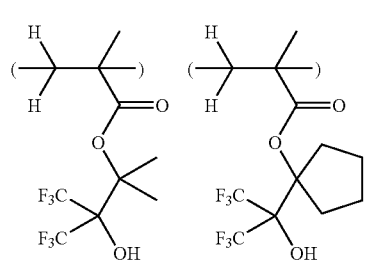
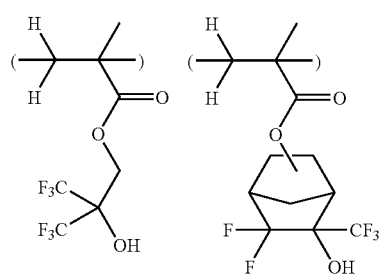
Examples of the recurring units incorporated at compositional ratio b1' in formula (R1) are given below, but not limited thereto.
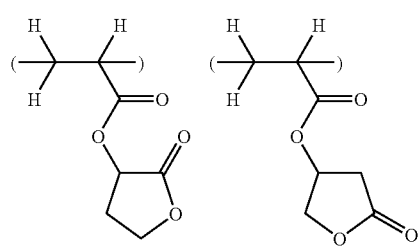
-continued
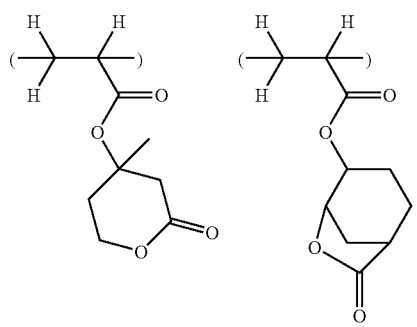
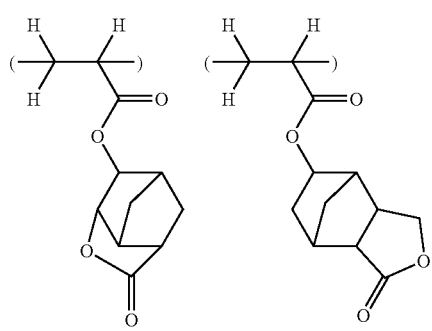
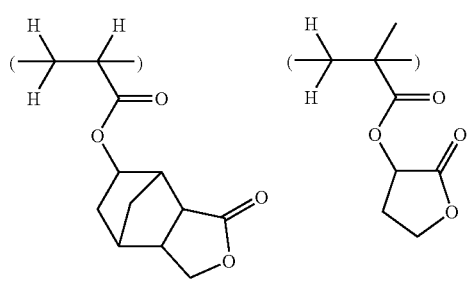
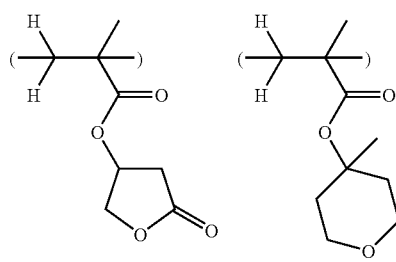
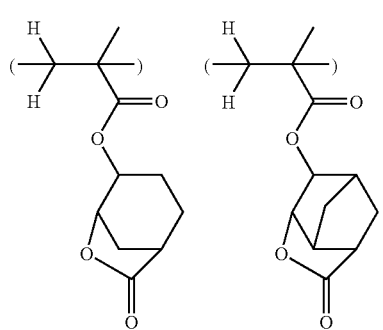

-continued
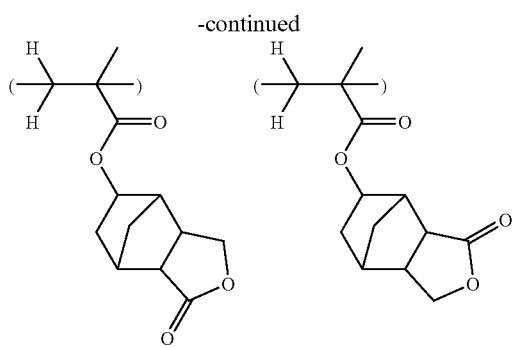
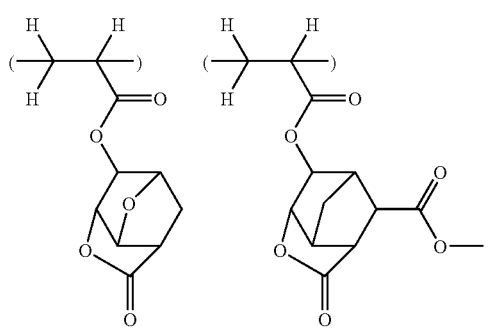
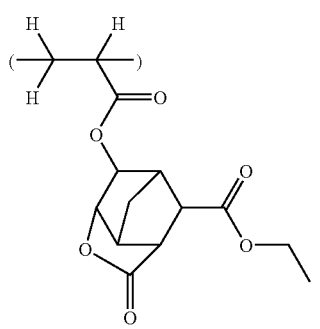
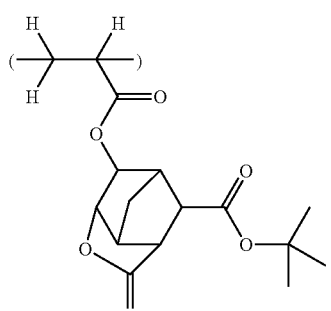
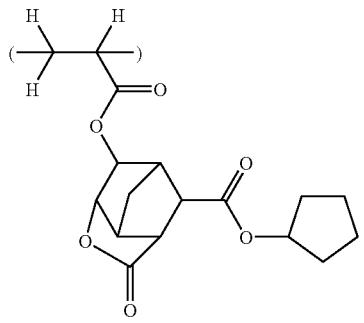
-continued
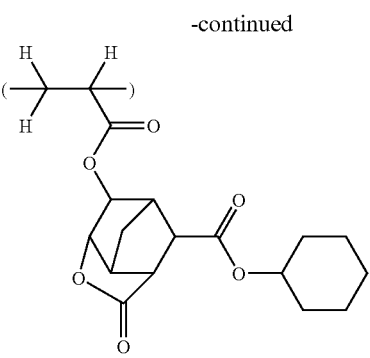
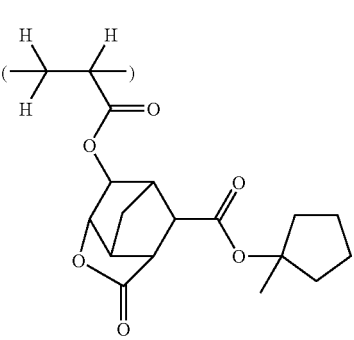
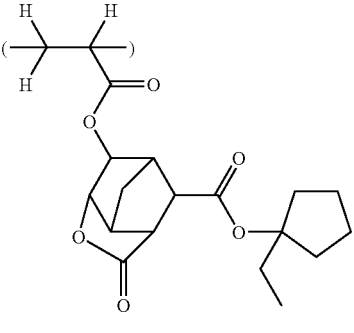
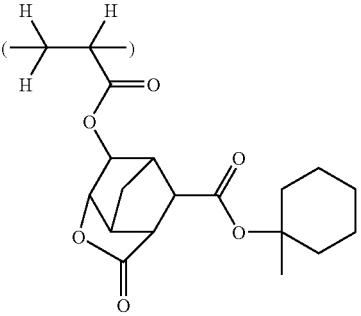
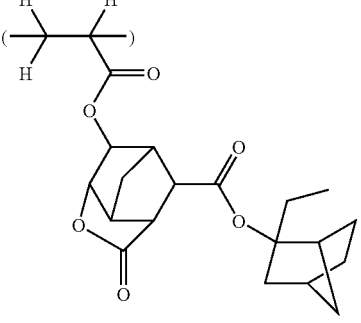

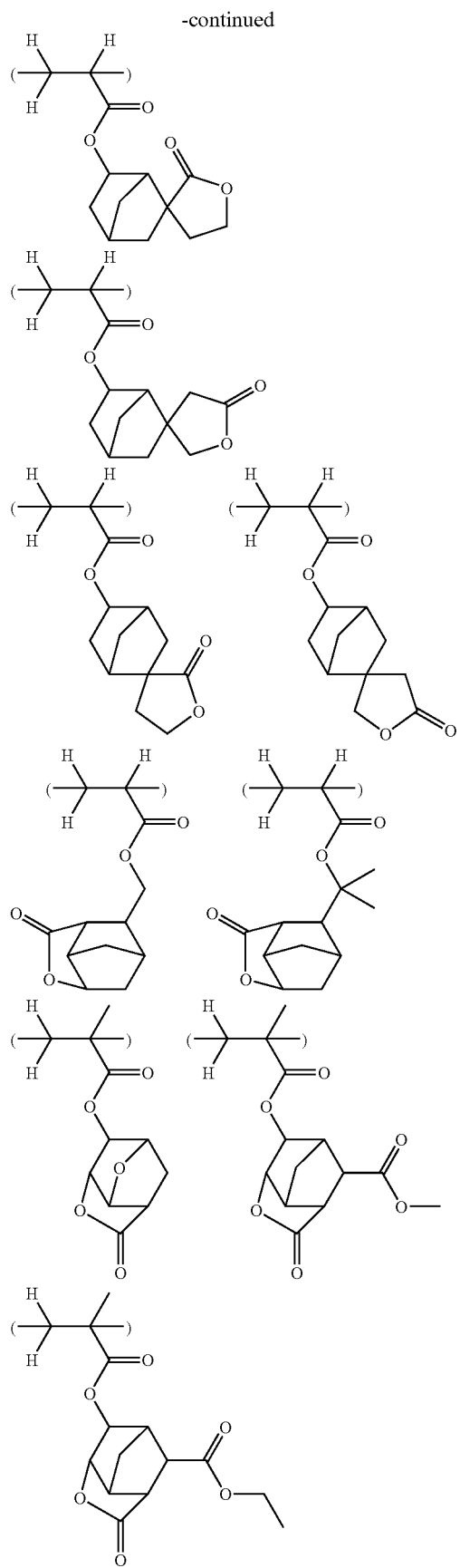
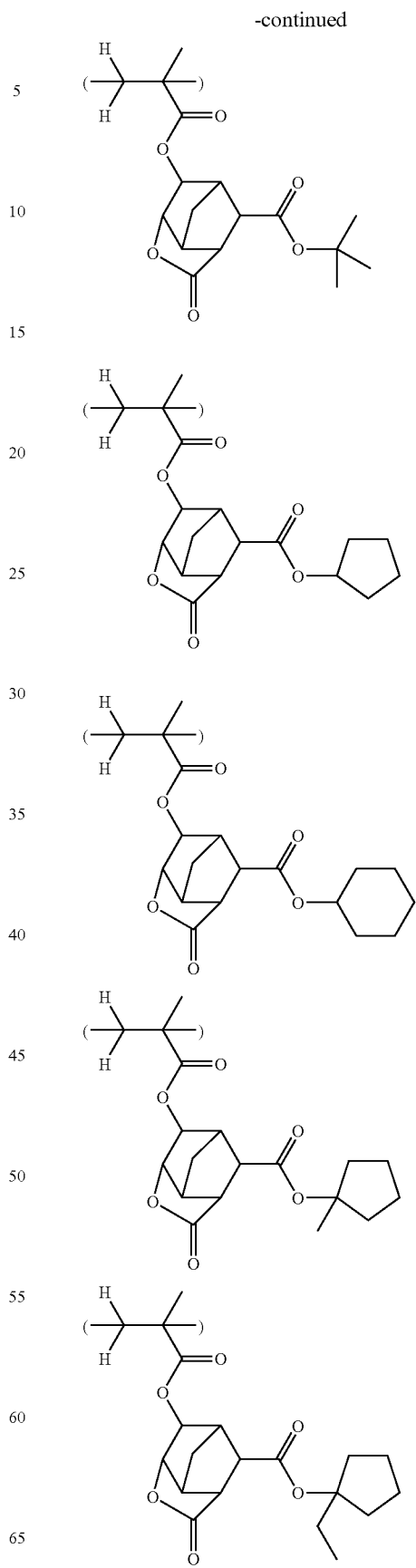

-continued
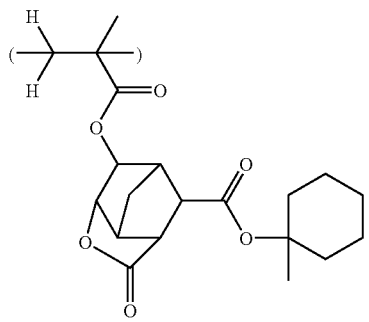
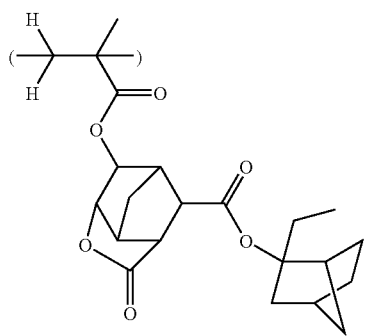
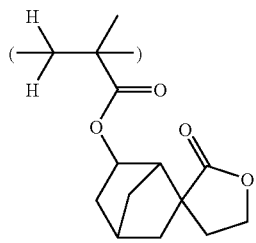
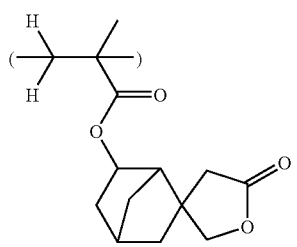
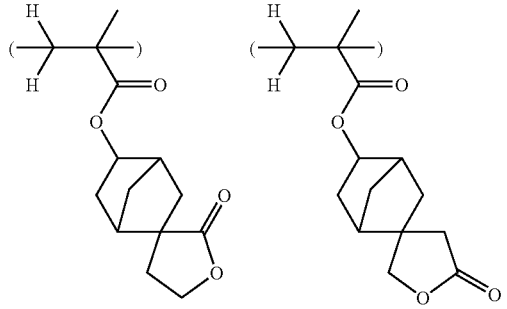
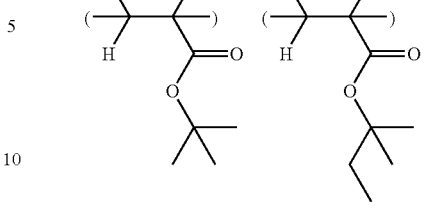
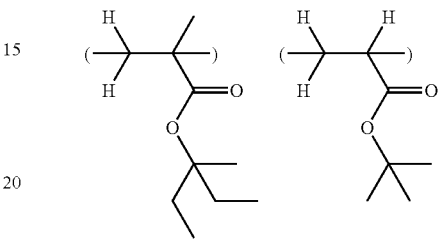
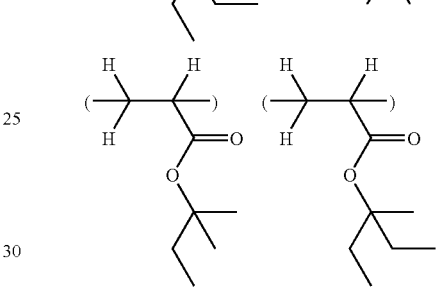
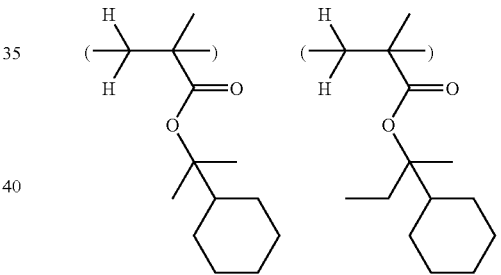
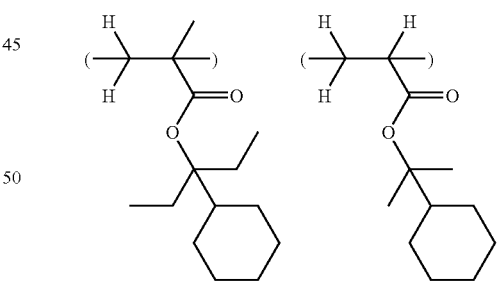
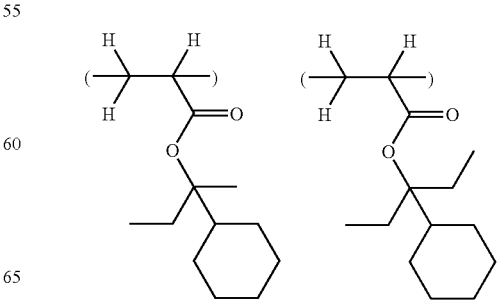
Examples of the recurring units incorporated at compositional ratio d1' in formula (R1) and the recurring units incorporated at compositional ratio g' in formula (R2) are given below, but not limited thereto.

-continued
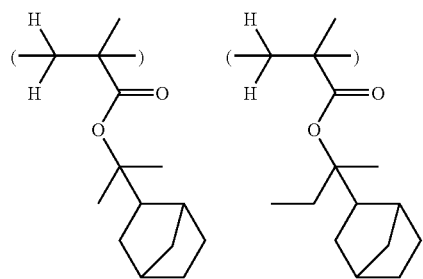
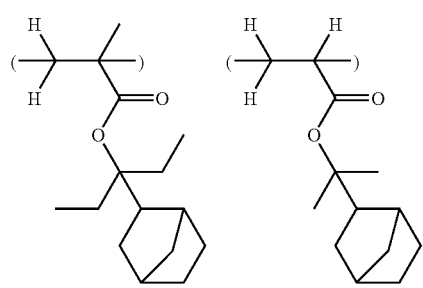
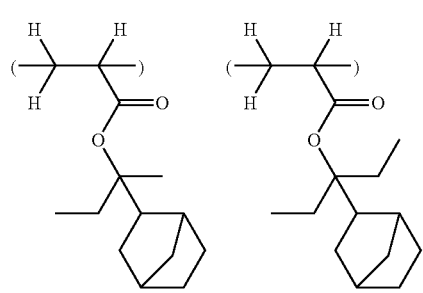
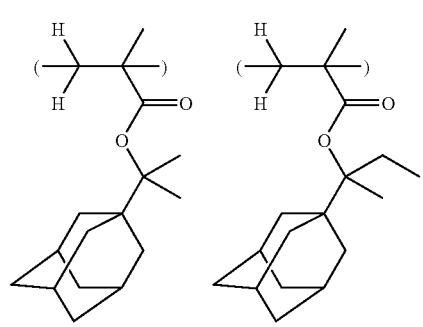
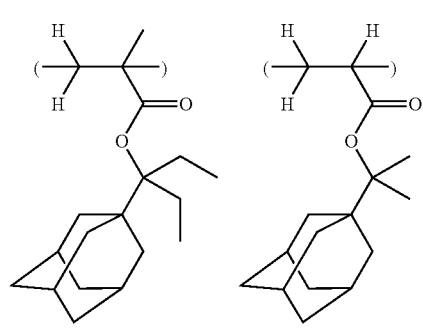
-continued
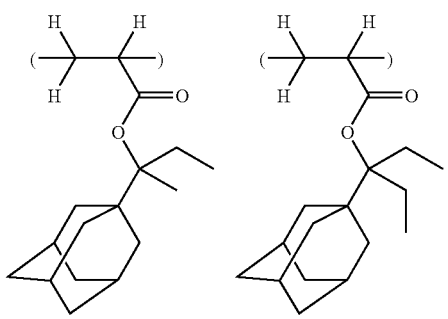
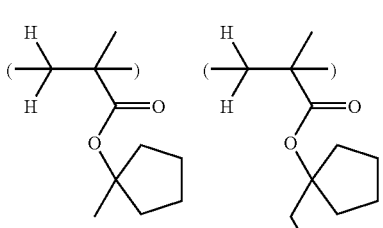
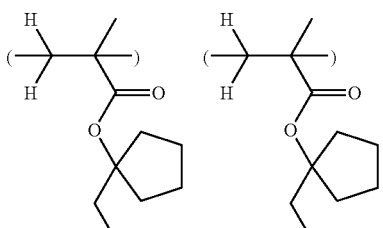
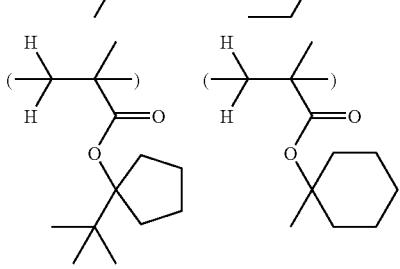
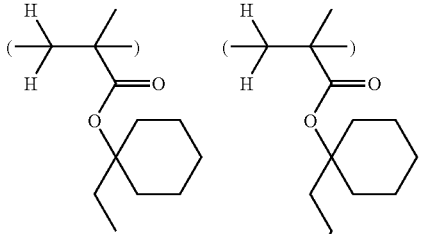

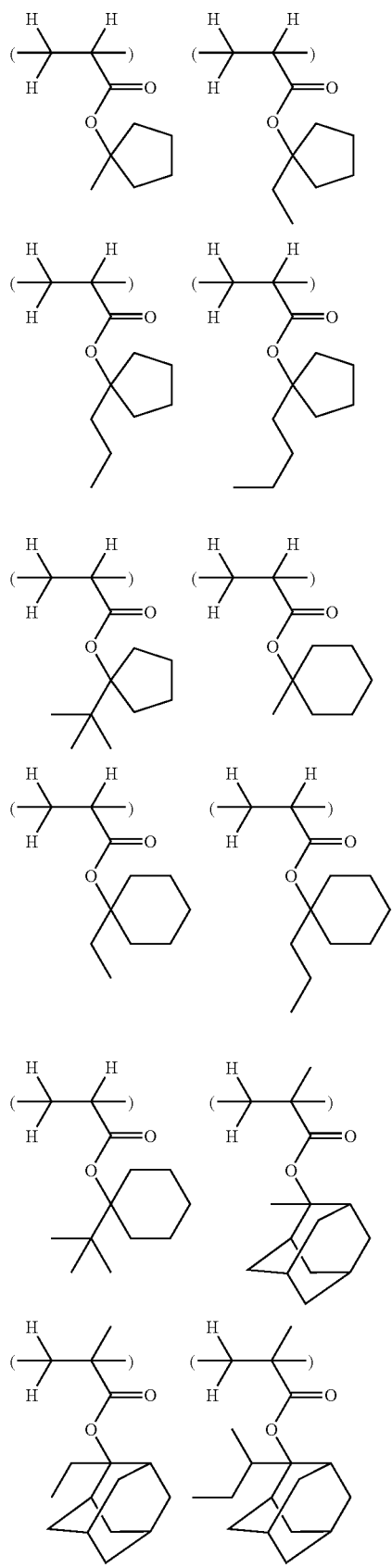
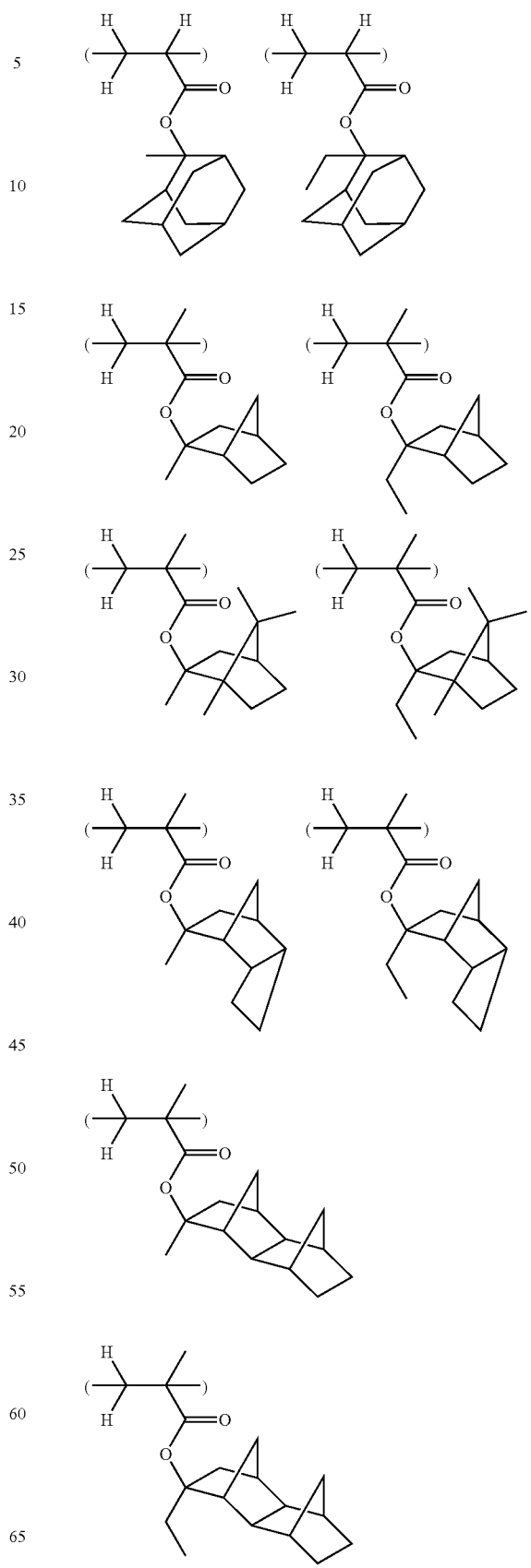

-continued
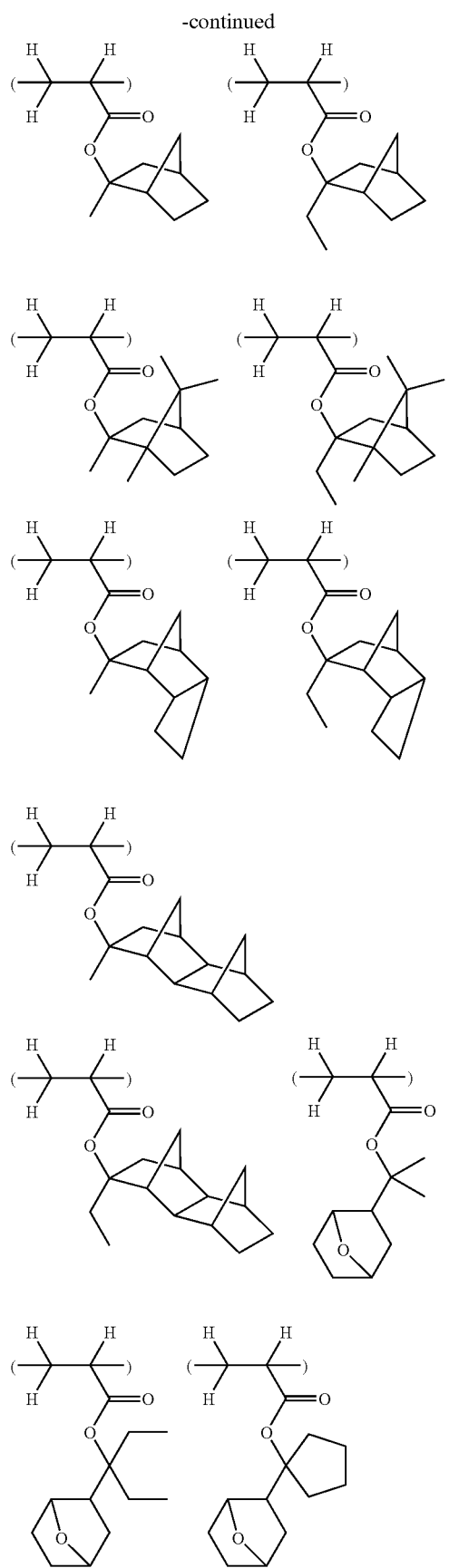
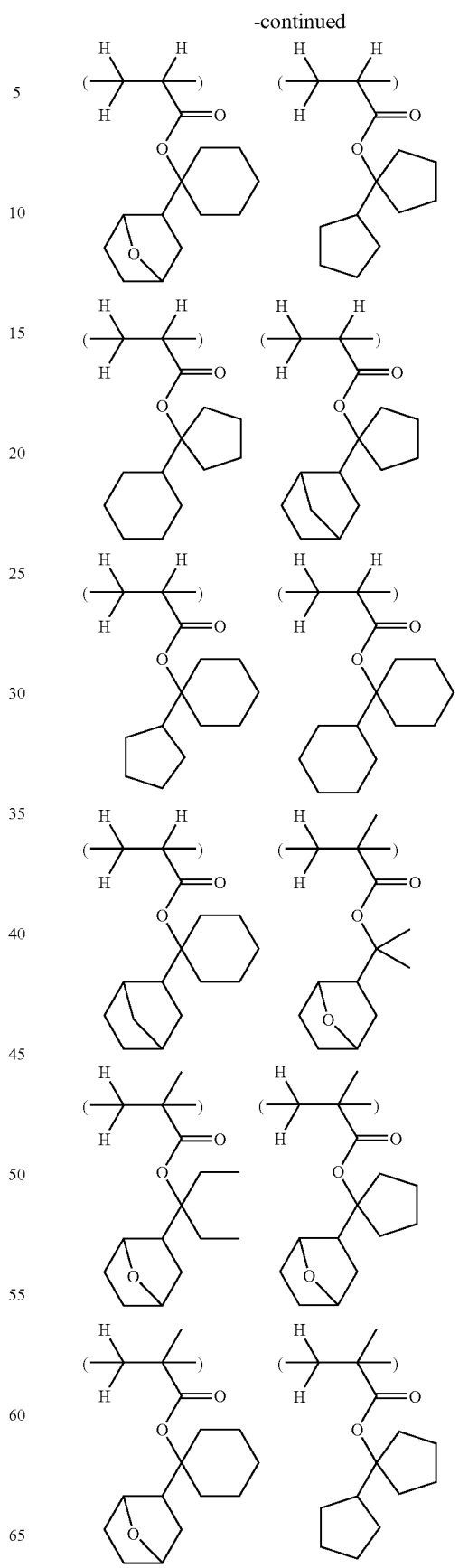

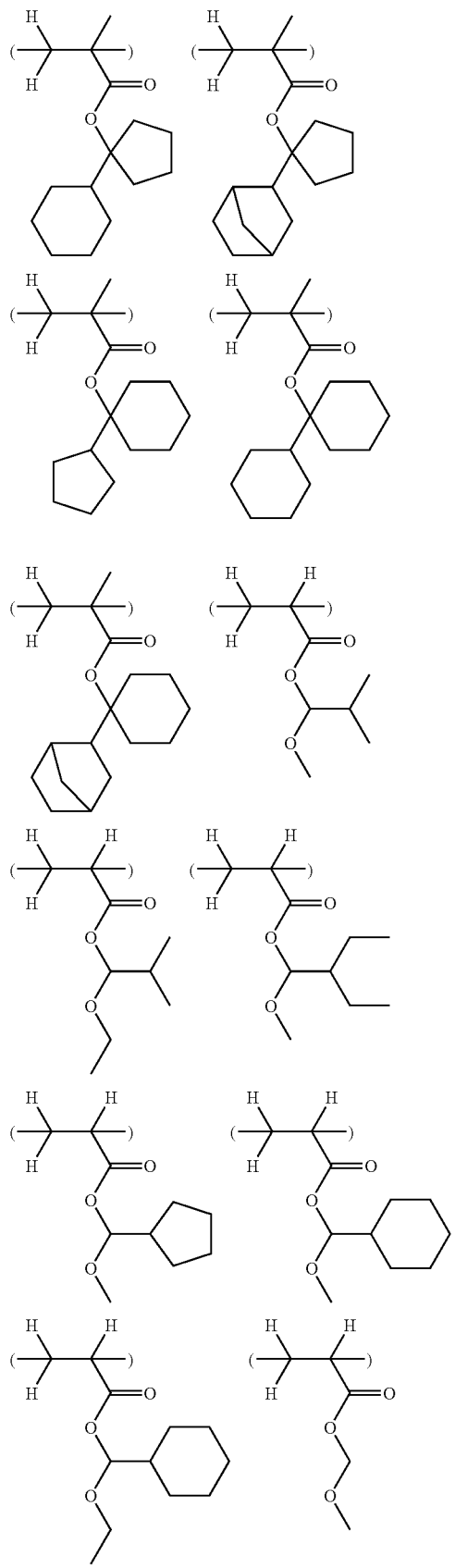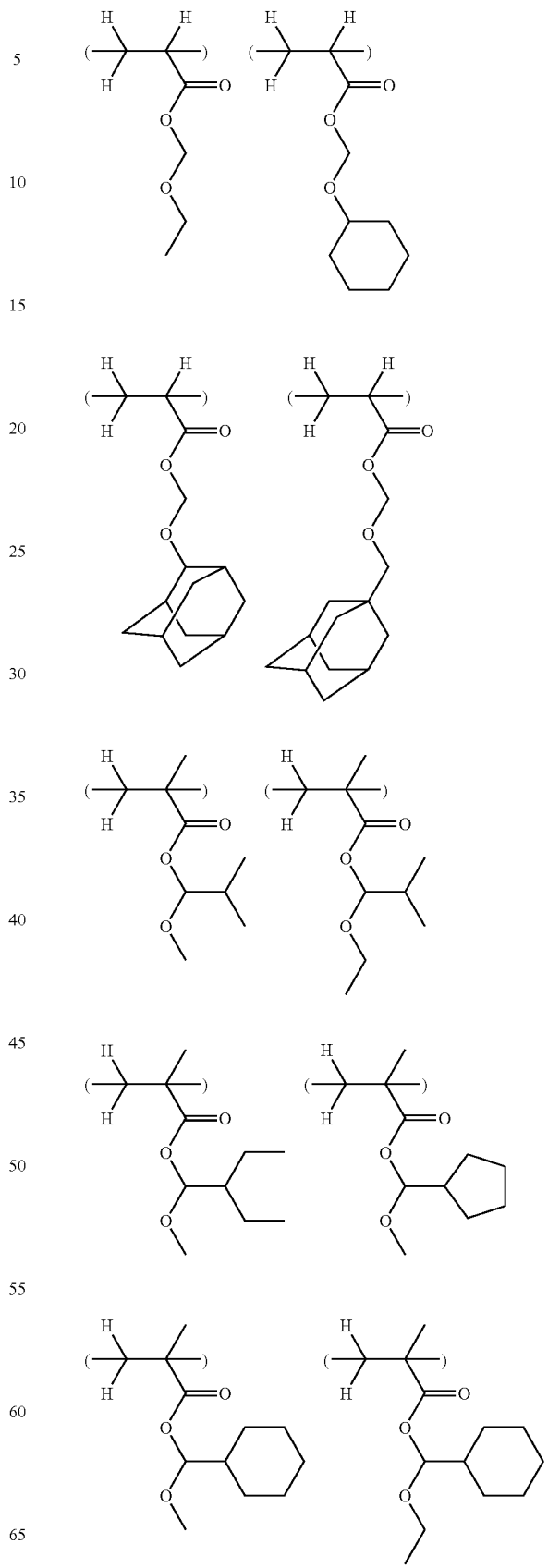

-continued
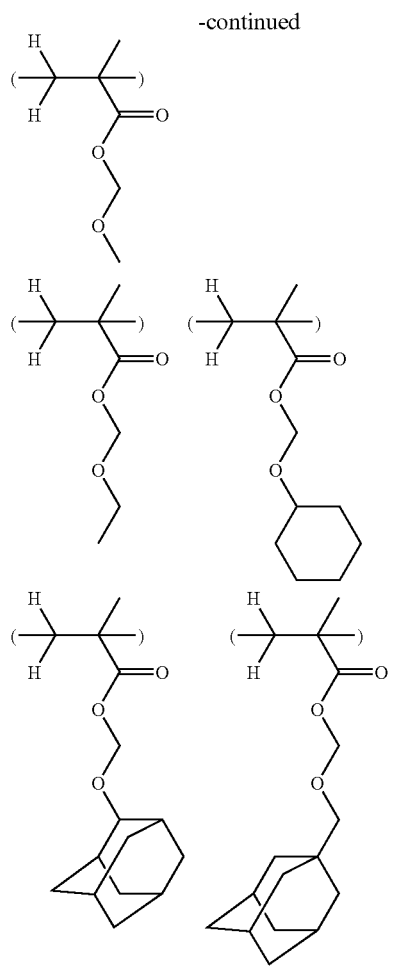
Exemplary polymers comprising recurring units incorporated at compositional ratios a1', b1', c1', and d1' in formula (R1) are shown below, but not limited thereto.
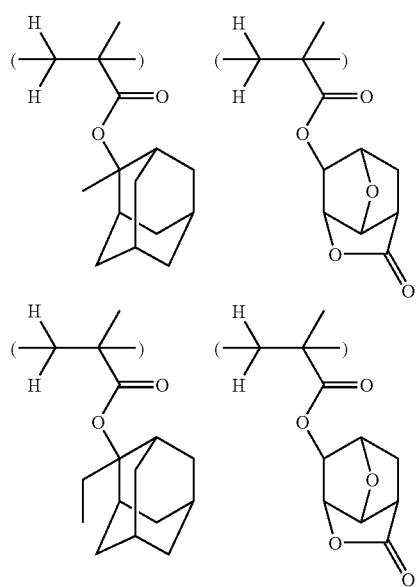
-continued
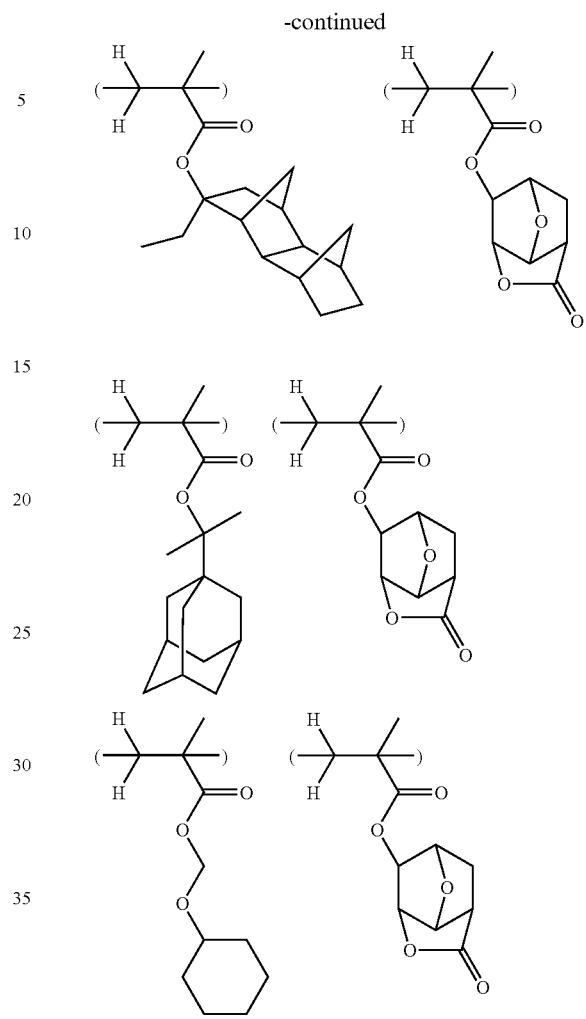
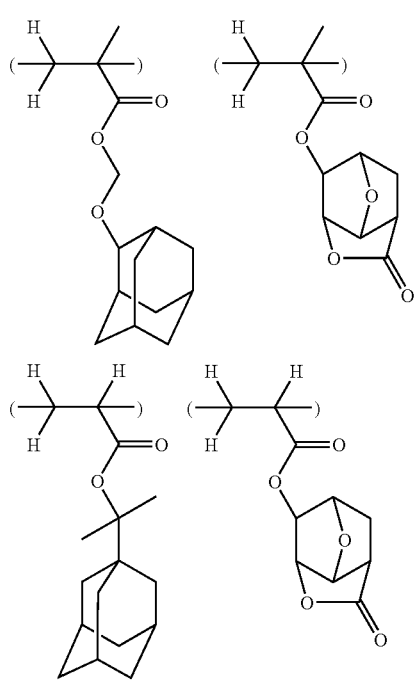

-continued
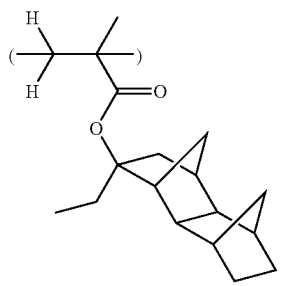
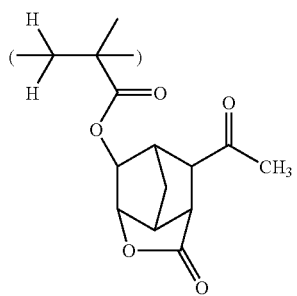
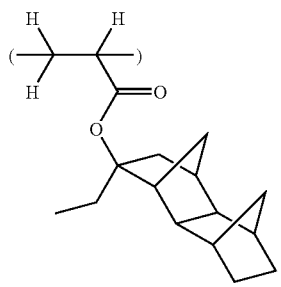
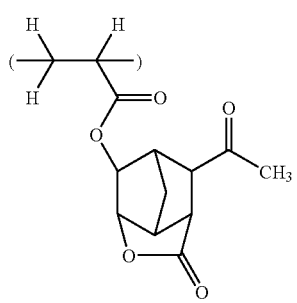
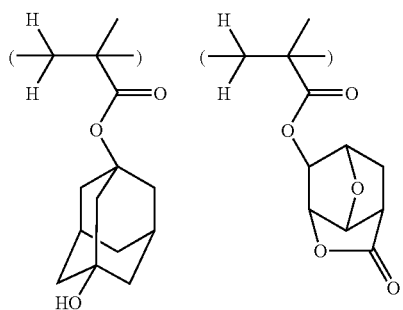
-continued
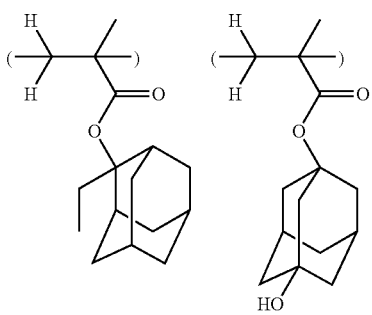
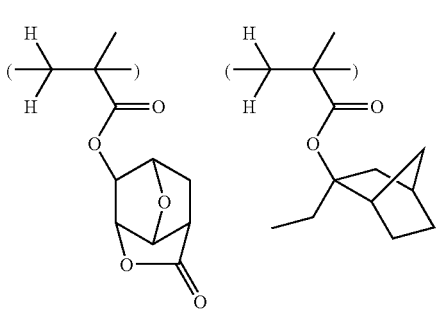
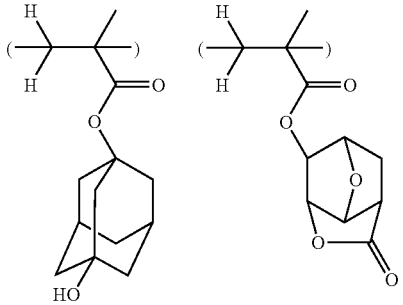
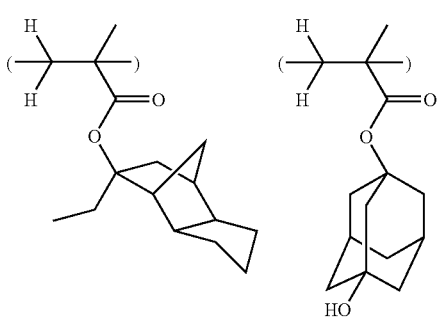
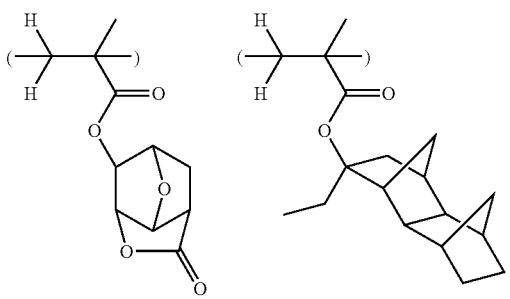

-continued
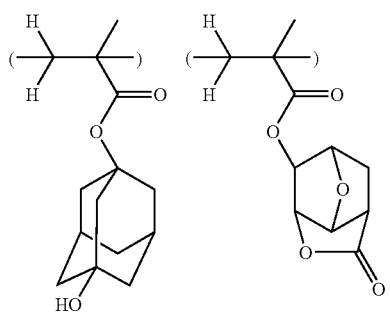
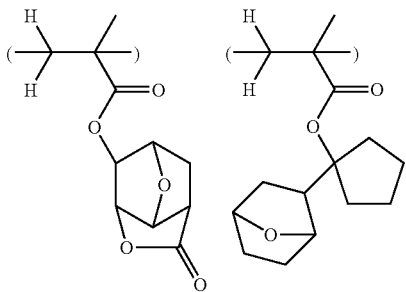
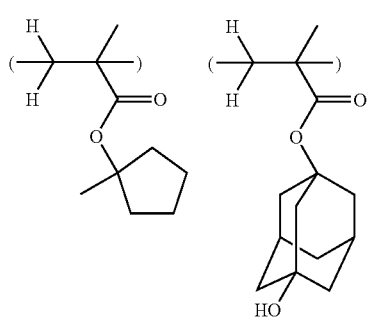
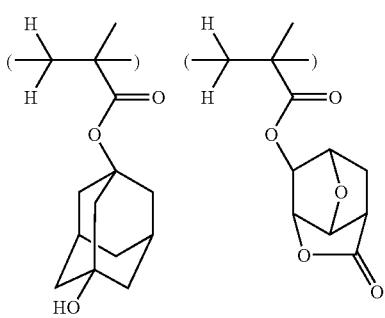
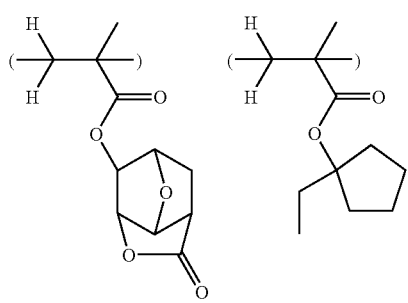
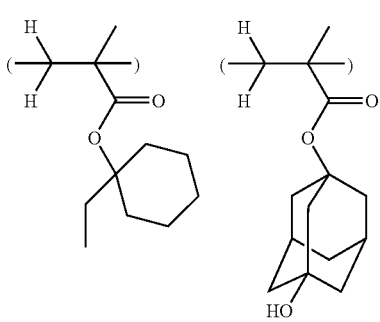
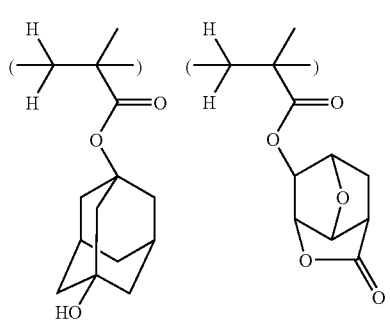
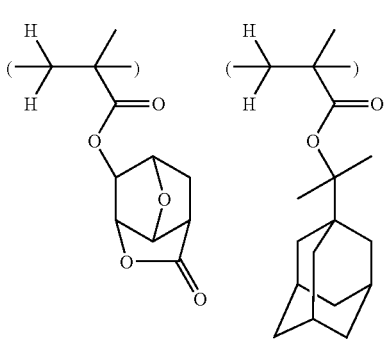
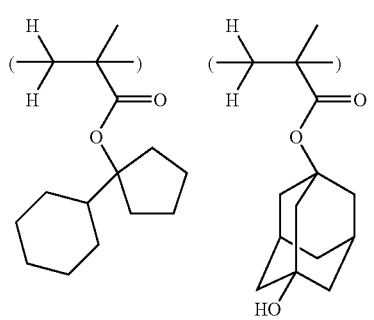
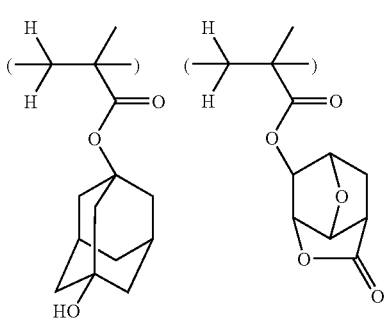

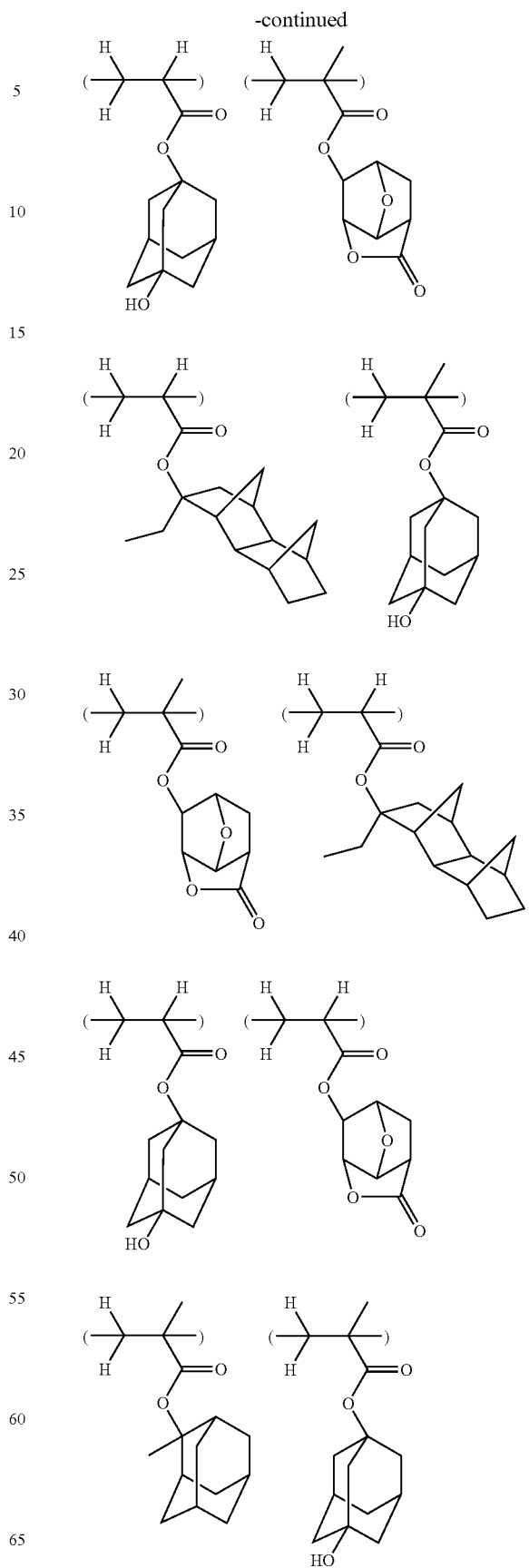

-continued
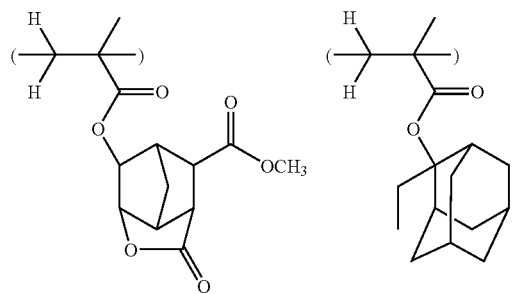
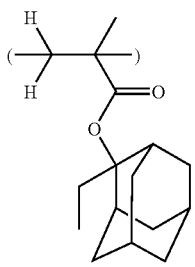
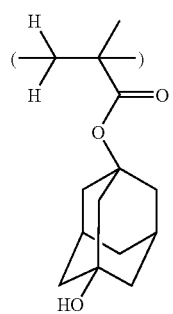
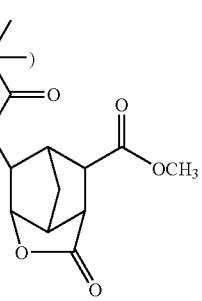
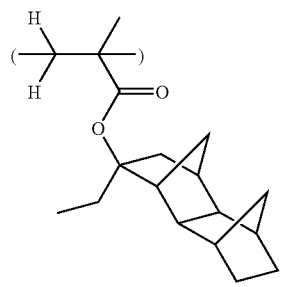
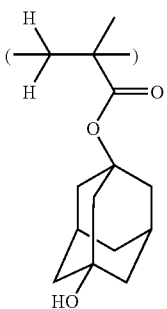
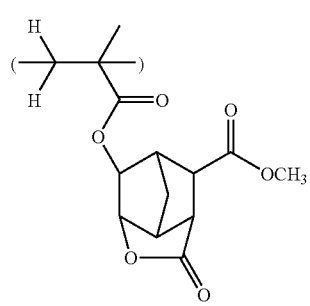
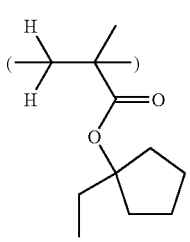
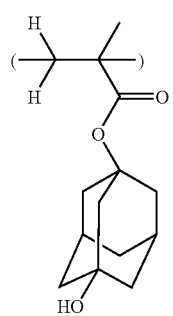
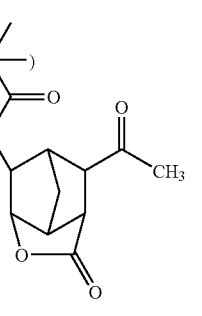
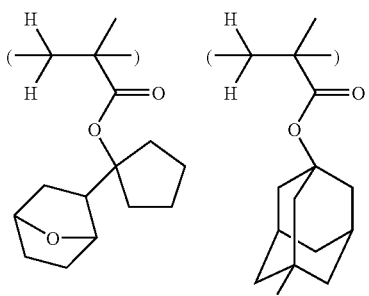
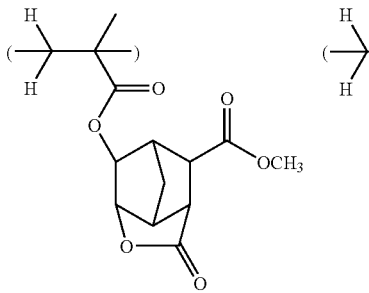
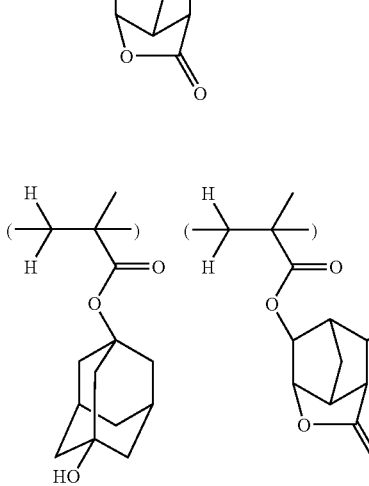
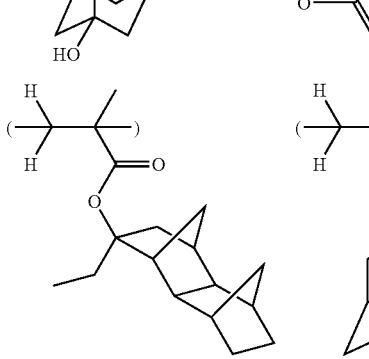
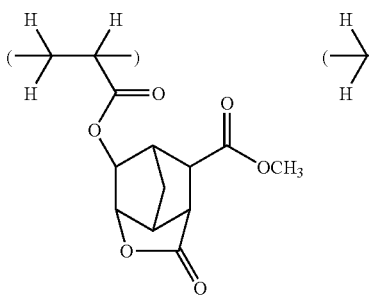

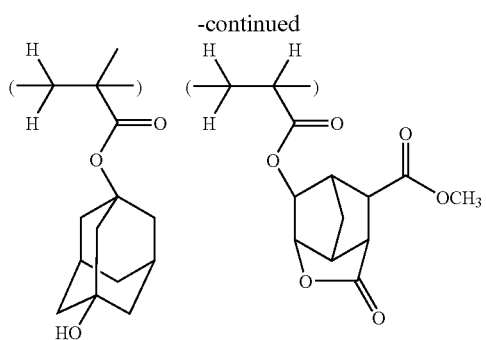
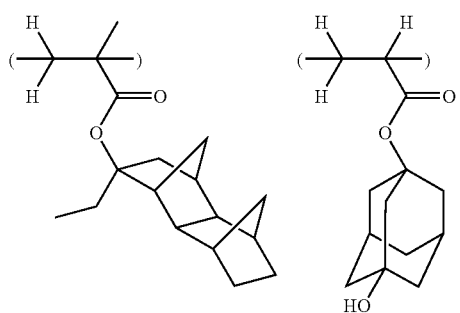
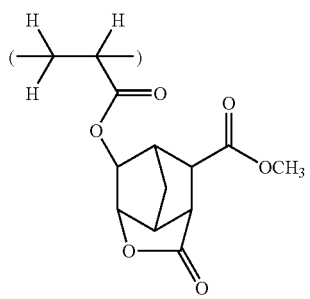
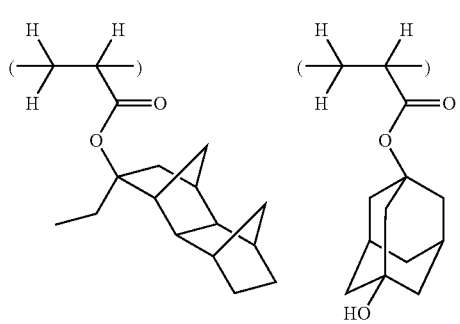
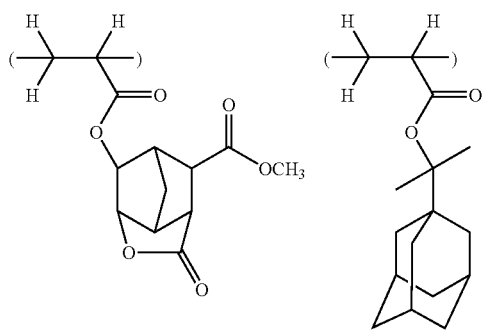
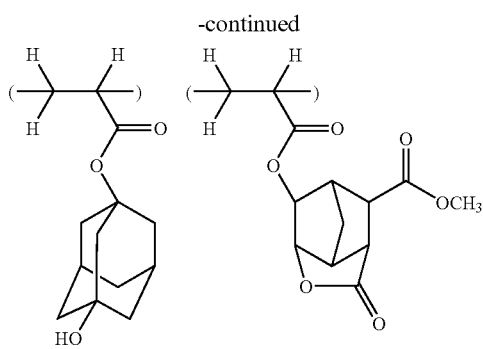
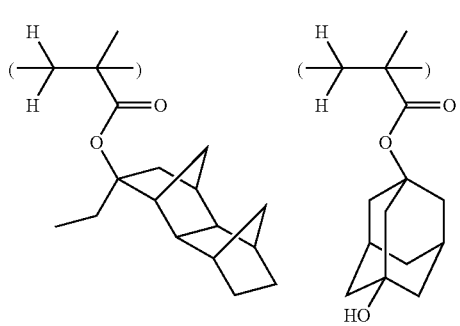
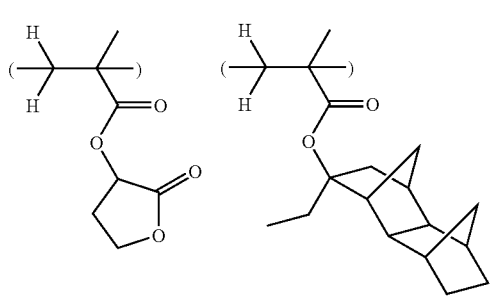
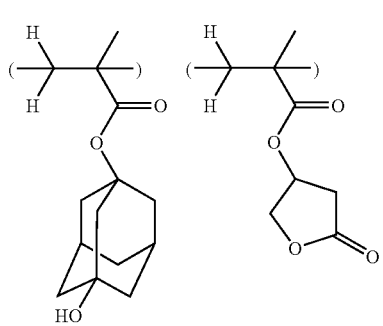
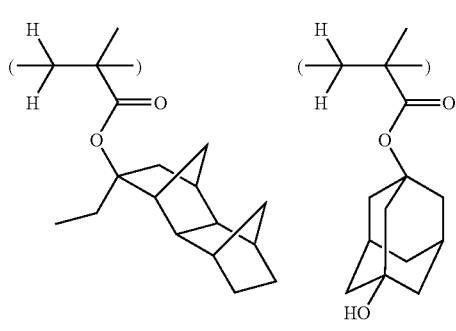

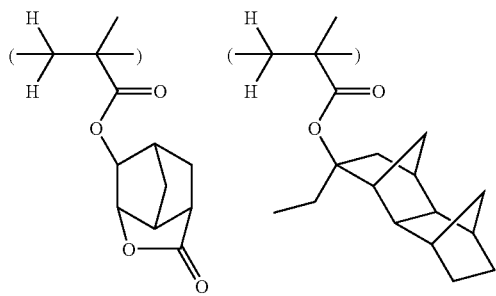
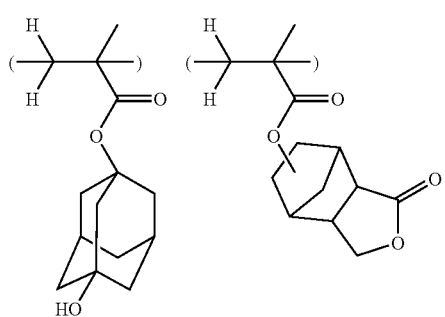
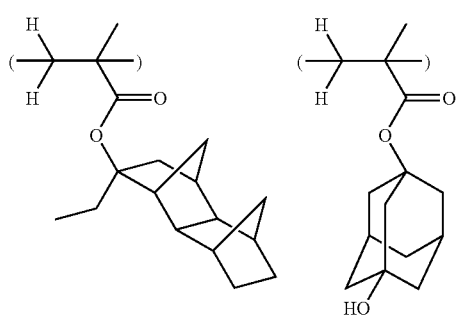
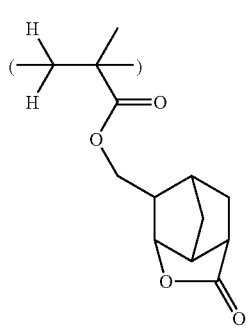
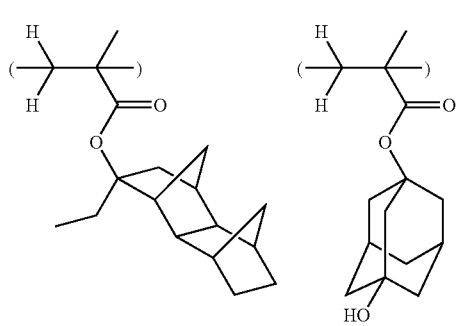
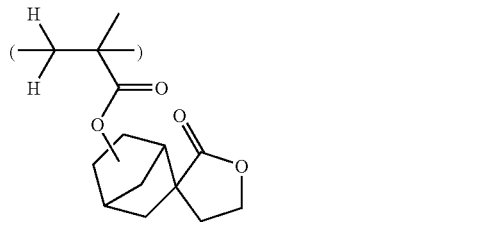
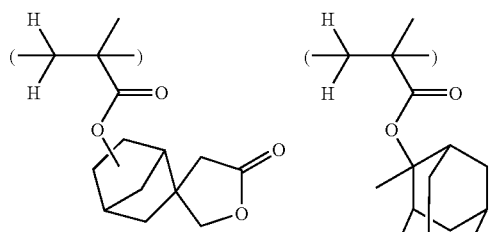
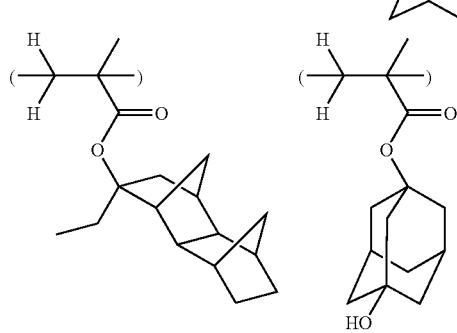
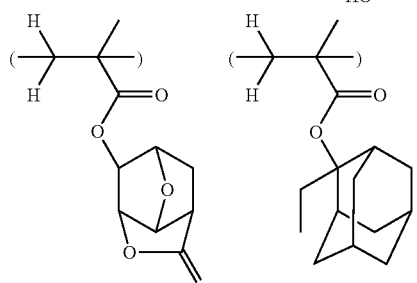
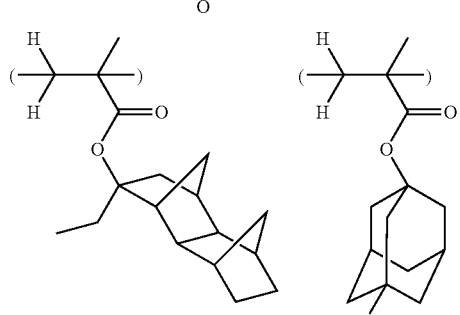
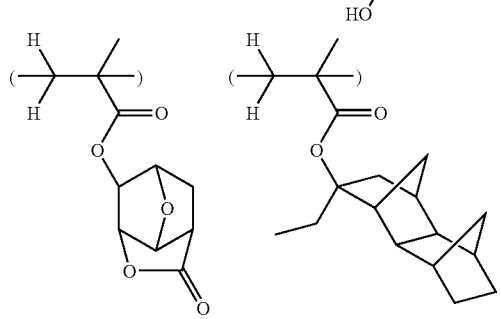

-continued
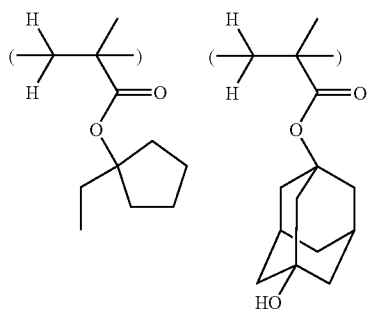
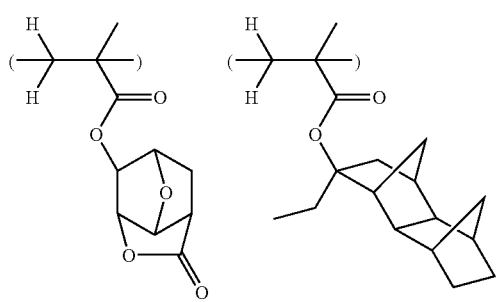
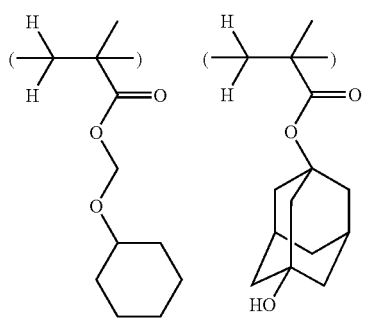
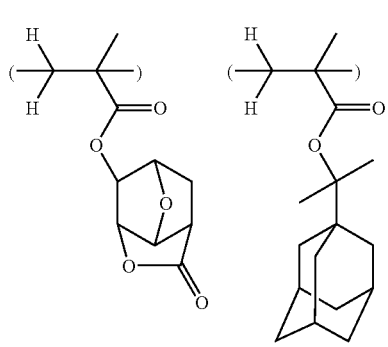
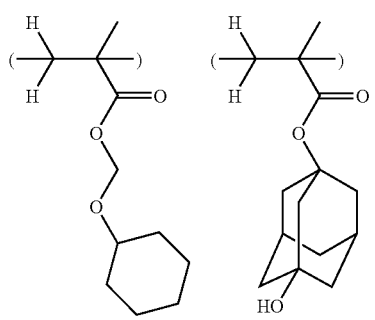
-continued
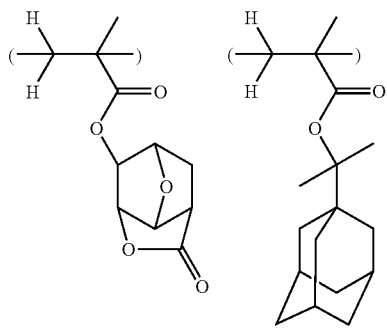
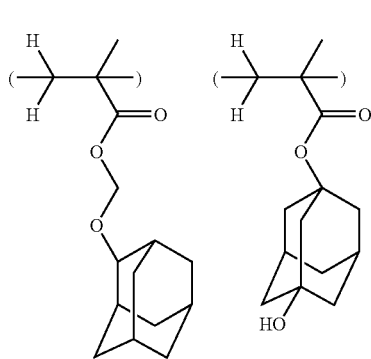
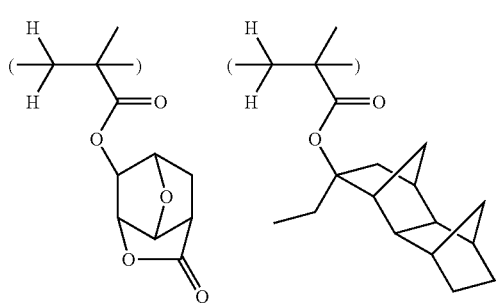
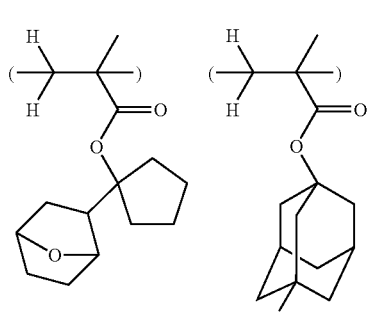
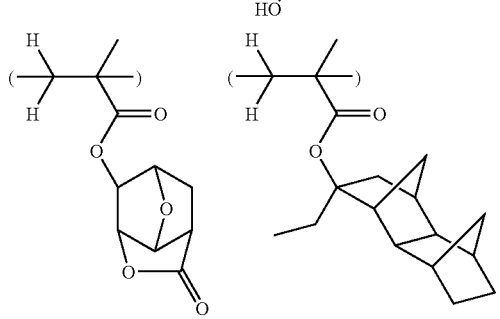

-continued
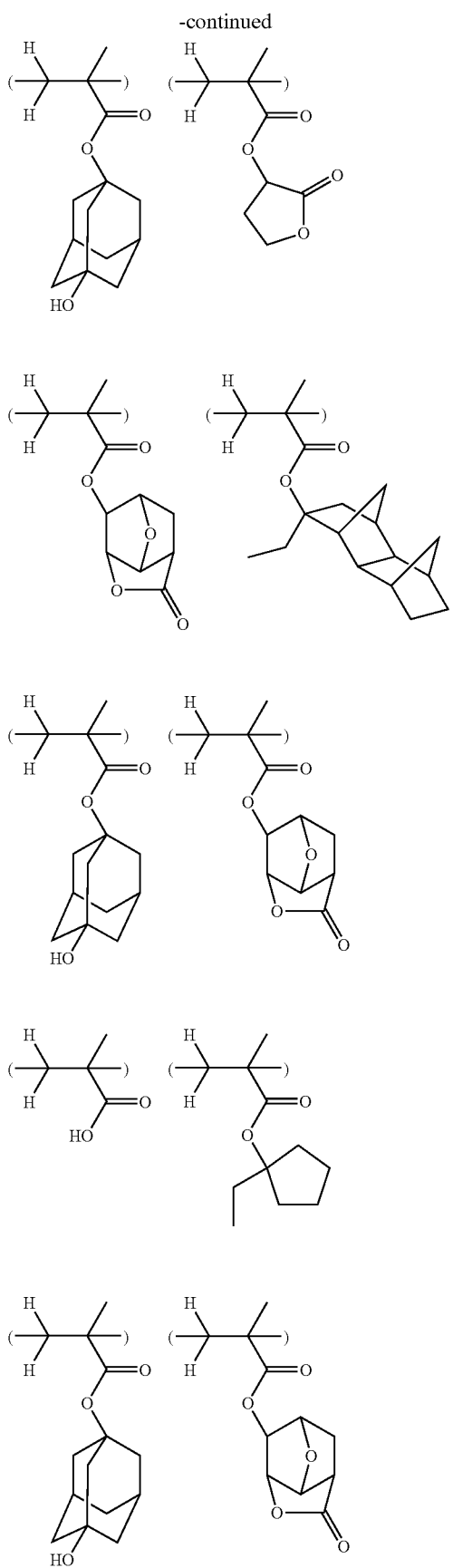
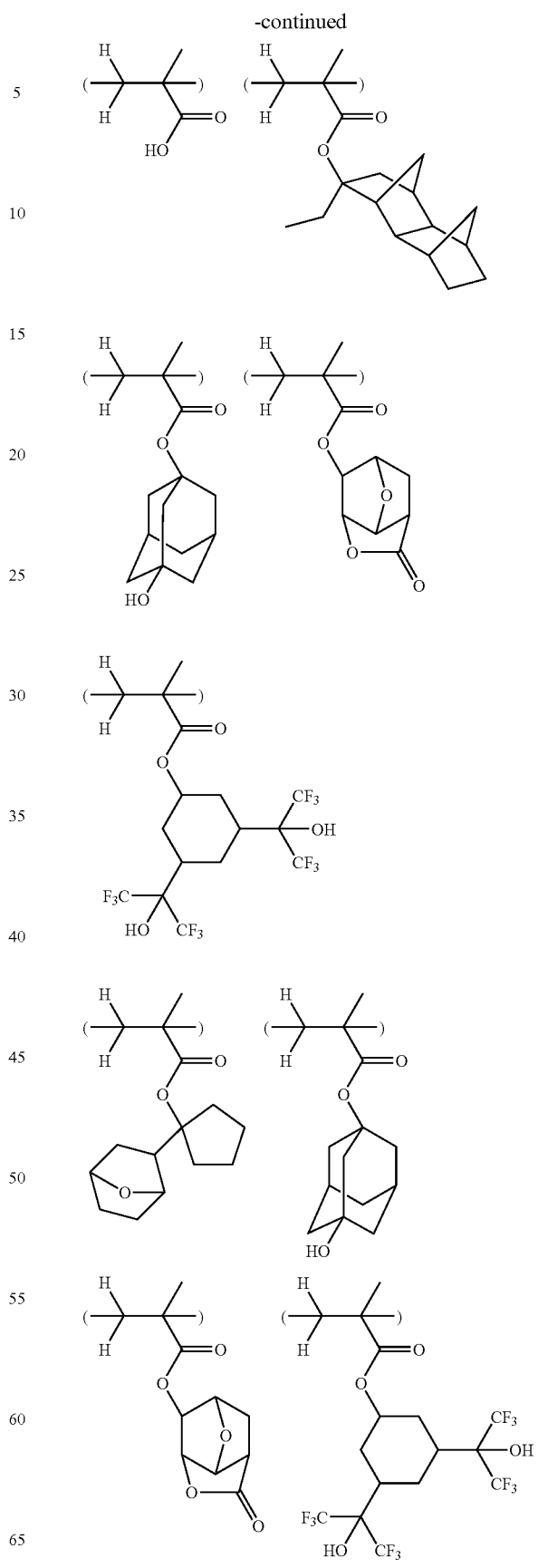

-continued
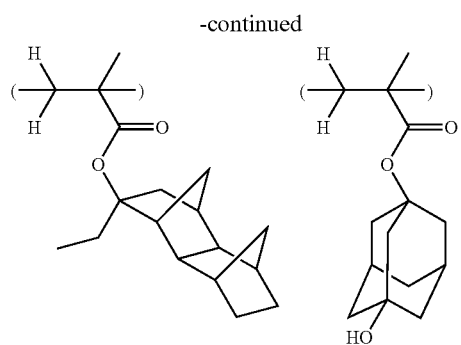
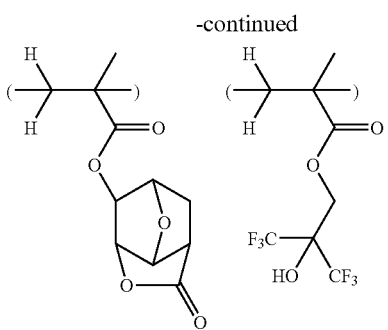
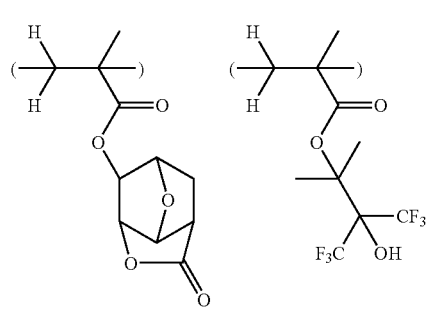
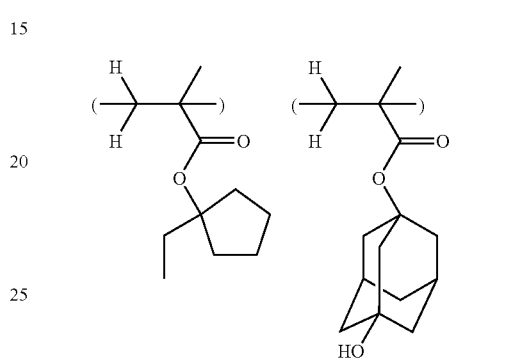
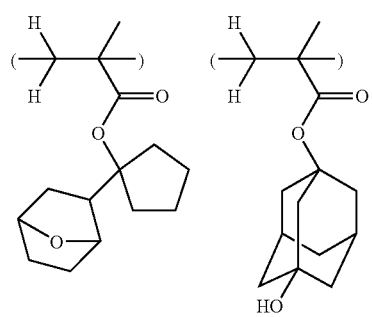
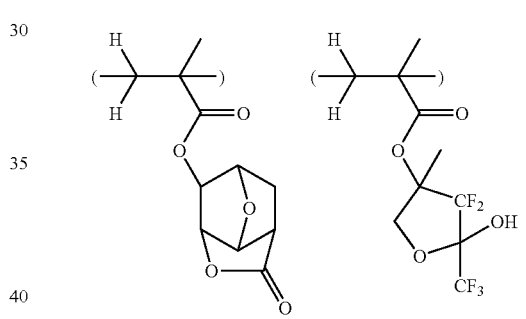
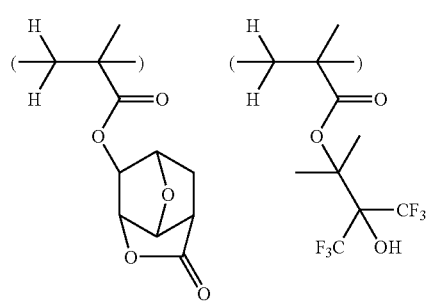
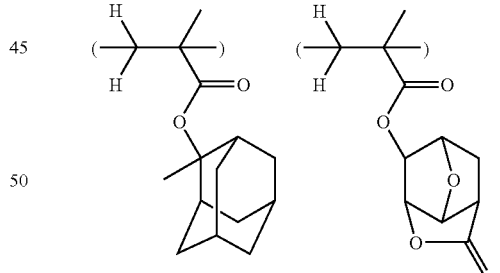
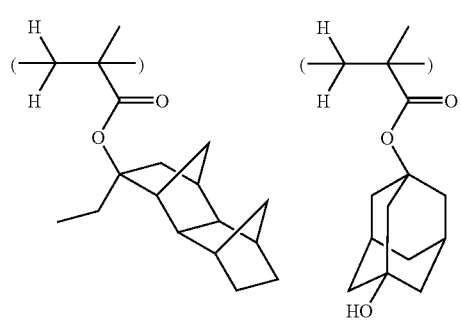
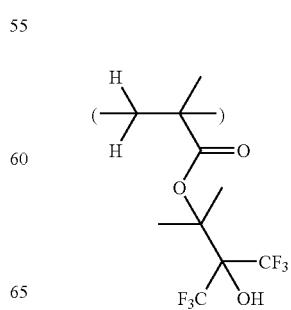

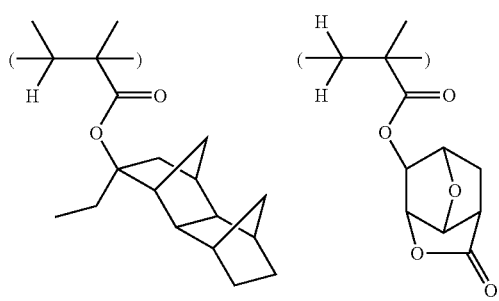
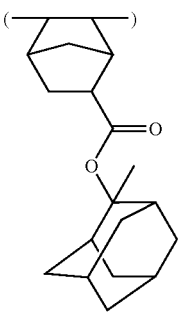
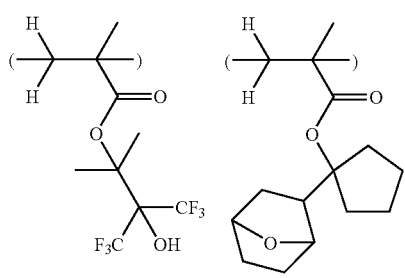
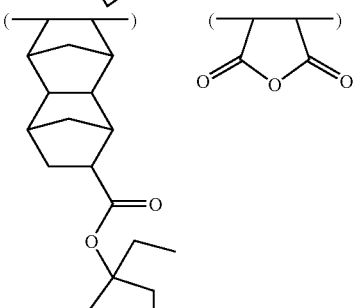
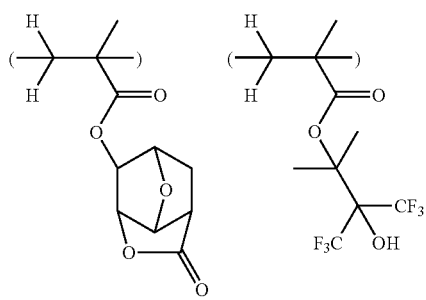
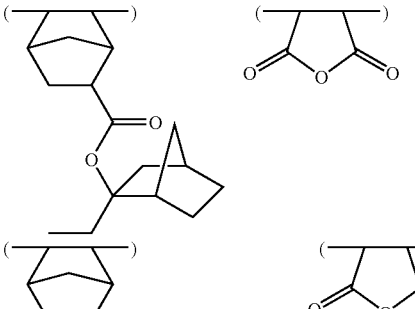
Exemplary polymers comprising recurring units incorporated at compositional ratios a2', b2', c2', and d2' in formula (R1) are shown below, but not limited thereto.
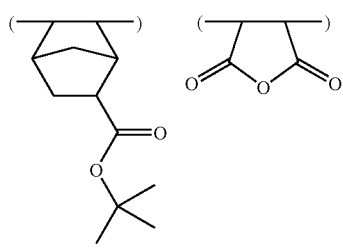
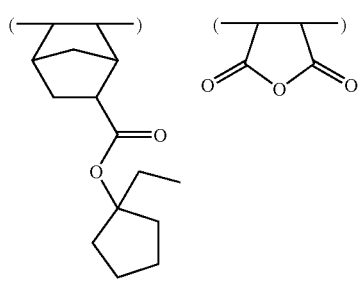
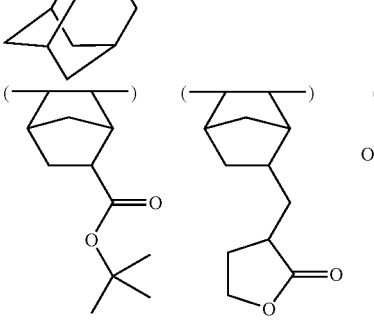

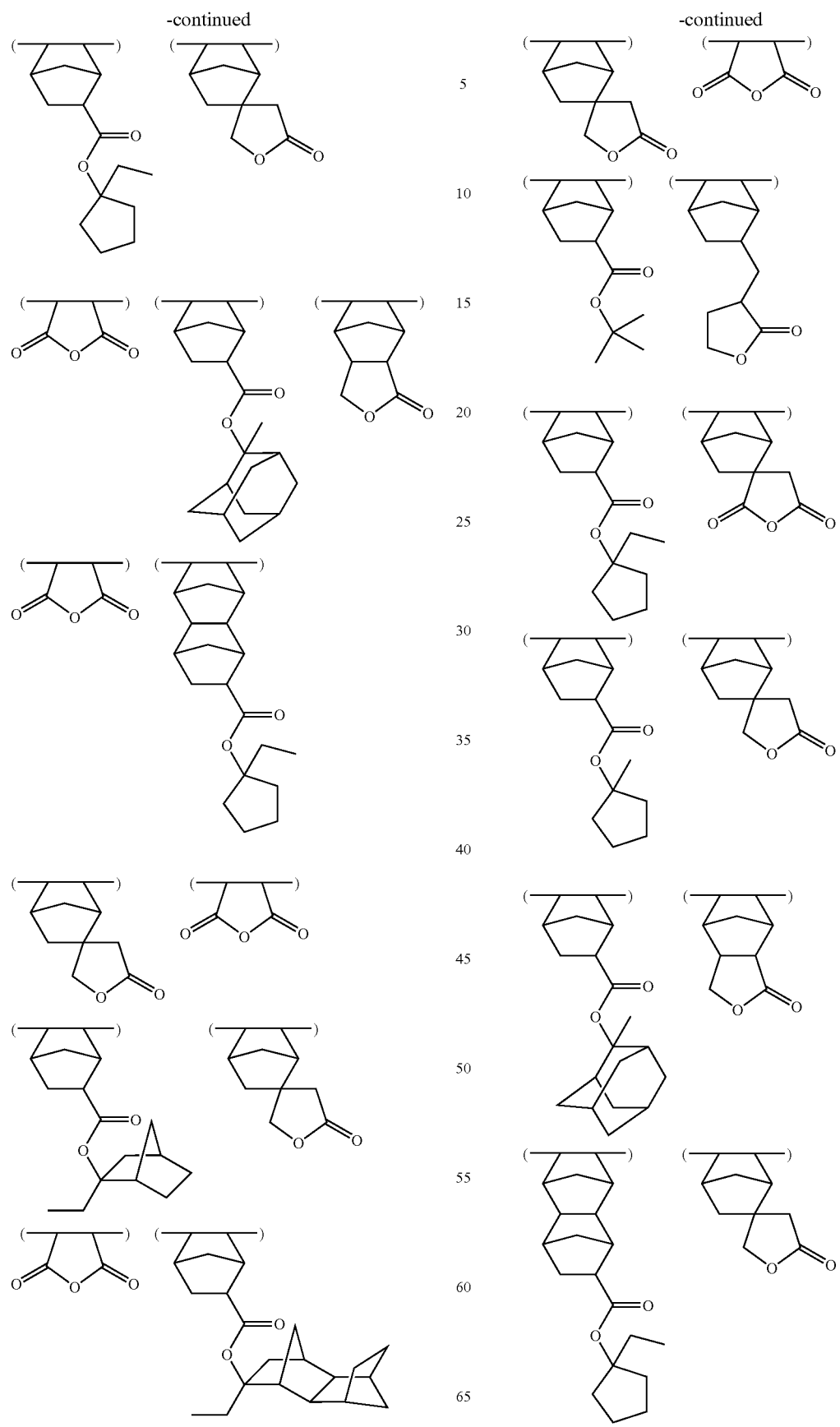

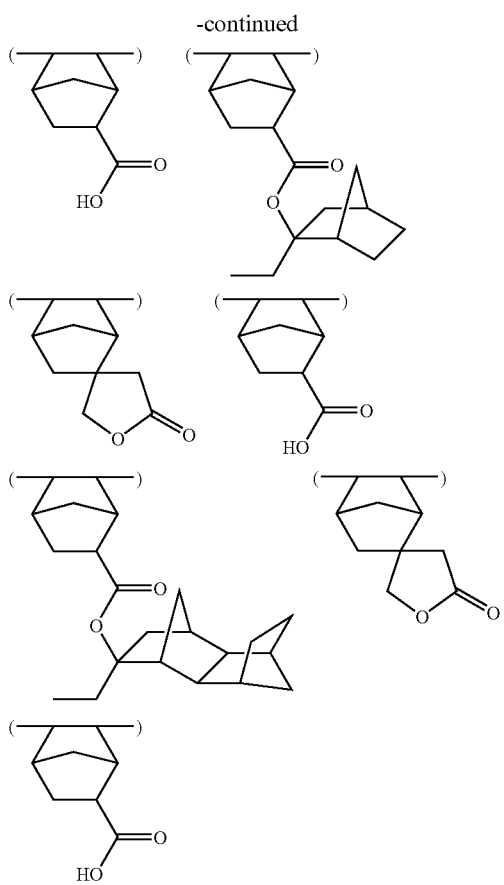
Exemplary polymers comprising recurring units incorporated at compositional ratios a3', b3', c3', and d3' in formula (R1) are shown below, but not limited thereto.
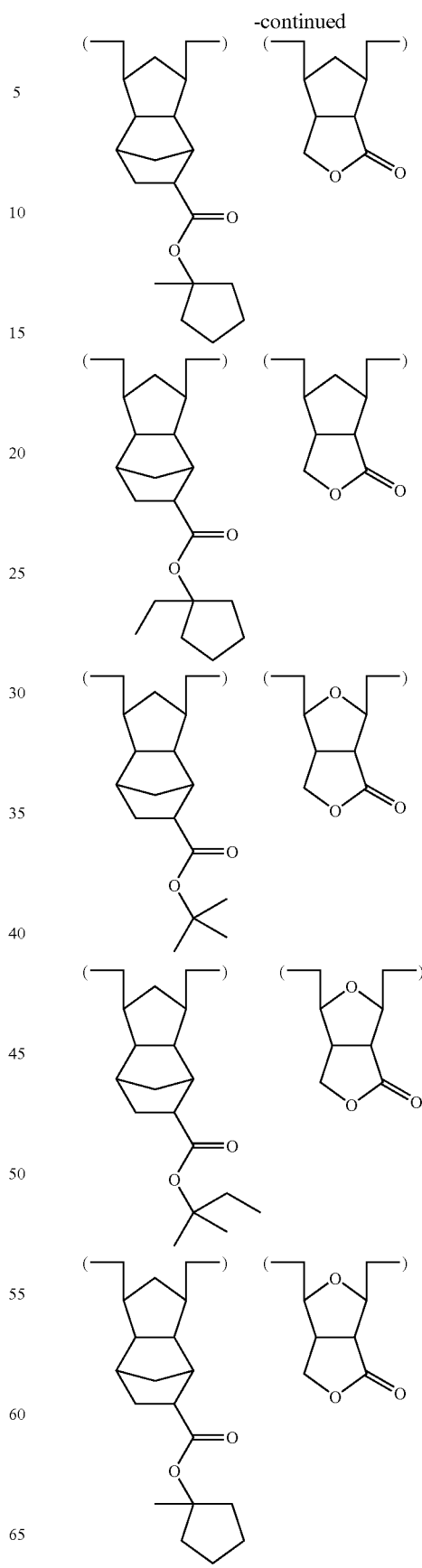

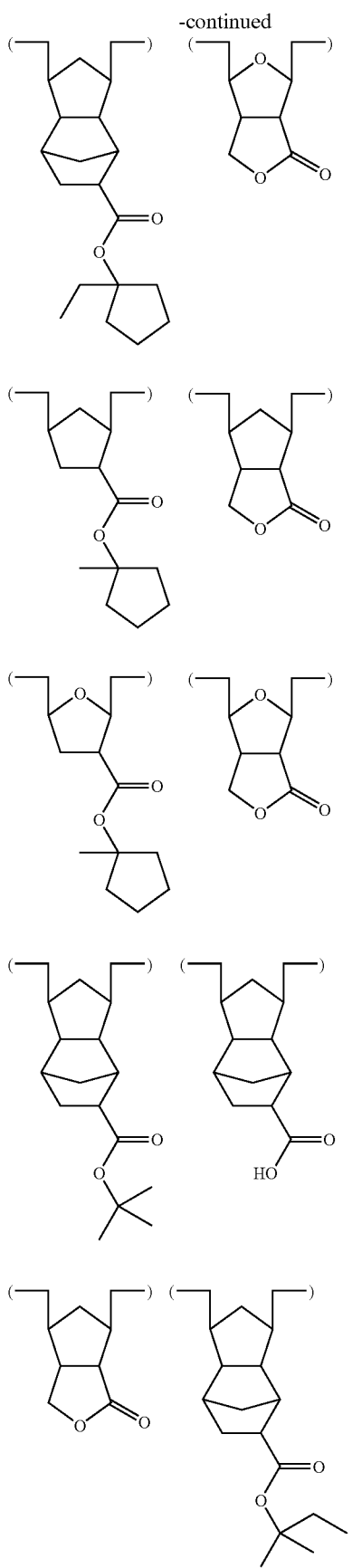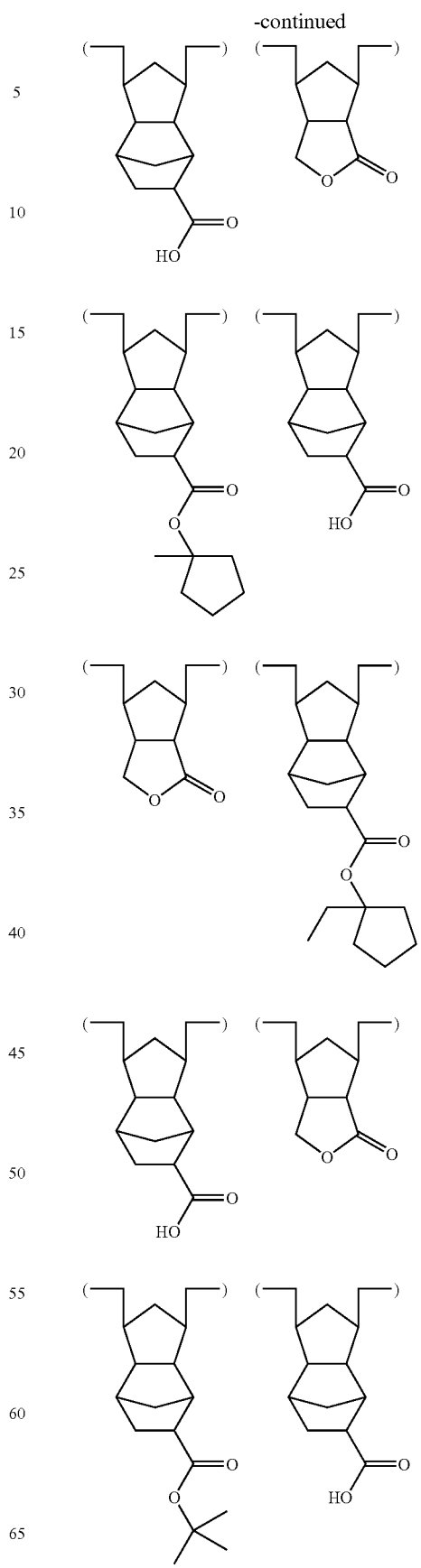

-continued
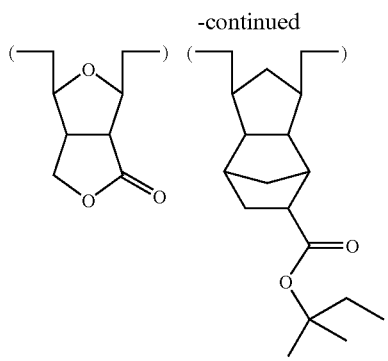
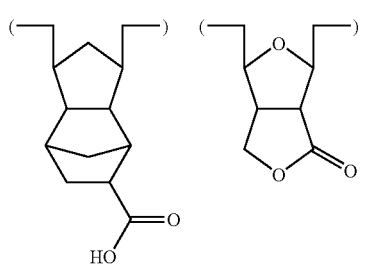
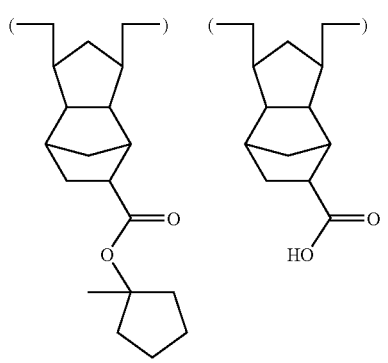
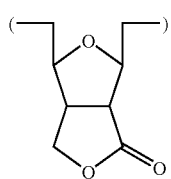
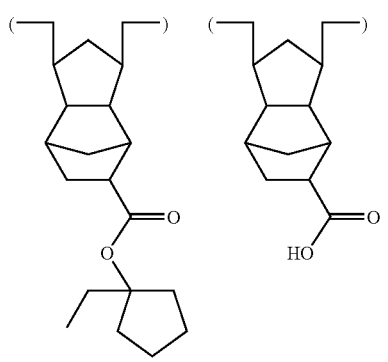
-continued
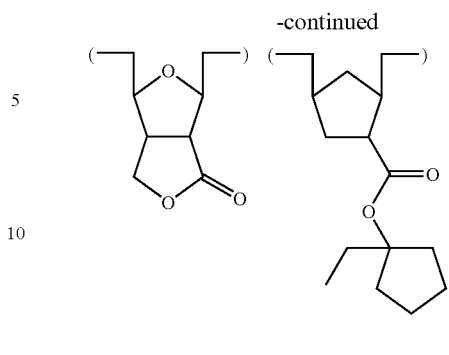
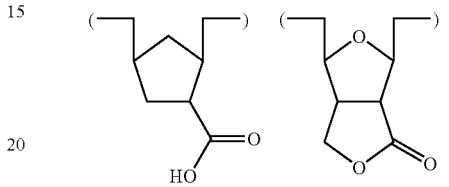
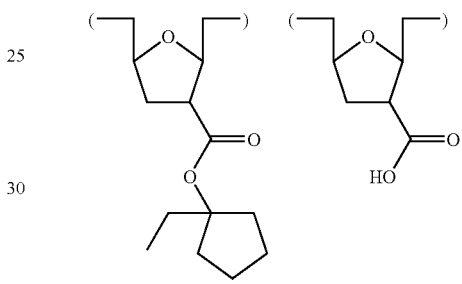
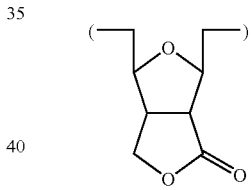
Examples of polymers having formula (R2) are shown below, but not limited thereto.
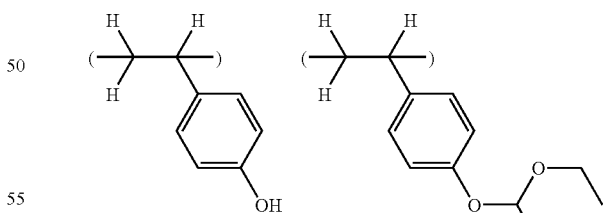
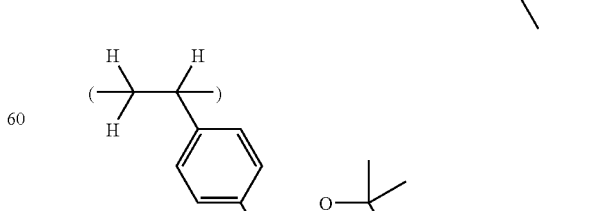

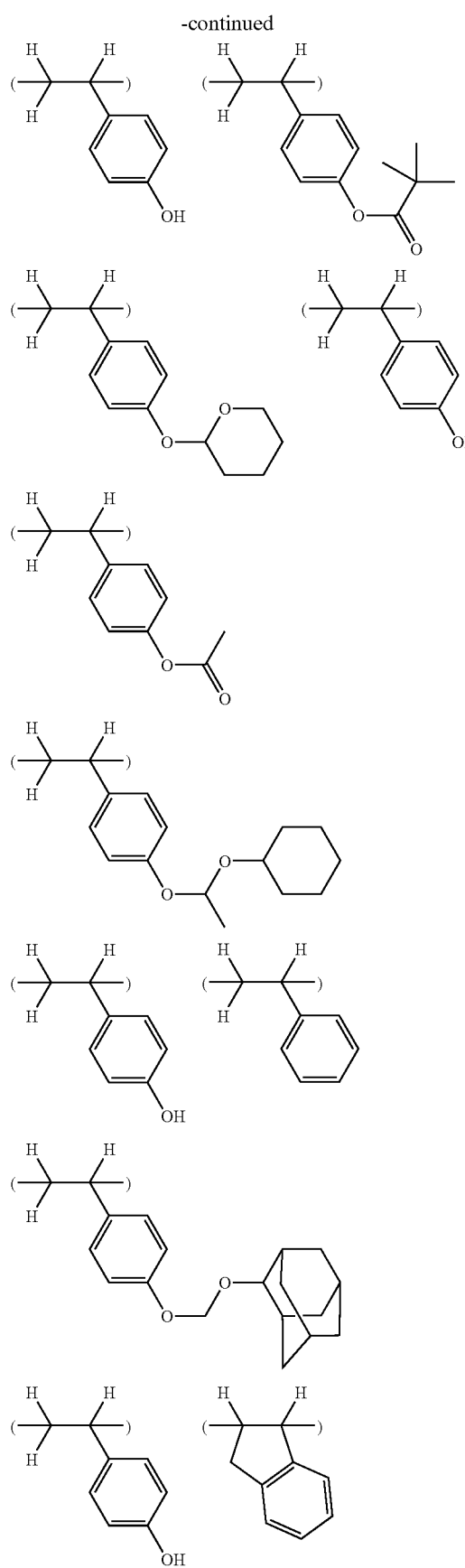
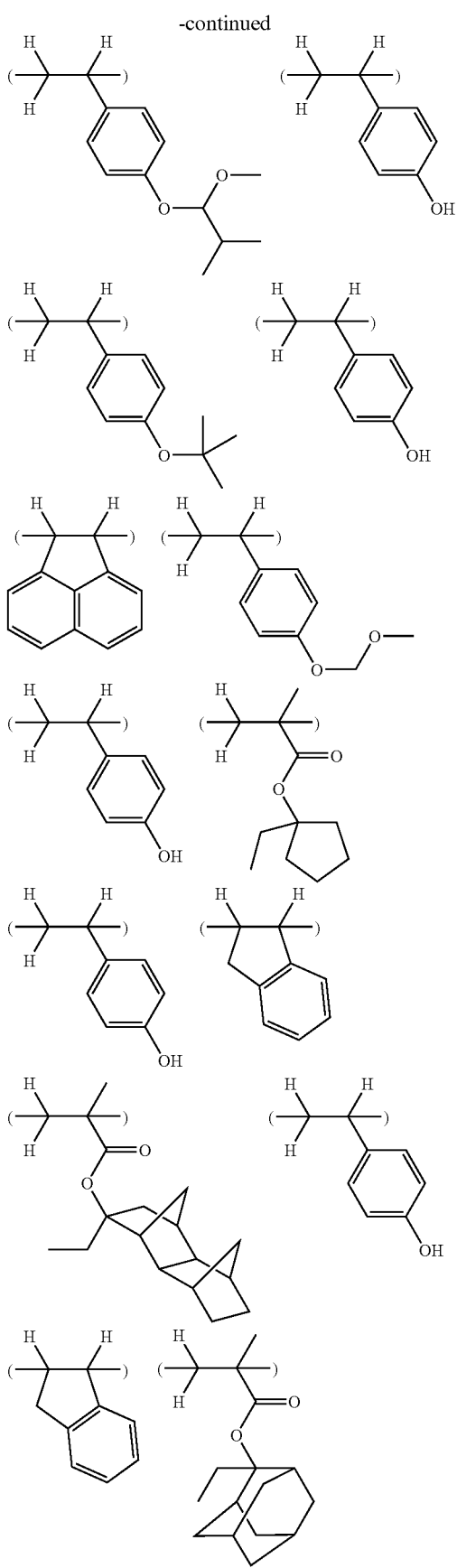

-continued

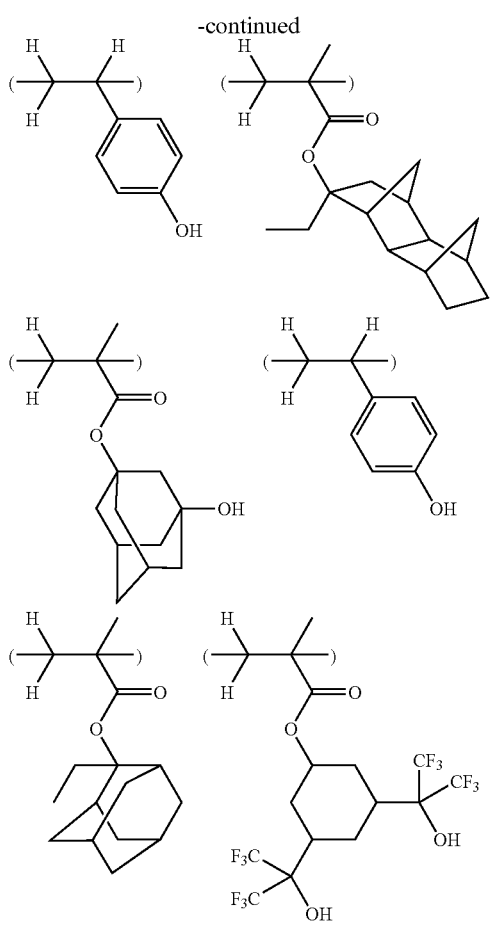

The other polymer is blended in an amount of preferably 0 to 80 parts, more preferably 0 to 60 parts, and even more preferably 0 to 50 parts by weight, provided that the total of the resin component (A) and the other polymer is 100 parts by weight. When blended, the amount of the other polymer is preferably at least 20 parts, more preferably at least 30 parts by weight. Too much amounts of the other polymer may prevent the resin component (A) from exerting its own effect, probably resulting in a lower resolution and degraded pattern profile. The other polymer is not limited to one type and a mixture of two or more other polymers may be added. The use of plural polymers allows for easy adjustment of resist properties.

Photoacid Generator

The resist composition of the invention also comprises (B) a compound which generates an acid in response to actinic light or radiation. Component (B) may be any compound which generates an acid upon exposure to high-energy radiation and specifically, any of well-known photoacid generators which are commonly used in prior art resist compositions, especially chemically amplified resist compositions. Suitable photoacid generators include sulfonium salts, iodonium salts, sulfonyldiazomethane, N-sulfonyloxyimide, and oxime-O-sulfonate acid generators. Exemplary acid generators are given below while they may be used alone or in admixture of two or more.

Sulfonium salts are salts of sulfonium cations with sulfonates, bis(substituted alkylsulfonyl)imides and tris(substituted alkylsulfonyl)methides. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, 4-n-butoxynaphthyl-1-thiacyclopentanium, and 2-n-butoxynaphthyl-1-thiacyclopentanium. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Exemplary bis(substituted alkylsulfonyl)imides include bistrifluoromethylsulfonylimide, bispentafluoroethylsulfonylimide, bisheptafluoropropylsulfonylimide, and 1,3-propylenebissulfonylimide. A typical tris(substituted alkylsulfonyl)methide is tristrifluoromethylsulfonylmethide. Sulfonium salts based on combination of the foregoing examples are included.

Iodonium salts are salts of iodonium cations with sulfonates, bis(substituted alkylsulfonyl)imides and tris(substituted alkylsulfonyl)methides. Exemplary iodonium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropane-sulfonate, 1,1,3,3,3-pentafluoro-2-furoyloxypropanesulfonate, 2-naphthoyloxy-1,1,3,3,3-pentafluoropropane-sulfonate, 2-(4-tert-butylbenzoyloxy)-1,1,3,3,3-pentafluoropropane-sulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Exemplary bis(substituted alkylsulfonyl)imides include bistrifluoromethylsulfonylimide, bispentafluoroethylsulfonylimide, bisheptafluoropropylsulfonylimide, and 1,3-propylenebissulfonylimide. A typical tris(substituted alkylsulfonyl)methide is tristrifluoromethylsulfonylmethide. Iodonium salts based on combination of the foregoing examples are included.

Exemplary sulfonyldiazomethane compounds include bis-sulfonyldiazomethane compounds and sulfonylcarbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, bis(4-acetyloxyphenylsulfonyl)diazomethane, bis(4-methanesulfonyloxyphenylsulfonyl)diazomethane, bis(4-(4-toluenesulfonyloxy)phenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)-diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-adamantanecarbonyloxy-1,1,3,3,3-pentafluoropropane-sulfonate, 2-acetyloxy-1,1,3,3,3-pentafluoropropane-sulfonate, 1,1,3,3,3-pentafluoro-2-hydroxypropane-sulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Benzoinsulfonate photoacid generators include benzoin tosylate, benzoin mesylate, and benzoin butanesulfonate.

Pyrogallol trisulfonate photoacid generators include pyrogallol, phloroglucinol, catechol, resorcinol, and hydroquinone, in which all the hydroxyl groups are substituted by trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-adamantanecarbonyloxy-1,1,3,3,3-pentafluoropropane-sulfonate, 2-acetyloxy-1,1,3,3,3-pentafluoropropane-sulfonate, 1,1,3,3,3-pentafluoro-2-hydroxypropane-sulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-adamantanecarbonyloxy-1,1,3,3,3-pentafluoropropane-sulfonate, 2-acetyloxy-1,1,3,3,3-pentafluoropropane-sulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl) ethanesulfonate, and 1,1,2,2-tetrafluoro-2-(tetracyclo [4.4.0.1$^{2,5}$.1$^{7,10}$]dodec-3-en-8-yl)ethanesulfonate. Also useful are analogous nitrobenzyl sulfonate compounds in which the nitro group on the benzyl side is substituted by a trifluoromethyl group.

Sulfone photoacid generators include bis(phenylsulfonyl) methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl) propiophenone, 2-cyclohexylcarbonyl-2-(p-toluenesulfonyl) propane, and 2,4-dimethyl-2-(p-toluenesulfonyl)pentan-3-one.

Photoacid generators in the form of glyoxime derivatives are described in Japanese Patent No. 2,906,999 and JP-A 9-301948 and include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(methanesulfonyl)-α-dimethylglyoxime, bis-O-(trifluoromethanesulfonyl)-α-dimethylglyoxine, bis-O-(2,2,2-trifluoroethanesulfonyl)-α-dimethylglyoxime, bis-O-(10-camphorsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-trifluoromethylbenzenesulfonyl)-α-dimethylglyoxime, bis-O-(xylenesulfonyl)-α-dimethylglyoxime, bis-O-(trifluoromethanesulfonyl)-nioxime, bis-O-(2,2,2-trifluoroethanesulfonyl)-nioxime, bis-O-(10-camphorsulfonyl)-nioxime, bis-O-(benzenesulfonyl)-nioxime, bis-O-(p-fluorobenzenesulfonyl)-nioxime, bis-O-(p-trifluoromethylbenzenesulfonyl)-nioxime, and bis-O-(xylenesulfonyl)-nioxime.

Also included are the oxime sulfonates described in U.S. Pat. No. 6,004,724, for example, (5-(4-toluenesulfonyl)oxyimino-5H-thiophen-2-ylidene)phenyl-acetonitrile, (5-(10-camphorsulfonyl)oxyimino-5H-thiophen-2-ylidene)phenyl-acetonitrile, (5-n-octanesulfonyloxyimino-5H-thiophen-2-ylidene)phenyl-acetonitrile, (5-(4-toluenesulfonyl) oxyimino-5H-thiophen-2-ylidene)(2-methylphenyl) acetonitrile, (5-(10-camphorsulfonyl)oxyimino-5H-thiophen-2-ylidene)(2-methylphenyl)acetonitrile, (5-n-octanesulfonyloxyimino-5H-thiophen-2-ylidene)(2-methylphenyl)acetonitrile, etc. Also included are the oxime sulfonates described in U.S. Pat. No. 6,916,591, for example, (5-(4-(4-toluenesulfonyloxy)benzenesulfonyl)oxyimino-5H-thiophen-2-ylidene)phenylacetonitrile and (5-(2,5-bis(4-toluenesulfonyloxy)benzenesulfonyl)oxyimino-5H-thiophen-2-ylidene)phenylacetonitrile.

Also included are the oxime sulfonates described in U.S. Pat. No. 6,261,738 and JP-A 2000-314956, for example, 2,2,2-trifluoro-1-phenyl-ethanone oxime-O-methylsulfonate; 2,2,2-trifluoro-1-phenyl-ethanone oxime-O-(10-camphorylsulfonate); 2,2,2-trifluoro-1-phenyl-ethanone oxime-O-(4-methoxy-phenylsulfonate); 2,2,2-trifluoro-1-phenyl-ethanone oxime-O-(1-naphthylsulfonate); 2,2,2-trifluoro-1-phenyl-ethanone oxime-O-(2-naphthylsulfonate); 2,2,2-trifluoro-1-phenyl-ethanone oxime-O-(2,4,6-trimethylphenylsulfonate); 2,2,2-trifluoro-1-(4-methylphenyl)-ethanone oxime-O-(10-camphorylsulfonate); 2,2,2-trifluoro-1-(4-methylphenyl)-ethanone oxime-O-(methylsulfonate); 2,2,2-trifluoro-1-(2-methylphenyl)-ethanone oxime-O-(10-camphorylsulfonate); 2,2,2-trifluoro-1-(2,4-dimethylphenyl)-ethanone oxime-O-(10-camphorylsulfonate); 2,2,2-trifluoro-1-(2,4-dimethylphenyl)-ethanone oxime-O-(1-naphthylsulfonate); 2,2,2-trifluoro-1-(2,4-dimethylphenyl)-ethanone oxime-O-(2-naphthylsulfonate); 2,2,2-trifluoro-1-(2,4,6-trimethylphenyl)-ethanone oxime-O-(10-camphorylsulfonate); 2,2,2-trifluoro-1-(2,4,6-trimethylphenyl)-ethanone oxime-O-(1-naphthylsulfonate); 2,2,2-trifluoro-1-(2,4,6-trimethylphenyl)-ethanone oxime-O-(2-naphthylsulfonate); 2,2,2-trifluoro-1-(4-methoxyphenyl)-ethanone oxime-O-methylsulfonate; 2,2,2-trifluoro-1-(4-methylthiophenyl)-ethanone oxime-O-methylsulfonate; 2,2,2-trifluoro-1-(3,4-dimethoxyphenyl)-ethanone oxime-O-methylsulfonate; 2,2,3,3,4,4,4-heptafluoro-1-phenyl-butanone oxime-O-(10-camphorylsulfonate); 2,2,2-trifluoro-1-(phenyl)-ethanone oxime-O-methylsulfonate; 2,2,2-trifluoro-1-(phenyl)-ethanone oxime-O-10-camphorylsulfonate; 2,2,2-trifluoro-1-(phenyl)-ethanone oxime-O-(4-methoxyphenyl)sulfonate; 2,2,2-trifluoro-1-(phenyl)-ethanone oxime-O-(1-naphthyl)sulfonate; 2,2,2-trifluoro-1-(phenyl)-ethanone oxime-O-(2-naphthyl)sulfonate; 2,2,2-trifluoro-1-(phenyl)-ethanone oxime-O-(2,4,6-trimethylphenyl)sulfonate; 2,2,2-trifluoro-1-(4-methylphenyl)-ethanone oxime-O-(10-camphoryl)sulfonate; 2,2,2-trifluoro-1-(4-methylphenyl)-ethanone oxime-O-methylsulfonate; 2,2,2-trifluoro-1-(2-methylphenyl)-ethanone oxime-O-(10-camphoryl)sulfonate; 2,2,2-trifluoro-1-(2,4-dimethylphenyl)-ethanone oxime-O-(1-naphthyl)sulfonate; 2,2,2-trifluoro-1-(2,4-dimethylphenyl)-ethanone oxime-O-(2-naphthyl)sulfonate; 2,2,2-trifluoro-1-(2,4,6-trimethylphenyl)-ethanone oxime-O-(10-camphoryl)sulfonate; 2,2,2-trifluoro-1-(2,4,6-trimethylphenyl)-ethanone oxime-O-(1-naphthyl)sulfonate; 2,2,2-trifluoro-1-(2,4,6-trimethylphenyl)-ethanone oxime-O-(2-naphthyl)sulfonate; 2,2,2-trifluoro-1-(4-methoxyphenyl)-ethanone oxime-O-methylsulfonate; 2,2,2-trifluoro-1-(4-thiomethylphenyl)-ethanone oxime-O-methylsulfonate; 2,2,2-trifluoro-1-(3,4-dimethoxyphenyl)-ethanone oxime-O-methylsulfonate; 2,2,2-trifluoro-1-(4-methoxyphenyl)-ethanone oxime-O-(4-methylphenyl)sulfonate; 2,2,2-trifluoro-1-(4-methoxyphenyl)-ethanone oxime-O-(4-methoxyphenyl)sulfonate; 2,2,2-trifluoro-1-(4-methoxyphenyl)-ethanone oxime-O-(4-dodecylphenyl)-sulfonate; 2,2,2-trifluoro-1-(4-methoxyphenyl)-ethanone oxime-O-octylsulfonate; 2,2,2-trifluoro-1-(4-thiomethyl-phenyl)-ethanone oxime-O-(4-methoxyphenyl)sulfonate; 2,2,2-trifluoro-1-(4-thiomethylphenyl)-ethanone oxime-O-(4-dodecylphenyl) sulfonate; 2,2,2-trifluoro-1-(4-thiomethyl-phenyl)-ethanone oxime-O-octylsulfonate; 2,2,2-trifluoro-1-(4-thiomethylphenyl)-ethanone oxime-O-(2-naphthyl)sulfonate; 2,2,2-trifluoro-1-(2-methylphenyl)-ethanone oxime-O-methylsulfonate; 2,2,2-trifluoro-1-(4-methylphenyl)ethanone oxime-O-phenylsulfonate; 2,2,2-trifluoro-1-(4-chlorophenyl)-ethanone oxime-O-phenylsulfonate; 2,2,3,3,4,4,4-heptafluoro-1-(phenyl)-butanone oxime-O-(10-camphoryl) sulfonate; 2,2,2-trifluoro-1-naphthyl-ethanone oxime-O-methylsulfonate; 2,2,2-trifluoro-2-naphthyl-ethanone oxime-O-methylsulfonate; 2,2,2-trifluoro-1-[4-benzylphenyl]-ethanone oxime-O-methylsulfonate; 2,2,2-trifluoro-1-[4-(phenyl-1,4-dioxa-but-1-yl)phenyl]-ethanone oxime-O-methylsulfonate; 2,2,2-trifluoro-1-naphthyl-ethanone oxime-O-propylsulfonate; 2,2,2-trifluoro-2-naphthyl-ethanone oxime-O-propylsulfonate; 2,2,2-trifluoro-1-[4-benzylphenyl]-ethanone oxime-O-propyl-sulfonate; 2,2,2-trifluoro-1-[4-methylsulfonylphenyl]-ethanone oxime-O-propylsulfonate; 1,3-bis[1-(4-phenoxy-phenyl)-2,2,2- trifluoroethanone oxime-O-sulfonyl]phenyl; 2,2,2-trifluoro-1-[4-methylsulfonyloxyphenyl]-ethanone oxime-O-propylsulfonate; 2,2,2-trifluoro-1-[4-methylcarbonyloxyphenyl]-ethanone oxime-O-propylsulfonate; 2,2,2-trifluoro-1-[6H,7H-5,8-dioxonaphth-2-yl]-ethanone oxime-O-propylsulfonate; 2,2,2-trifluoro-1-[4-methoxycarbonylmethoxyphenyl]-ethanone oxime-O-propylsulfonate; 2,2,2-trifluoro-1-[4-(methoxycarbonyl)-(4-amino-1-oxa-pent-1-yl)-phenyl]-ethanone oxime-O-propylsulfonate; 2,2,2-trifluoro-1-[3,5-dimethyl-4-ethoxyphenyl]-ethanone oxime-O-propylsulfonate; 2,2,2-trifluoro-1-[4-benzyloxyphenyl]-ethanone oxime-O-propylsulfonate; 2,2,2-trifluoro-1-[2-thiophenyl]-ethanone oxime-O-propylsulfonate; 2,2,2-trifluoro-1-[1-dioxa-thiophen-2-yl)]-ethanone oxime-O-propylsulfonate; 2,2,2-trifluoro-1-(4-(3-(4-(2,2,2-trifluoro-1-(trifluoromethanesulfonyloxyimino)-ethyl)-phenoxy)-propoxy)-phenyl)ethanone oxime(trifluoromethanesulfonate); 2,2,2-trifluoro-1-(4-(3-(4-(2,2,2-trifluoro-1-(1-propanesulfonyloxyimino)-ethyl)-phenoxy)-propoxy)-phenyl)ethanone oxime(1-propanesulfonate); and 2,2,2-trifluoro-1-(4-(3-(4-(2,2,2-trifluoro-1-(1-butanesulfonyloxyimino)-ethyl)-phenoxy)-propoxy)-phenyl)ethanone oxime(1-butanesulfonate). Also included are the oxime sulfonates described in U.S. Pat. No. 6,916,591, for example, 2,2,2-trifluoro-1-(4-(3-(4-(2,2,2-trifluoro-1-(4-(4-methyl-phenylsulfonyloxy)phenylsulfonyloxyimino)-ethyl)-phenoxy)-propoxy)-phenyl)ethanone oxime(4-(4-methylphenylsulfonyloxy)-phenylsulfonate) and 2,2,2-trifluoro-1-(4-(3-(4-(2,2,2-trifluoro-1-(2,5-bis(4-methylphenylsulfonyloxy)benzene-sulfonyloxy)phenylsulfonyloxyimino)-ethyl)-phenoxy)-propoxy)-phenyl)ethanone oxime(2,5-bis(4-methylphenylsulfonyloxy)-benzenesulfonyloxy)phenylsulfonate).

Also included are the oxime sulfonates described in JP-A 9-95479 and JP-A 9-230588 and the references cited therein, for example, α-(p-toluenesulfonyloxyimino)-phenylacetonitrile, α-(p-chlorobenzenesulfonyloxyimino)-phenylacetonitrile, α-(4-nitrobenzenesulfonyloxyimino)-phenylacetonitrile, α-(4-nitro-2-trifluoromethylbenzenesulfonyloxyimino)-phenylacetonitrile, α-(benzenesulfonyloxyimino)-4-chlorophenylacetonitrile, α-(benzenesulfonyloxyimino)-2,4-dichlorophenylacetonitrile, α-(benzenesulfonyloxyimino)-2,6-dichlorophenylacetonitrile, α-(benzenesulfonyloxyimino)-4-methoxyphenylacetonitrile, α-(2-chlorobenzenesulfonyloxyimino)-4-methoxyphenylacetonitrile, α-(benzenesulfonyloxyimino)-2-thienylacetonitrile, α-(4-dodecylbenzenesulfonyloxyimino)-phenylacetonitrile, α-[(4-toluenesulfonyloxyimino)-4-methoxyphenyl]acetonitrile, α-[(dodecylbenzenesulfonyloxyimino)-4-methoxyphenyl]-acetonitrile, α-(tosyloxyimino)-3-thienylacetonitrile, α-(methylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, and α-(n-butylsulfonyloxyimino)-1-cyclohexenylacetonitrile.

Also included are oxime sulfonates having the formula:

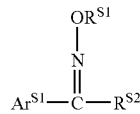

wherein $R^{s1}$ is a substituted or unsubstituted haloalkylsulfonyl or halobenzenesulfonyl group of 1 to 10 carbon atoms, $R^{s2}$ is a haloalkyl group of 1 to 11 carbon atoms, and $Ar^{s1}$ is substituted or unsubstituted aromatic or hetero-aromatic group, as described in WO 2004/074242. Examples include 2-[2,2,3,3,4,4,5,5-octafluoro-1-(nonafluorobutylsulfonyloxyimino)-pentyl]-fluorene, 2-[2,2,3,3,4,4-pentafluoro-1-(nonafluorobutylsulfonyloxyimino)-butyl]-fluorene, 2-[2,2,3,3,4,4,5,5,6,6-decafluoro-1-(nonafluorobutylsulfonyloxyimino)-hexyl]-fluorene, 2-[2,2,3,3,4,4,5,5-octafluoro-1-(nonafluorobutylsulfonyloxyimino)-pentyl]-4-biphenyl, 2-[2,2,3,3,4,4-pentafluoro-1-(nonafluorobutylsulfonyloxyimino)-butyl]-4-biphenyl, and 2-[2,2,3,3,4,4,5,5,6,6-decafluoro-1-(nonafluorobutylsulfonyloxyimino)-hexyl]-4-biphenyl.

Suitable bisoxime sulfonates include those described in JP-A 9-208554, for example, bis(α-(4-toluenesulfonyloxy)imino)-p-phenylenediacetonitrile, bis(α-(benzenesulfonyloxy)imino)-p-phenylenediacetonitrile, bis(α-(methanesulfonyloxy)imino)-p-phenylenediacetonitrile, bis(α-(butanesulfonyloxy)imino)-p-phenylenediacetonitrile, bis(α-(10-camphorsulfonyloxy)imino)-p-phenylenediacetonitrile, bis(α-(4-toluenesulfonyloxy)imino)-p-phenylenediacetonitrile, bis(α-(trifluoromethanesulfonyloxy)imino)-p-phenylenediacetonitrile, bis(α-(4-methoxybenzenesulfonyloxy)imino)-p-phenylenediacetonitrile, bis(α-(4-toluenesulfonyloxy)imino)-m-phenylenediacetonitrile, bis(α-(benzenesulfonyloxy)imino)-m-phenylenediacetonitrile, bis(α-(methanesulfonyloxy)imino)-m-phenylenediacetonitrile, bis(α-(butanesulfonyloxy)imino)-m-phenylenediacetonitrile, bis(α-(10-camphorsulfonyloxy)imino)-m-phenylenediacetonitrile, bis(α-(4-toluenesulfonyloxy)imino)-m-phenylenediacetonitrile, bis(α-(trifluoromethanesulfonyloxy)imino)-m-phenylenediacetonitrile, bis(α-(4-methoxybenzenesulfonyloxy)imino)-m-phenylenediacetonitrile, etc.

Of these, preferred photoacid generators are sulfonium salts, bissulfonyldiazomethanes, N-sulfonyloxyimides, oxime-O-sulfonates and glyoxime derivatives. More preferred photoacid generators are sulfonium salts, bissulfonyldiazomethanes, N-sulfonyloxyimides, and oxime-O-sulfonates. Typical examples include triphenylsulfonium p-toluenesulfonate, triphenylsulfonium camphorsulfonate, triphenylsulfonium pentafluorobenzenesulfonate, triphenylsulfonium nonafluorobutanesulfonate, triphenylsulfonium 4-(4'-toluenesulfonyloxy)benzenesulfonate, triphenylsulfonium 2,4,6-triisopropylbenzenesulfonate, 4-tert-butoxyphenyldiphenylsulfonium p-toluenesulfonate, 4-tert-butoxyphenyldiphenylsulfonium camphorsulfonate, 4-tert-butoxyphenyldiphenylsulfonium 4-(4'-toluenesulfonyloxy)benzenesulfonate, tris(4-methylphenyl)sulfonium camphorsulfonate, tris(4-tert-butylphenyl)sulfonium camphorsulfonate, 4-tert-butylphenyldiphenylsulfonium camphorsulfonate, 4-tert-butylphenyldiphenylsulfonium nonafluoro-1-butanesulfonate, 4-tertbutylphenyldiphenylsulfonium pentafluoroethylperfluorocyclohexanesulfonate, 4-tert-butylphenyldiphenylsulfonium perfluoro-1-octanesulfonate, triphenylsulfonium 1,1-difluoro-2-naphthyl-ethanesulfonate, triphenylsulfonium 1,1,2,2-tetrafluoro-2-(norbornan-2-yl)ethanesulfonate, bis(tert-butylsulfonyl)diazomethane, bis(cyclohexylsulfonyl)diazomethane, bis(2,4-dimethylphenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)diazomethane, bis(4-tert-butylphenylsulfonyl)diazomethane, N-camphorsulfonyloxy-5-norbornene-2,3-dicarboxylic acid imide, N-p-toluenesulfonyloxy-5-norbornene-2,3-dicarboxylic acid imide, 2-[2,2,3,3,4,4,5,5-octafluoro-1-(nonafluorobutylsulfonyloxyimino)-pentyl]-fluorene, 2-[2,2,3,3,4,4-pentafluoro-1-(nonafluorobutylsulfonyloxyimino)-butyl]-fluorene, and 2-[2,2,3,3,4,4,5,5,6,6-decafluoro-1-(nonafluorobutylsulfonyloxyimino)-hexyl]-fluorene.

In the resist composition, an appropriate amount of the photoacid generator (B) is, but not limited to, 0.1 to 20 parts, and especially 0.1 to 10 parts by weight per 100 parts by weight of the base polymer (i.e., resin component (A) and optional other resin component). Too high a proportion of the photoacid generator may give rise to problems of degraded resolution and foreign matter upon development and resist film peeling. The photoacid generators may be used alone or in admixture of two or more. The transmittance of the resist film can be controlled by using a photoacid generator having a low transmittance at the exposure wavelength and adjusting the amount of the photoacid generator added.

In the resist composition, there may be added a compound which is decomposed with an acid to generate another acid, that is, acid-amplifier compound. For these compounds, reference should be made to J. Photopolym. Sci. and Tech., 8, 43-44, 45-46 (1995), and ibid., 9, 29-30 (1996).

Examples of the acid-amplifier compound include tert-butyl-2-methyl-2-tosyloxymethyl acetoacetate and 2-phenyl-2-(2-tosyloxyethyl)-1,3-dioxolane, but are not limited thereto. Of well-known photoacid generators, many of those compounds having poor stability, especially poor thermal stability exhibit an acid amplifier-like behavior.

In the resist composition, an appropriate amount of the acid-amplifier compound is 0 to 2 parts, and especially 0 to 1 part by weight per 100 parts by weight of the base polymer. Excessive amounts of the acid-amplifier compound make diffusion control difficult, leading to degradation of resolution and pattern profile.

In addition to components (A) and (B), the resist composition may further comprise (C) an organic solvent and optionally (D) an organic nitrogen-containing compound, (E) a surfactant, and (F) other components.

Organic Solvent

The organic solvent (C) used herein may be any organic solvent in which the base resin, acid generator, and additives are soluble. Illustrative, non-limiting, examples of the organic solvent include ketones such as cyclohexanone and methyl amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, and mixtures thereof because the acid generator is most soluble therein.

An appropriate amount of the organic solvent used is about 200 to 3,000 parts, especially about 400 to 2,500 parts by weight per 100 parts by weight of the base polymer in the resist composition.

Nitrogen-Containing Compound

In the resist composition, an organic nitrogen-containing compound or compounds may be compounded as component (D). The organic nitrogen-containing compound used herein is preferably a compound capable of suppressing the rate of diffusion when the acid generated by the acid generator diffuses within the resist film. The inclusion of organic nitrogen-containing compound holds down the rate of acid diffusion within the resist film, resulting in better resolution. In addition, it suppresses changes in sensitivity following exposure and reduces substrate and environment dependence, as well as improving the exposure latitude and the pattern profile.

The organic nitrogen-containing compound used herein may be any of well-known organic nitrogen-containing compounds which are commonly used in prior art resist compositions, especially chemically amplified resist compositions. Suitable organic nitrogen-containing compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, imide derivatives, and carbamate derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl) pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, benzamide, and 1-cyclohexylpyrrolidone. Suitable imide derivatives include phthalimide, succinimide, and maleimide. Suitable carbamate derivatives include N-t-butoxycarbonyl-N,N-dicyclohexylamine, N-t-butoxycarbonylbenzimidazole and oxazolidinone.

In addition, organic nitrogen-containing compounds of the following general formula (B)-1 may also be included alone or in admixture.

$$N(X)_n(Y)_{3-n} \quad (B)\text{-}1$$

In the formula, n is equal to 1, 2 or 3; side chain Y is independently hydrogen or a straight, branched or cyclic $C_1$-$C_{20}$ alkyl group which may contain an ether or hydroxyl group; and side chain X is independently selected from groups of the following general formulas (X1) to (X3), and two or three X's may bond together to form a ring.

(X1)

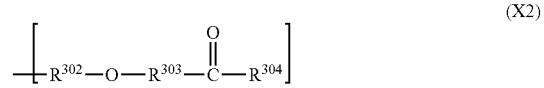
(X2)

(X3)

In the formulas, $R^{300}$, $R^{302}$ and $R^{305}$ are independently straight or branched $C_1$-$C_4$ alkylene groups; $R^{301}$ and $R^{304}$ are independently hydrogen, or straight, branched or cyclic $C_1$-$C_{20}$ alkyl groups which may contain at least one hydroxyl, ether, ester group or lactone ring; $R^{303}$ is a single bond or a straight or branched $C_1$-$C_4$ alkylene group; and $R^{306}$ is a straight, branched or cyclic $C_1$-$C_{20}$ alkyl group which may contain at least one hydroxyl, ether, ester group or lactone ring.

Illustrative examples of the compounds of formula (B)-1 include tris(2-methoxymethoxyethyl)amine, tris{2-(2-methoxyethoxy)ethyl}amine, tris{2-(2-methoxyethoxymethoxy) ethyl}amine, tris{2-(1-methoxyethoxy)ethyl}amine, tris{2-(1-ethoxyethoxy)ethyl}amine, tris{2-(1-ethoxypropoxy) ethyl}amine, tris[2-{2-(2-hydroxyethoxy)ethoxy}ethyl] amine, 4,7,13,16,21,24-hexaoxa-1,10-diazabicyclo[8.8.8] hexacosane, 4,7,13,18-tetraoxa-1,10-diazabicyclo[8.5.5] eicosane, 1,4,10,13-tetraoxa-7,16-diazabicyclooctadecane, 1-aza-12-crown-4, 1-aza-15-crown-5, 1-aza-18-crown-6, tris (2-formyloxyethyl)amine, tris(2-acetoxyethyl)amine, tris(2-propionyloxyethyl)amine, tris(2-butyryloxyethyl)amine, tris (2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris [2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl) amine, N,N-bis(2-hydroxyethyl)-2-(methoxycarbonyl) ethylamine, N,N-bis(2-acetoxyethyl)-2-(methoxycarbonyl) ethylamine, N,N-bis(2-hydroxyethyl)-2-(ethoxycarbonyl) ethylamine, N,N-bis(2-acetoxyethyl)-2-(ethoxycarbonyl) ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl) ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl) ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxy-carbonyl]ethylamine, N,N-bis(2-acetoxyethyl)-2-[(2-oxotetrahydrofuran-3-yl)oxy-carbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more organic nitrogen-containing compounds having cyclic structure represented by the following general formula (B)-2.

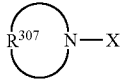

(B)-2

Herein X is as defined above, and $R^{307}$ is a straight or branched $C_2$-$C_{20}$ alkylene group which may contain one or more carbonyl, ether, ester or sulfide groups.

Illustrative examples of the organic nitrogen-containing compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, 2-methoxyethyl morpholinoacetate, 2-morpholinoethyl 2-methoxyacetate, 2-morpholinoethyl 2-(2-methoxyethoxy)acetate, 2-morpholinoethyl 2-[2-(2-methoxyethoxy)ethoxy]acetate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, and 2-morpholinoethyl stearate.

Also, one or more organic nitrogen-containing compounds having cyano group represented by the following general formulae (B)-3 to (B)-6 may be blended.

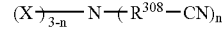

(B)-3

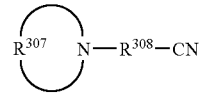

(B)-4

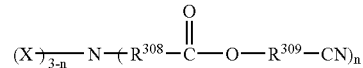

(B)-5

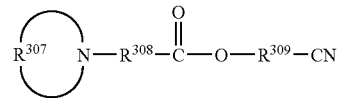

(B)-6

Herein, X, $R^{307}$ and n are as defined above, and $R^{308}$ and $R^{309}$ are each independently a straight or branched $C_1$-$C_4$ alkylene group.

Illustrative examples of the organic nitrogen-containing compounds having cyano represented by formulae (B)-3 to (B)-6 include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2- acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

Also included are organic nitrogen-containing compounds having an imidazole structure and a polar functional group, represented by the general formula (B)-7.

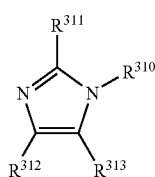

(B)-7

Herein, $R^{310}$ is a straight, branched or cyclic $C_2$-$C_{20}$ alkyl group bearing at least one polar functional group selected from among hydroxyl, carbonyl, ester, ether, sulfide, carbonate, cyano and acetal groups; $R^{311}$, $R^{312}$ and $R^{313}$ are each independently a hydrogen atom, a straight, branched or cyclic $C_1$-$C_{10}$ alkyl group, aryl group or aralkyl group.

Also included are organic nitrogen-containing compounds having a benzimidazole structure and a polar functional group, represented by the general formula (B)-8.

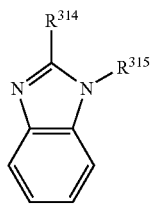

(B)-8

Herein, $R^{314}$ is a hydrogen atom, a straight, branched or cyclic $C_1$-$C_{10}$ alkyl group, aryl group or aralkyl group. $R^{315}$ is a polar functional group-bearing, straight, branched or cyclic $C_1$-$C_{20}$ alkyl group, and the alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (B)-9 and (B)-10.

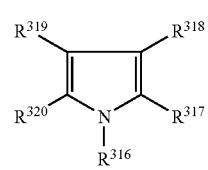

(B)-9

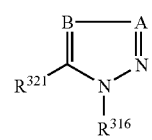

(B)-10

Herein, A is a nitrogen atom or $=C-R^{322}$, B is a nitrogen atom or $=C-R^{323}$, $R^{316}$ is a straight, branched or cyclic $C_2$-$C_{20}$ alkyl group bearing at least one polar functional group selected from among hydroxyl, carbonyl, ester, ether, sulfide, carbonate, cyano and acetal groups; $R^{317}$, $R^{318}$, $R^{319}$ and $R^{320}$ are each independently a hydrogen atom, a straight, branched or cyclic $C_1$-$C_{10}$ alkyl group or aryl group, or a pair of $R^{317}$ and $R^{318}$ and a pair of $R^{319}$ and $R^{320}$, taken together, may form a benzene, naphthalene or pyridine ring; $R^{321}$ is a hydrogen atom, a straight, branched or cyclic $C_1$-$C_{10}$ alkyl group or aryl group; $R^{322}$ and $R^{323}$ each are a hydrogen atom, a straight, branched or cyclic $C_1$-$C_{10}$ alkyl group or aryl group, or a pair of $R^{321}$ and $R^{323}$, taken together, may form a benzene or naphthalene ring.

Also included are organic nitrogen-containing compounds of aromatic carboxylic ester structure having the general formulae (B)-11 to (B)-14.

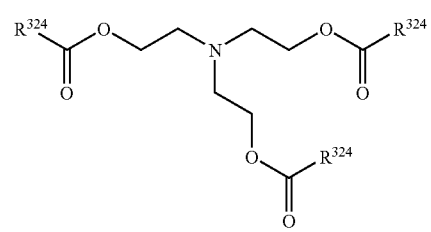

(B)-11

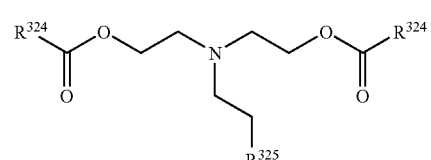

(B)-12

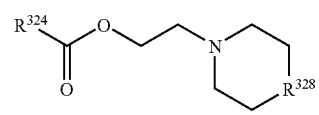

(B)-13

-continued (B)-14

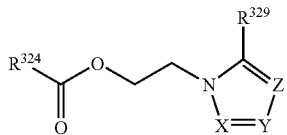

Herein $R^{324}$ is a $C_6$-$C_{20}$ aryl group or $C_4$-$C_{20}$ hetero-aromatic group, in which some or all of hydrogen atoms may be replaced by halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups. $R^{325}$ is $CO_2R^{326}$, $OR^{327}$ or cyano group. $R^{326}$ is a $C_1$-$C_{10}$ alkyl group, in which some methylene groups may be replaced by oxygen atoms. $R^{327}$ is a $C_1$-$C_{10}$ alkyl or acyl group, in which some methylene groups may be replaced by oxygen atoms. $R^{328}$ is a single bond, methylene, ethylene, sulfur atom or —$O(CH_2CH_2O)_n$— group wherein n is 0, 1, 2, 3 or 4. $R^{329}$ is hydrogen, methyl, ethyl or phenyl. X is a nitrogen atom or $CR^{330}$. Y is a nitrogen atom or $CR^{331}$. Z is a nitrogen atom or $CR^{332}$. $R^{330}$, $R^{331}$ and $R^{332}$ are each independently hydrogen, methyl or phenyl. Alternatively, a pair of $R^{330}$ and $R^{331}$ or a pair of $R^{331}$ and $R^{332}$ may bond together to form a $C_6$-$C_{20}$ aromatic ring or $C_2$-$C_{20}$ hetero-aromatic ring.

Further included are organic nitrogen-containing compounds of 7-oxanorbornane-2-carboxylic ester structure having the general formula (B)-15.

(B)-15

Herein $R^{333}$ is hydrogen or a straight, branched or cyclic $C_1$-$C_{10}$ alkyl group. $R^{334}$ and $R^{335}$ are each independently a $C_1$-$C_{20}$ alkyl group, $C_6$-$C_{20}$ aryl group or $C_7$-$C_{20}$ aralkyl group, which may contain one or more polar functional groups selected from among ether, carbonyl, ester, alcohol, sulfide, nitrile, amine, imine, and amide and in which some hydrogen atoms may be replaced by halogen atoms. $R^{334}$ and $R^{335}$, taken together, may form a heterocyclic or hetero-aromatic ring of 2 to 20 carbon atoms.

The organic nitrogen-containing compounds may be used alone or in admixture of two or more. The organic nitrogen-containing compound is preferably formulated in an amount of 0.001 to 4 parts, and especially 0.01 to 2 part by weight, per 100 parts by weight of the base polymer. Less than 0.001 part of the nitrogen-containing compound achieves no or little addition effect whereas more than 4 parts would result in too low a sensitivity.

Other Components

The resist composition of the invention may include optional ingredients, for example, a surfactant which is commonly used for improving the coating characteristics. Optional ingredients may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Fluorad FC-430 and FC-431 from Sumitomo 3M, Ltd., Surflon S-141, S-145, KH-10, KH-20, KH-30 and KH-40 from Asahi Glass Co., Ltd., Unidyne DS-401, DS-403 and DS-451 from Daikin Industry Co., Ltd., Megaface F-8151 from Dai-Nippon Ink & Chemicals, Inc., and X-70-092 and X-70-093 from Shin-Etsu Chemical Co., Ltd. Preferred surfactants are Fluorad FC-430 from Sumitomo 3M, Ltd., KH-20 and KH-30 from Asahi Glass Co., Ltd., and X-70-093 from Shin-Etsu Chemical Co., Ltd.

Optionally, a polymer may be added to the resist composition of the invention which will be locally distributed at the top of a coating and functions to adjust a hydrophilic/hydrophobic balance at the surface, to enhance water repellency, or to prevent low-molecular-weight components from flowing into or out of the coating when the coating comes in contact with water or similar liquids. The amount of functional polymer added is as used in resist compositions of this type as long as it does not compromise the objects of the invention, and is preferably 0 to 10 parts, and more preferably 0 to 5 parts by weight per 100 parts by weight of the base polymer. The amount of functional polymer, when added, is preferably at least 1 part by weight.

Preferred examples of the functional polymer which will be localized at the coating top include polymers and copolymers comprising fluorinated units of one or more types, and copolymers comprising fluorinated units and other units. Illustrative examples of suitable fluorinated units and other units are shown below, but not limited thereto.

-continued
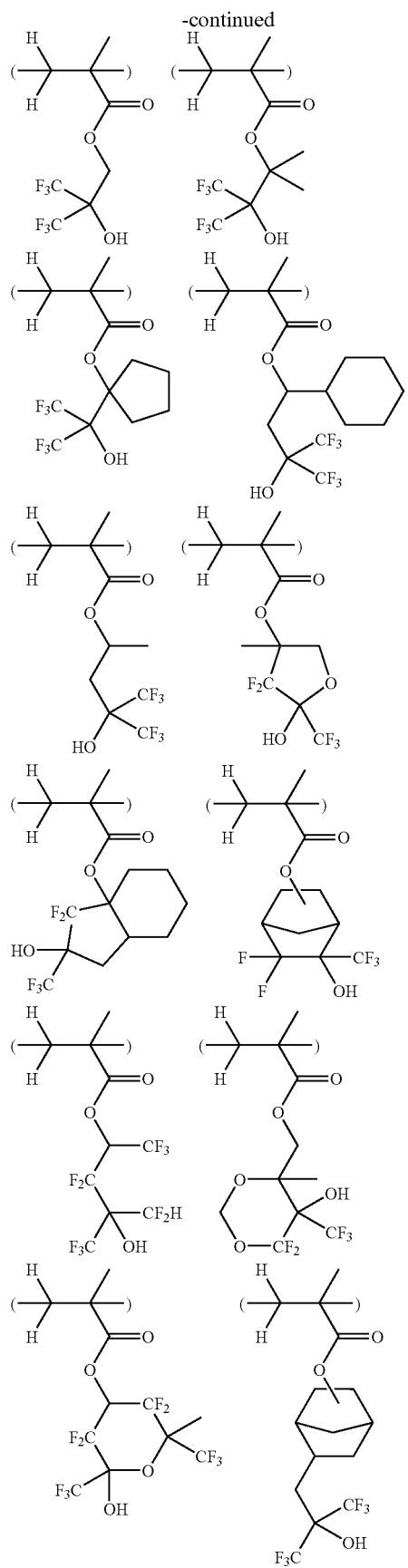
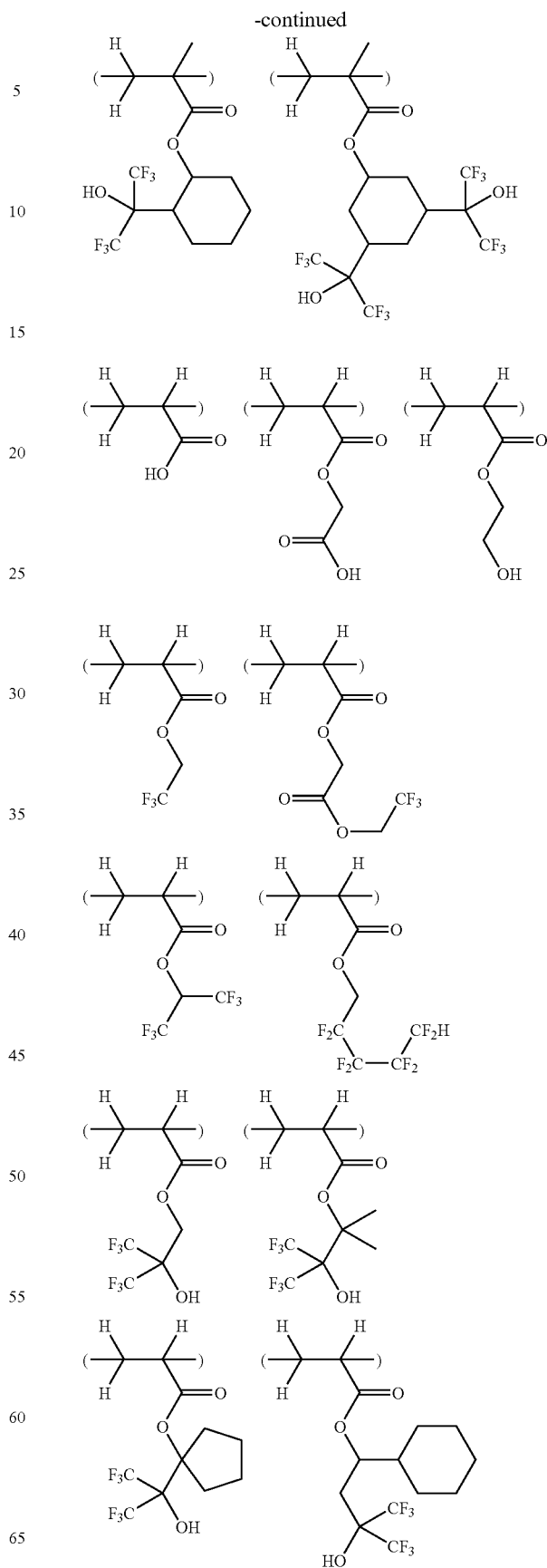

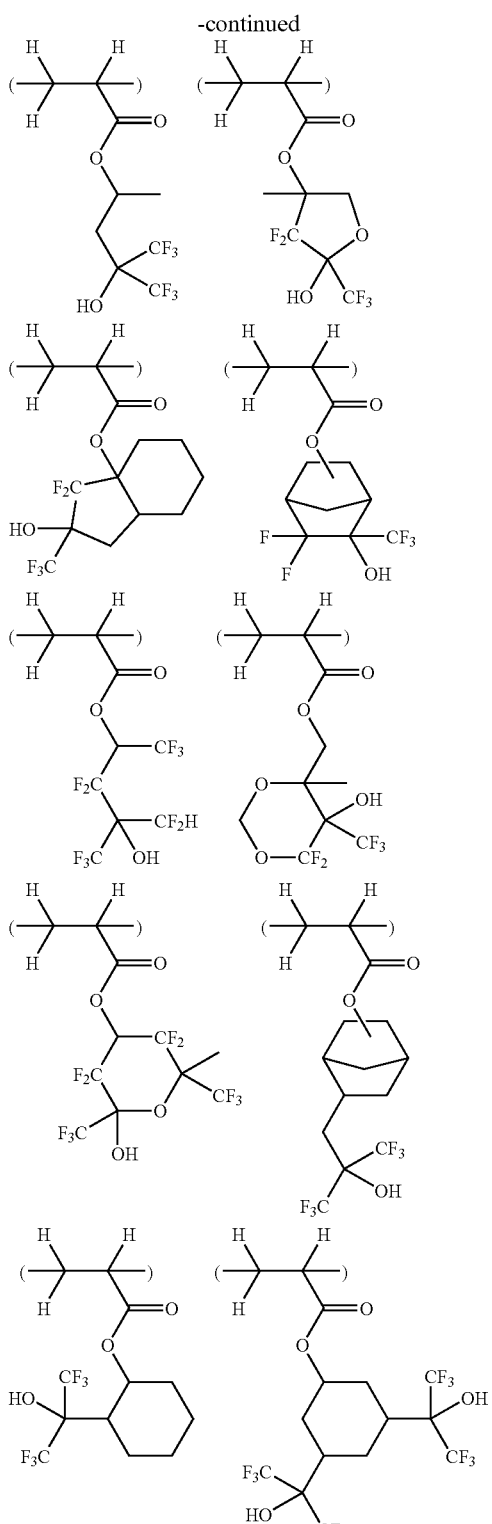

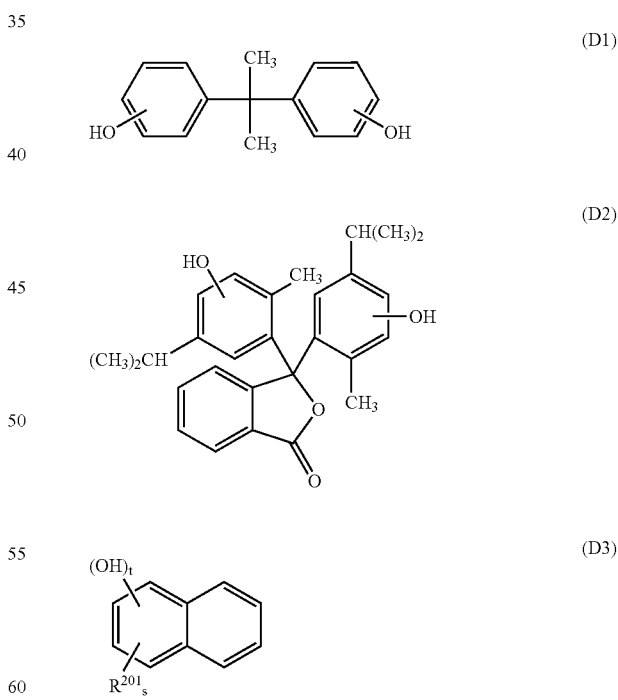

The functional polymer which will be localized at the coating top should preferably have a weight average molecular weight of 1,000 to 50,000, more preferably 2,000 to 20,000, as measured by GPC versus polystyrene standards. Outside the range, the polymer may have insufficient surface-modifying effect or cause development defects.

To the resist composition of the invention, other components such as dissolution regulators, carboxylic acid compounds and acetylene alcohol derivatives may be added if necessary. Optional components may be added in conventional amounts so long as this does not compromise the objects of the invention.

The dissolution regulator which can be added to the resist composition is a compound having on the molecule at least two phenolic hydroxyl groups, in which an average of from 0 to 100 mol % of all the hydrogen atoms on the phenolic hydroxyl groups are replaced by acid labile groups or a compound having on the molecule at least one carboxyl group, in which an average of 50 to 100 mol % of all the hydrogen atoms on the carboxyl groups are replaced by acid labile groups, both the compounds having an average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having a carboxyl group include those of formulas (D1) to (D14) below.

-continued

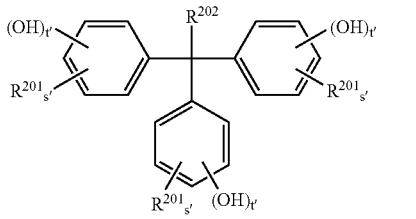 (D5)

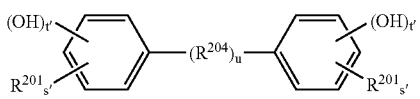 (D6)

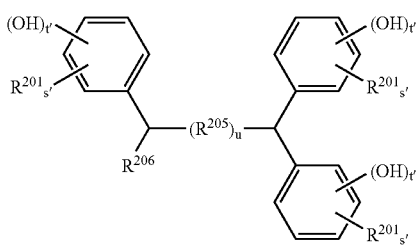 (D7)

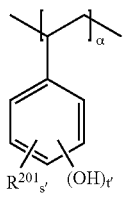 (D8)

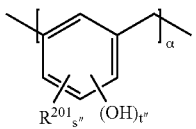 (D9)

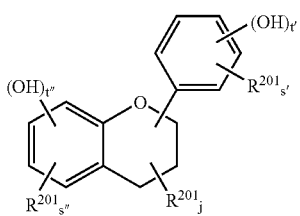 (D10)

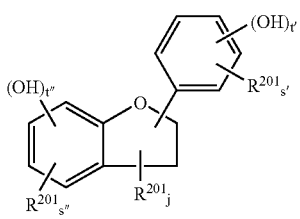 (D11)

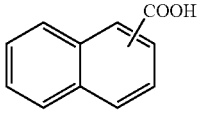 (D12)

-continued

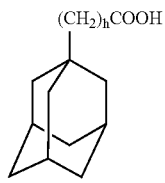 (D13)

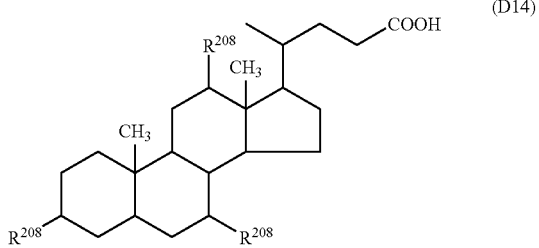 (D14)

In these formulas, $R^{201}$ and $R^{202}$ are each hydrogen or a straight or branched $C_1$-$C_8$ alkyl or alkenyl group, for example, hydrogen, methyl, ethyl, butyl, propyl, ethynyl and cyclohexyl.

$R^{203}$ is hydrogen, a straight or branched $C_1$-$C_8$ alkyl or alkenyl group, or —$(R^{207})_h$—COOH wherein $R^{207}$ is a straight or branched $C_1$-$C_{10}$ alkylene, for example, those exemplified for $R^{201}$ and $R^{202}$ and —COOH and —CH$_2$COOH.

$R^{204}$ is —$(CH_2)_i$— wherein i=2 to 10, $C_6$-$C_{10}$ arylene, carbonyl, sulfonyl, an oxygen atom, or a sulfur atom, for example, ethylene, phenylene, carbonyl, sulfonyl, oxygen atom or sulfur atom.

$R^{205}$ is a $C_1$-$C_{10}$ alkylene, a $C_6$-$C_{10}$ arylene, carbonyl, sulfonyl, an oxygen atom, or a sulfur atom, for example, methylene and those exemplified for $R^{204}$.

$R^{206}$ is hydrogen, a straight or branched $C_1$-$C_8$ alkyl or alkenyl, or a phenyl or naphthyl group in which at least one hydrogen atom is substituted by a hydroxyl group, for example, hydrogen, methyl, ethyl, butyl, propyl, ethynyl, cyclohexyl, hydroxyl-substituted phenyl, and hydroxyl-substituted naphthyl.

$R^{208}$ is hydrogen or hydroxyl.

The letter j is an integer from 0 to 5; u and h are each 0 or 1; s, t, s', t', s", and t" are each numbers which satisfy s+t=8, s"+t"=5, and s"+t"=4, and are such that each phenyl skeleton has at least one hydroxyl group; and α is a number such that the compounds of formula (D8) or (D9) have a weight average molecular weight of from 100 to 1,000.

Exemplary acid labile groups on the dissolution regulator include a variety of such groups, typically groups of the general formulae (L1) to (L4), tertiary $C_4$-$C_{20}$ alkyl groups, trialkylsilyl groups in which each of the alkyls has 1 to 6 carbon atoms, and $C_4$-$C_{20}$ oxoalkyl groups. Examples of the respective groups are as previously described.

The dissolution regulator may be formulated in an amount of 0 to 50 parts, preferably 0 to 40 parts, and more preferably 0 to 30 parts by weight, per 100 parts by weight of the base polymer, and may be used singly or as a mixture of two or more thereof. The use of more than 50 parts of the dissolution regulator would lead to slimming of the patterned film, and thus a decline in resolution.

The dissolution regulator can be synthesized by introducing acid labile groups into a compound having phenolic hydroxyl or carboxyl groups in accordance with an organic chemical formulation.

In the resist composition, a carboxylic acid compound may be blended. The carboxylic acid compound used herein may be one or more compounds selected from Groups I and II below, but is not limited thereto. Including this compound improves the PED stability of the resist and ameliorates edge roughness on nitride film substrates.

Group I:

Compounds in which some or all of the hydrogen atoms on the phenolic hydroxyl groups of the compounds of general formulas (A1) to (A10) below are replaced by —$R^{401}$—COOH (wherein $R^{401}$ is a straight or branched $C_1$-$C_{10}$ alkylene group), and in which the molar ratio C/(C+D) of phenolic hydroxyl groups (C) to ≡C—COOH groups (D) in the molecule is from 0.1 to 1.0.

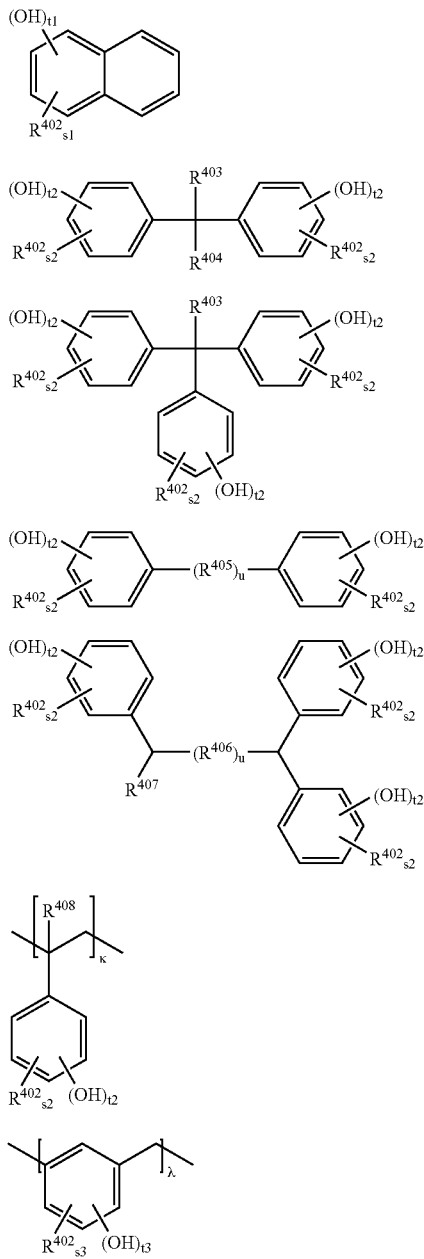

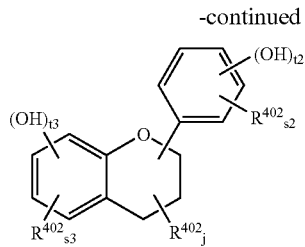

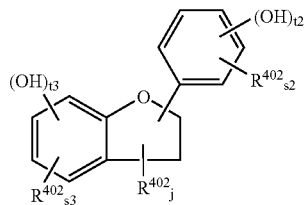

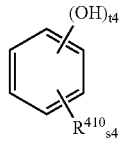

In these formulas, $R^{402}$ and $R^{403}$ are each hydrogen or a straight or branched $C_1$-$C_8$ alkyl or alkenyl; $R^{404}$ is hydrogen, a straight or branched $C_1$-$C_8$ alkyl or alkenyl, or a —($R^{409}$)$_h$—COOR' group (R' being hydrogen or —$R^{409}$—COOH); $R^{405}$ is —(CH$_2$)$_i$— (wherein i is 2 to 10), a $C_6$-$C_{10}$ arylene, carbonyl, sulfonyl, an oxygen atom, or a sulfur atom; $R^{406}$ is a $C_1$-$C_{10}$ alkylene, a $C_6$-$C_{10}$ arylene, carbonyl, sulfonyl, an oxygen atom, or a sulfur atom; $R^{407}$ is hydrogen, a straight or branched $C_1$-$C_8$ alkyl or alkenyl, or a hydroxyl-substituted phenyl or naphthyl; $R^{408}$ is hydrogen or methyl; $R^{409}$ is a straight or branched $C_1$-$C_{10}$ alkylene; $R^{410}$ is hydrogen, a straight or branched $C_1$-$C_8$ alkyl or alkenyl, or a —$R^{411}$—COOH group; $R^{411}$ is a straight or branched $C_1$-$C_{10}$ alkylene; the letter j is a number from 0 to 3; u is a number from 1 to 4; h is a number from 0 to 4; s1, t1, s2, t2, s3, t3, s4, and t4 are each numbers which satisfy s1+t1=8, s2+t2=5, s3+t3=4, and s4+t4=6, and are such that each phenyl structure has at least one hydroxyl group; κ is a number such that the compound of formula (A6) may have a weight average molecular weight of 1,000 to 5,000; and λ is a number such that the compound of formula (A7) may have a weight average molecular weight of 1,000 to 10,000.

Group II:

Compounds of general formulas (A11) to (A15) below.

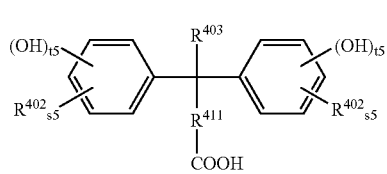

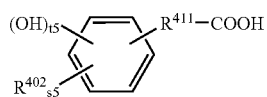

-continued (A13)
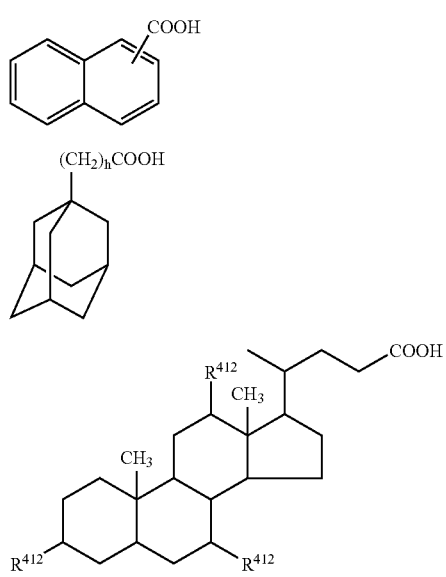
(A14)

(A15)

In these formulas, $R^{402}$, $R^{403}$ and $R^{411}$ are as defined above; $R^{412}$ is hydrogen or hydroxyl; s5 and t5 are numbers which satisfy $s5 \geqq 0$, $t5 \geqq 0$, and $s5+t5=5$; and h is a number from 0 to 4.

Illustrative, non-limiting examples of the compound having a carboxyl group include compounds of the general formulas AI-1 to AI-14 and AII-1 to AII-10 below.

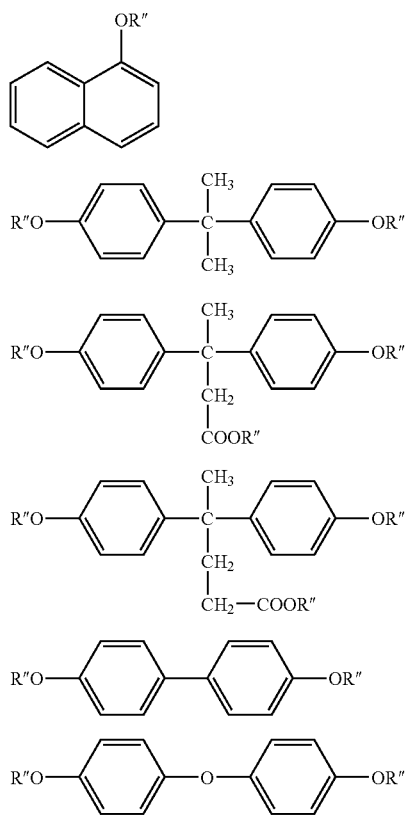

(AI-1)
(AI-2)
(AI-3)
(AI-4)
(AI-5)
(AI-6)

-continued

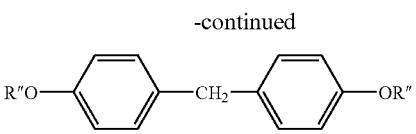
(AI-7)

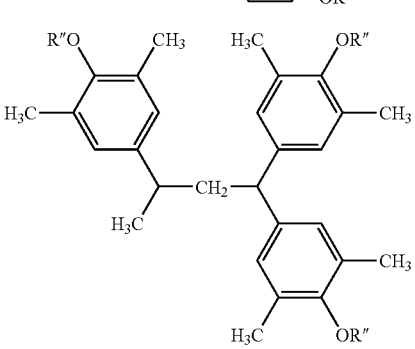
(AI-8)

(AI-9)

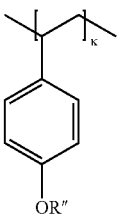
(AI-10)

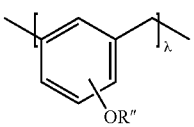
(AI-11)

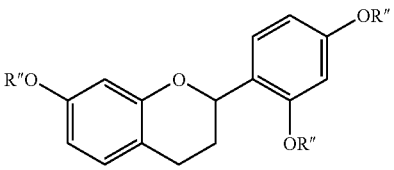
(AI-12)

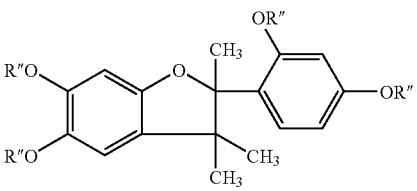
(AI-13)

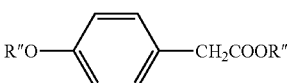
(AI-14)

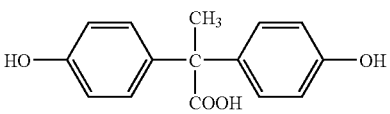
(AII-1)

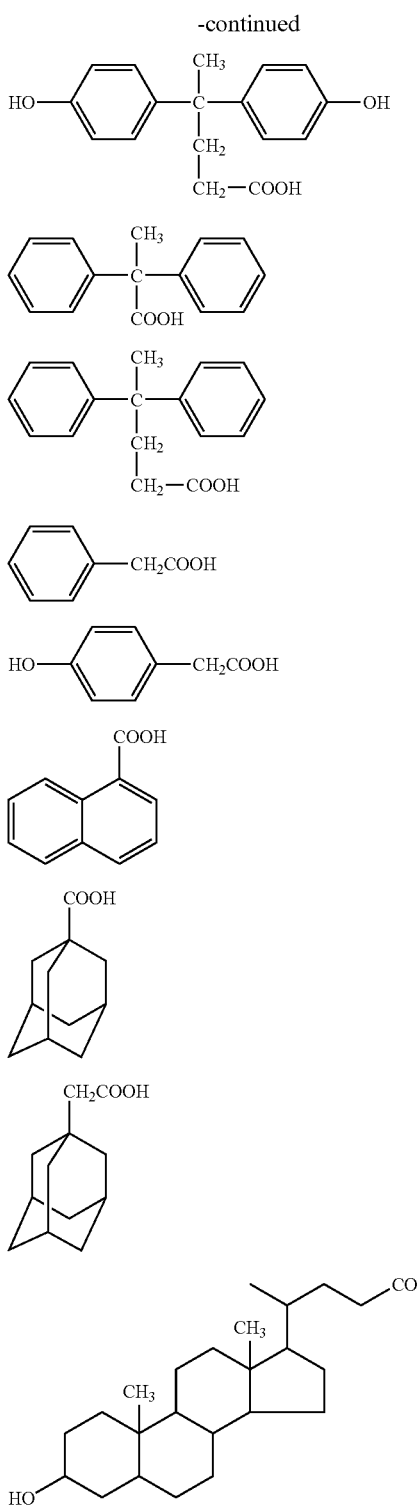

In the above formulas, R″ is hydrogen or a —CH₂COOH group such that the —CH₂COOH group accounts for 10 to 100 mol % of R″ in each compound, κ and λ are as defined above.

The compound having a ≡C—COOH group may be used singly or as combinations of two or more thereof. The compound having a ≡C—COOH group is added in an amount ranging from 0 to 5 parts, preferably 0.1 to 5 parts, more preferably 0.1 to 3 parts, further preferably 0.1 to 2 parts by weight, per 100 parts by weight of the base resin. More than 5 parts of the compound can reduce the resolution of the resist composition.

Preferred examples of the acetylene alcohol derivative which can be added to the resist composition include those having the general formula (S1) or (S2) below.

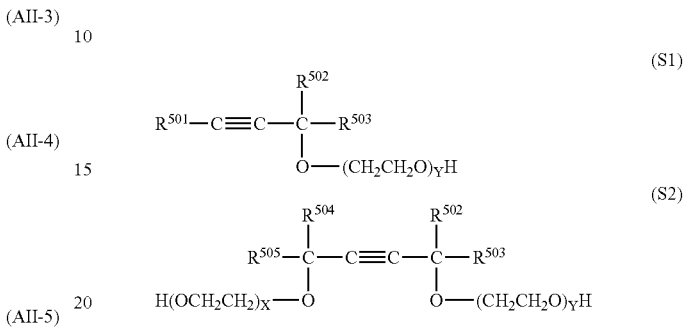

In the formulas, $R^{501}$, $R^{502}$, $R^{503}$, $R^{504}$, and $R^{505}$ are each hydrogen or a straight, branched or cyclic $C_1$-$C_8$ alkyl; and X and Y are each 0 or a positive number, satisfying $0 \leq X \leq 30$, $0 \leq Y \leq 30$, and $0 \leq X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industries Ltd.

The acetylene alcohol derivative is preferably added in an amount of 0 to 2 parts, more preferably 0.01 to 2 parts, and even more preferably 0.02 to 1 part by weight per 100 parts by weight of the base polymer in the resist composition. More than 2 parts by weight would result in a resist having a low resolution.

Process

Pattern formation using the resist composition of the invention may be performed by well-known lithography processes. The process generally involves coating, heat treatment (or prebaking), exposure, heat treatment (post-exposure baking, PEB), and development. If necessary, any additional steps may be added.

For pattern formation, the resist composition is first applied onto a substrate (on which an integrated circuit is to be formed, e.g., Si, SiO₂, SiN, SiON, TiN, WSi, BPSG, SOG, organic antireflective coating, Cr, CrO, CrON, MoSi, etc.) by a suitable coating technique such as spin coating, roll coating, flow coating, dip coating, spray coating or doctor coating. The coating is prebaked on a hot plate at a temperature of 60 to 150° C. for about 1 to 10 minutes, preferably 80 to 140° C. for 1 to 5 minutes. The resulting resist film is generally 0.01 to 2.0 μm thick.

A relationship of a reduced thickness of resist film to an etch selectivity ratio between resist film and processable substrate imposes severer limits on the process. Under consideration is the tri-layer process in which a resist layer, a silicon-containing intermediate layer, an undercoat layer having a high carbon density and high etch resistance, and a processable substrate are laminated in sequence from top to bottom. On etching with oxygen gas, hydrogen gas, ammonia gas or the like, a high etch selectivity ratio is available between the silicon-containing intermediate layer and the undercoat layer, which allows for thickness reduction of the silicon-containing intermediate layer. A relatively high etch selectivity ratio is also available between the monolayer resist and the silicon-containing intermediate layer, which allows for thickness reduction of the monolayer resist. The method for forming the undercoat layer in this case includes a coating and baking method and a CVD method. In the case of coating, novolac resins and resins obtained by polymerization of fused ring-containing olefins are used. In the CVD film formation, gases such as butane, ethane, propane, ethylene and acetylene are used. For the silicon-containing intermediate layer, either a coating method or a CVD method may be employed. The coating method uses silsesquioxane, cage oligo-silsesquioxane (POSS) and the like while the CVD method uses silane gases as the reactant. The silicon-containing intermediate layer may have an antireflection function with a light absorbing ability and have photo-absorptive groups like phenyl groups, or it may be a SiON film. An organic film may be formed between the silicon-containing intermediate layer and the photoresist, and the organic film in this case may be an organic antireflective coating. After the photoresist film is formed, deionized water rinsing (or post-soaking) may be carried out for extracting the photoacid generator and the like from the film surface or washing away particles, or a protective film may be coated.

With a mask having a desired pattern placed above the resist film, the resist film is then exposed to actinic radiation such as UV, deep-UV, electron beams, x-rays, excimer laser light, γ-rays and synchrotron radiation. The exposure dose is preferably about 1 to 200 mJ/cm$^2$, more preferably about 10 to 100 mJ/cm$^2$. The film is further baked on a hot plate at 60 to 150° C. for 1 to 5 minutes, preferably 1180 to 120° C. for 1 to 3 minutes (post-exposure baking=PEB). Thereafter the resist film is developed with a developer in the form of an aqueous base solution, for example, 0.1 to 5 wt %, preferably 2 to 3 wt % aqueous solution of tetramethylammonium hydroxide (TMAH) for 0.1 to 3 minutes, preferably 0.5 to 2 minutes by conventional techniques such as dip, puddle or spray techniques. In this way, a desired resist pattern is formed on the substrate. It is appreciated that the resist composition of the invention is suited for micro-patterning using such high-energy radiation as deep UV with a wavelength of 254 to 193 nm, vacuum UV with a wavelength of 157 nm, electron beams, soft x-rays, x-rays, excimer laser light, γ-rays and synchrotron radiation, and best suited for micro-patterning using high-energy radiation in the wavelength range of 180 to 200 nm.

Immersion lithography can be applied to the resist composition of the invention. The ArF immersion lithography uses a liquid having a refractive index of at least 1 and highly transparent at the exposure wavelength such as deionized water or alkanes as the immersion solvent. The immersion lithography involves prebaking a resist film and exposing the resist film to light through a projection lens, with deionized water or similar liquid interposed between the resist film and the projection lens. Since this allows projection lenses to be designed to a numerical aperture (NA) of 1.0 or higher, formation of finer patterns is possible. The immersion lithography is important for the ArF lithography to survive to the 45-nm node, with a further development thereof being accelerated. In the case of immersion lithography, deionized water rinsing (or post-soaking) may be carried out after exposure for removing water droplets left on the resist film, or a protective coating may be applied onto the resist film after pre-baking for preventing any dissolution from the resist and improving water slip on the film surface. The resist protective coating used in the immersion lithography is preferably formed from a solution of a polymer having 1,1,1,3,3,3-hexafluoro-2-propanol residue which is insoluble in water, but dissolvable in an alkaline developer liquid, in a solvent selected from alcohols of at least 4 carbon atoms, ethers of 8 to 12 carbon atoms, and mixtures thereof.

The technique enabling the ArF lithography to survive to the 32-nm node is a double patterning process. The double patterning process includes a trench process of processing an underlay to a 1:3 trench pattern by a first step of exposure and etching, shifting the position, and forming a 1:3 trench pattern by a second step of exposure for forming a 1:1 pattern; and a line process of processing a first underlay to a 1:3 isolated left pattern by a first step of exposure and etching, shifting the position, processing a second underlay formed below the first underlay by a second step of exposure through the 1:3 isolated left pattern, for forming a half-pitch 1:1 pattern.

EXAMPLE

Examples of the invention are given below by way of illustration and not by way of limitation. Mw is weight average molecular weight.

Preparation of Resist Material

Examples

Resist solutions were prepared by dissolving a polymer, acid generator, and basic compound in a solvent in accordance with the formulation shown in Table 1 and passing through a Teflon® filter with a pore size of 0.2 μm. In all runs, the solvent contained 0.01 wt % of surfactant KH-20 (Asahi Glass Co., Ltd.).

TABLE 1

| Resist | Resin | Acid generator | Base | Solvent 1 | Solvent 2 |
| --- | --- | --- | --- | --- | --- |
| R-01 | P-01 (80) | PAG-1 (4.4) | Base-1 (0.94) | PGMEA (560) | CyHO (240) |
| R-02 | P-02 (80) | PAG-1 (4.4) | Base-1 (0.94) | PGMEA (560) | CyHO (240) |
| R-03 | P-03 (80) | PAG-1 (4.4) | Base-1 (0.94) | PGMEA (560) | CyHO (240) |
| R-04 | P-04 (80) | PAG-1 (4.4) | Base-1 (0.94) | PGMEA (560) | CyHO (240) |
| R-05 | P-05 (80) | PAG-1 (4.4) | Base-1 (0.94) | PGMEA (560) | CyHO (240) |
| R-06 | P-06 (80) | PAG-1 (4.4) | Base-1 (0.94) | PGMEA (560) | CyHO (240) |
| R-07 | P-07 (80) | PAG-1 (4.4) | Base-1 (0.94) | PGMEA (560) | CyHO (240) |
| R-08 | P-08 (80) | PAG-1 (4.4) | Base-1 (0.94) | PGMEA (560) | CyHO (240) |
| R-09 | P-09 (80) | PAG-1 (4.4) | Base-1 (0.94) | PGMEA (560) | CyHO (240) |
| R-10 | P-10 (80) | PAG-1 (4.4) | Base-1 (0.94) | PGMEA (560) | CyHO (240) |
| R-11 | P-11 (80) | PAG-1 (4.4) | Base-1 (0.94) | PGMEA (560) | CyHO (240) |
| R-12 | P-12 (80) | PAG-1 (4.4) | Base-1 (0.94) | PGMEA (560) | CyHO (240) |
| R-13 | P-13 (80) | PAG-1 (4.4) | Base-1 (0.94) | PGMEA (560) | CyHO (240) |
| R-14 | P-14 (80) | PAG-1 (4.4) | Base-1 (0.94) | PGMEA (560) | CyHO (240) |

TABLE 1-continued

| Resist | Resin | Acid generator | Base | Solvent 1 | Solvent 2 |
|---|---|---|---|---|---|
| R-15 | P-15 (80) | PAG-1 (4.4) | Base-1 (0.94) | PGMEA (560) | CyHO (240) |
| R-16 | P-16 (80) | PAG-1 (4.4) | Base-1 (0.94) | PGMEA (560) | CyHO (240) |
| R-17 | P-17 (80) | PAG-1 (4.4) | Base-1 (0.94) | PGMEA (560) | CyHO (240) |
| R-18 | P-18 (80) | PAG-1 (4.4) | Base-1 (0.94) | PGMEA (560) | CyHO (240) |
| R-19 | P-19 (80) | PAG-1 (4.4) | Base-1 (0.94) | PGMEA (560) | CyHO (240) |
| R-20 | P-20 (80) | PAG-1 (4.4) | Base-1 (0.94) | PGMEA (560) | CyHO (240) |
| R-21 | P-21 (80) | PAG-1 (4.4) | Base-1 (0.94) | PGMEA (560) | CyHO (240) |
| R-22 | P-22 (80) | PAG-1 (4.4) | Base-1 (0.94) | PGMEA (560) | CyHO (240) |
| R-23 | P-23 (80) | PAG-1 (4.4) | Base-1 (0.94) | PGMEA (560) | CyHO (240) |
| R-24 | P-24 (80) | PAG-1 (4.4) | Base-1 (0.94) | PGMEA (560) | CyHO (240) |
| R-25 | P-25 (80) | PAG-1 (4.4) | Base-1 (0.94) | PGMEA (560) | CyHO (240) |
| R-26 | P-26 (80) | PAG-1 (4.4) | Base-1 (0.94) | PGMEA (560) | CyHO (240) |
| R-27 | P-27 (80) | PAG-1 (4.4) | Base-1 (0.94) | PGMEA (560) | CyHO (240) |
| R-28 | P-28 (80) | PAG-1 (4.4) | Base-1 (0.94) | PGMEA (560) | CyHO (240) |
| R-29 | P-29 (80) | PAG-1 (4.4) | Base-1 (0.94) | PGMEA (560) | CyHO (240) |
| R-30 | P-30 (80) | PAG-1 (4.4) | Base-1 (0.94) | PGMEA (560) | CyHO (240) |
| R-31 | P-31 (80) | PAG-1 (4.4) | Base-1 (0.94) | PGMEA (560) | CyHO (240) |
| R-32 | P-32 (80) | PAG-1 (4.4) | Base-1 (0.94) | PGMEA (560) | CyHO (240) |
| R-33 | P-33 (80) | PAG-1 (4.4) | Base-1 (0.94) | PGMEA (560) | CyHO (240) |
| R-34 | P-34 (80) | PAG-1 (4.4) | Base-1 (0.94) | PGMEA (560) | CyHO (240) |
| R-35 | P-35 (80) | PAG-1 (4.4) | Base-1 (0.94) | PGMEA (560) | CyHO (240) |
| R-36 | P-36 (80) | PAG-1 (4.4) | Base-1 (0.94) | PGMEA (560) | CyHO (240) |
| R-37 | P-37 (80) | PAG-1 (4.4) | Base-1 (0.94) | PGMEA (560) | CyHO (240) |
| R-38 | P-01 (80) | PAG-2 (4.9) | Base-1 (0.94) | PGMEA (560) | CyHO (240) |
| R-39 | P-02 (80) | PAG-2 (4.9) | Base-1 (0.94) | PGMEA (560) | CyHO (240) |
| R-40 | P-04 (80) | PAG-2 (4.9) | Base-1 (0.94) | PGMEA (560) | CyHO (240) |
| R-41 | P-05 (80) | PAG-2 (4.9) | Base-1 (0.94) | PGMEA (560) | CyHO (240) |
| R-42 | P-07 (80) | PAG-2 (4.9) | Base-1 (0.94) | PGMEA (560) | CyHO (240) |
| R-43 | P-01 (80) | PAG-3 (4.7) | Base-1 (0.94) | PGMEA (560) | CyHO (240) |
| R-44 | P-02 (80) | PAG-3 (4.7) | Base-1 (0.94) | PGMEA (560) | CyHO (240) |
| R-45 | P-04 (80) | PAG-3 (4.7) | Base-1 (0.94) | PGMEA (560) | CyHO (240) |
| R-46 | P-05 (80) | PAG-3 (4.7) | Base-1 (0.94) | PGMEA (560) | CyHO (240) |
| R-47 | P-07 (80) | PAG-3 (4.7) | Base-1 (0.94) | PGMEA (560) | CyHO (240) |
| R-48 | P-01 (80) | PAG-1 (2.2) PAG-3 (2.3) | Base-1 (0.94) | PGMEA (560) | CyHO (240) |
| R-49 | P-02 (80) | PAG-1 (2.2) PAG-3 (2.3) | Base-1 (0.94) | PGMEA (560) | CyHO (240) |
| R-50 | P-04 (80) | PAG-1 (2.2) PAG-3 (2.3) | Base-1 (0.94) | PGMEA (560) | CyHO (240) |
| R-51 | P-05 (80) | PAG-1 (2.2) PAG-3 (2.3) | Base-1 (0.94) | PGMEA (560) | CyHO (240) |
| R-52 | P-07 (80) | PAG-1 (2.2) PAG-3 (2.3) | Base-1 (0.94) | PGMEA (560) | CyHO (240) |
| R-53 | P-01 (80) | PAG-1 (4.4) | Base-2 (0.74) | PGMEA (560) | CyHO (240) |
| R-54 | P-02 (80) | PAG-1 (4.4) | Base-2 (0.74) | PGMEA (560) | CyHO (240) |
| R-55 | P-04 (80) | PAG-1 (4.4) | Base-2 (0.74) | PGMEA (560) | CyHO (240) |
| R-56 | P-05 (80) | PAG-1 (4.4) | Base-2 (0.74) | PGMEA (560) | CyHO (240) |
| R-57 | P-07 (80) | PAG-1 (4.4) | Base-2 (0.74) | PGMEA (560) | CyHO (240) |

The values in parentheses are in parts by weight.

Comparative Examples

Resist solutions for comparison were prepared by the same procedure as in Examples aside from using the formulation shown in Table 2.

TABLE 2

| Resist | Resin | Acid generator | Base | Solvent 1 | Solvent 2 |
|---|---|---|---|---|---|
| R-58 | P-38 (80) | PAG-1 (4.4) | Base-1 (0.94) | PGMEA (560) | CyHO (240) |
| R-59 | P-39 (80) | PAG-1 (4.4) | Base-1 (0.94) | PGMEA (560) | CyHO (240) |
| R-60 | P-40 (80) | PAG-1 (4.4) | Base-1 (0.94) | PGMEA (560) | CyHO (240) |
| R-61 | P-41 (80) | PAG-1 (4.4) | Base-1 (0.94) | PGMEA (560) | CyHO (240) |
| R-62 | P-42 (80) | PAG-1 (4.4) | Base-1 (0.94) | PGMEA (560) | CyHO (240) |
| R-63 | P-43 (80) | PAG-1 (4.4) | Base-1 (0.94) | PGMEA (560) | CyHO (240) |

The values in parentheses are in parts by weight.

In Tables 1 and 2, the acid generator, base and solvent are designated by abbreviations, which have the following meaning.

PAG-1: triphenylsulfonium nonafluorobutanesulfonate
PAG-2: 4-t-butoxyphenyldiphenylsulfonium nonafluorobutanesulfonate
PAG-3: triphenylsulfonium 1,1,3,3,3-pentafluoro-2-cyclohexylcarbonyloxypropanesulfonate
Base-1: tri(2-methoxymethoxyethyl)amine
Base-2: 2-(2-methoxyethoxymethoxy)ethylmorpholine
PGMEA: 1-methoxyisopropyl acetate
CyHO: cyclohexanone The resins designated by abbreviations are polymers constructed as in Tables 3 to 6.

TABLE 3

| Resin | Unit 1 | Unit 2 | Unit 3 | Unit 4 | Mw |
|---|---|---|---|---|---|
| P-01 | A-1M (0.30) | B-1M (0.25) | B-2M (0.45) | | 7,100 |
| P-02 | A-2M (0.30) | B-1M (0.25) | B-2M (0.45) | | 7,300 |
| P-03 | A-3M (0.30) | B-1M (0.25) | B-2M (0.45) | | 7,400 |
| P-04 | A-4M (0.30) | B-1M (0.25) | B-2M (0.45) | | 6,800 |
| P-05 | A-5M (0.30) | B-1M (0.25) | B-2M (0.45) | | 7,000 |
| P-06 | A-6M (0.30) | B-1M (0.25) | B-2M (0.45) | | 6,900 |
| P-07 | A-7M (0.30) | B-1M (0.25) | B-2M (0.45) | | 6,200 |
| P-08 | A-8M (0.30) | B-1M (0.25) | B-2M (0.45) | | 6,300 |
| P-09 | A-1M (0.20) | A'-9M (0.15) | B-1M (0.25) | B-2M (0.40) | 7,000 |
| P-10 | A-2M (0.20) | A'-9M (0.15) | B-1M (0.25) | B-2M (0.40) | 7,200 |
| P-11 | A-4M (0.20) | A'-9M (0.15) | B-1M (0.25) | B-2M (0.40) | 7,000 |
| P-12 | A-5M (0.20) | A'-9M (0.15) | B-1M (0.25) | B-2M (0.40) | 7,100 |
| P-13 | A-7M (0.20) | A'-9M (0.15) | B-1M (0.25) | B-2M (0.40) | 6,600 |
| P-14 | A-4M (0.30) | B-1M (0.25) | B-3M (0.45) | | 6,700 |
| P-15 | A-4M (0.30) | B-1M (0.25) | B-4M (0.45) | | 6,800 |
| P-16 | A-4M (0.30) | B-1M (0.25) | B-5M (0.45) | | 6,600 |
| P-17 | A-1M (0.25) | B-1M (0.25) | B-2M (0.40) | B-6M (0.10) | 6,700 |
| P-18 | A-2M (0.25) | B-1M (0.25) | B-2M (0.40) | B-6M (0.10) | 7,000 |
| P-19 | A-4M (0.25) | B-1M (0.25) | B-2M (0.40) | B-6M (0.10) | 6,800 |
| P-20 | A-5M (0.25) | B-1M (0.25) | B-2M (0.40) | B-6M (0.10) | 6,700 |
| P-21 | A-7M (0.25) | B-1M (0.25) | B-2M (0.40) | B-6M (0.10) | 6,100 |
| P-22 | A-1M (0.25) | B-1M (0.25) | B-2M (0.40) | F-2M (0.10) | 7,100 |
| P-23 | A-2M (0.25) | B-1M (0.25) | B-2M (0.40) | F-2M (0.10) | 7,200 |
| P-24 | A-4M (0.25) | B-1M (0.25) | B-2M (0.40) | F-2M (0.10) | 7,200 |
| P-25 | A-5M (0.25) | B-1M (0.25) | B-2M (0.40) | F-2M (0.10) | 7,100 |
| P-26 | A-7M (0.25) | B-1M (0.25) | B-2M (0.40) | F-2M (0.10) | 6,700 |
| P-27 | A-4M (0.25) | B-1M (0.25) | B-2M (0.40) | F-1M (0.10) | 7,000 |
| P-28 | A-5M (0.25) | B-1M (0.25) | B-2M (0.40) | F-1M (0.10) | 7,000 |
| P-29 | A-4M (0.25) | B-1M (0.25) | B-2M (0.40) | F-4M (0.10) | 6,800 |
| P-30 | A-5M (0.25) | B-1M (0.25) | B-2M (0.40) | F-4M (0.10) | 6,700 |
| P-31 | A-4M (0.25) | B-1M (0.25) | B-2M (0.40) | F-3M (0.10) | 6,900 |
| P-32 | A-5M (0.25) | B-1M (0.25) | B-2M (0.40) | F-3M (0.10) | 6,800 |
| P-33 | A-1M (0.30) | B-1A (0.25) | B-2M (0.45) | | 7,100 |
| P-34 | A-2M (0.30) | B-1A (0.25) | B-2M (0.45) | | 7,200 |
| P-35 | A-4M (0.30) | B-1A (0.25) | B-2M (0.45) | | 7,100 |
| P-36 | A-5M (0.30) | B-1A (0.25) | B-2M (0.45) | | 7,300 |
| P-37 | A-7M (0.30) | B-1A (0.25) | B-2M (0.45) | | 6,700 |
| P-38 | A'-10M (0.30) | B-1M (0.25) | B-2M (0.45) | | 7,100 |
| P-39 | A'-11M (0.30) | B-1M (0.25) | B-2M (0.45) | | 6,900 |
| P-40 | A'-12M (0.30) | B-1M (0.25) | B-2M (0.45) | | 7,200 |
| P-41 | A'-13M (0.30) | B-1M (0.25) | B-2M (0.45) | | 6,600 |
| P-42 | A'-14M (0.30) | B-1M (0.25) | B-2M (0.45) | | 7,300 |
| P-43 | A'-15M (0.30) | B-1M (0.25) | B-2M (0.45) | | 6,700 |

The value in parentheses is an incorporation ratio of a particular unit expressed in molar ratio.

TABLE 4

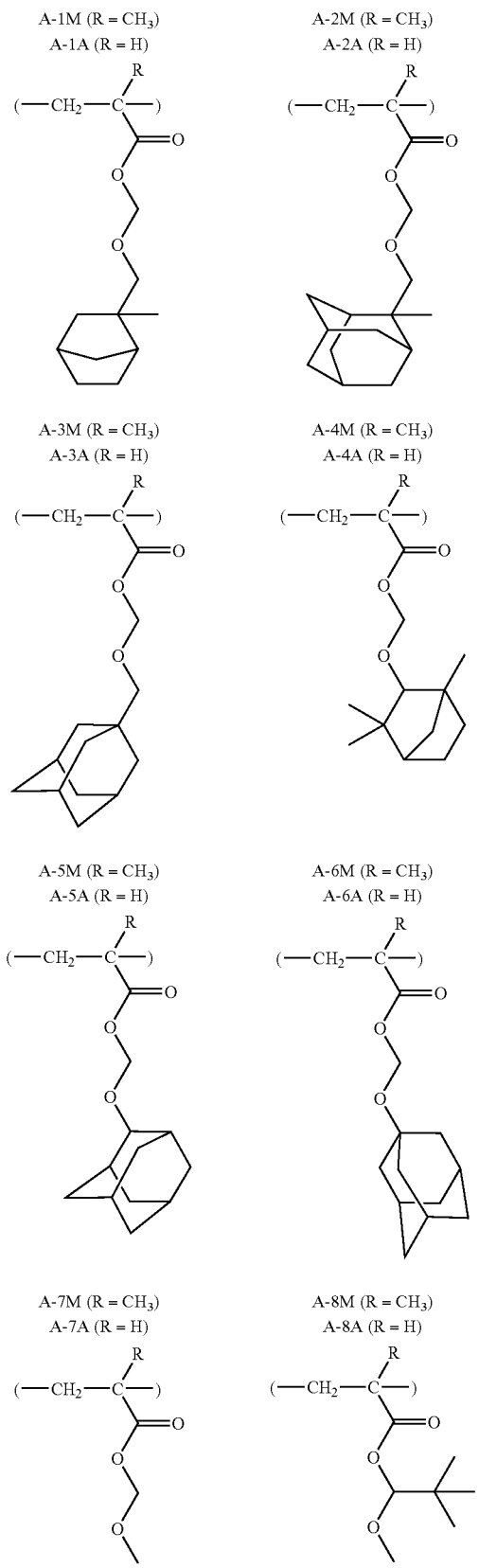

TABLE 4-continued
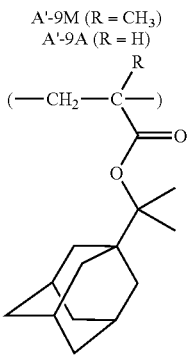
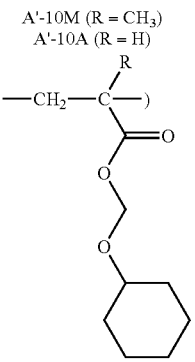
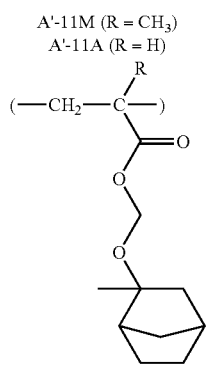
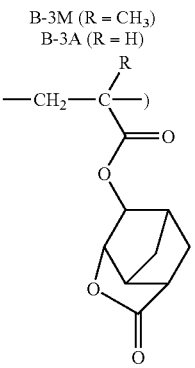
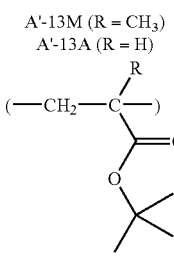
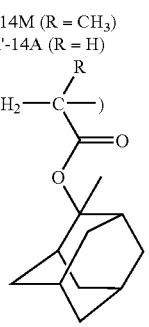
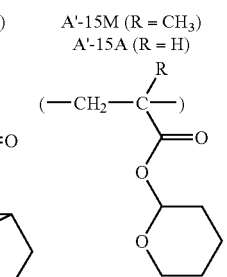
TABLE 5
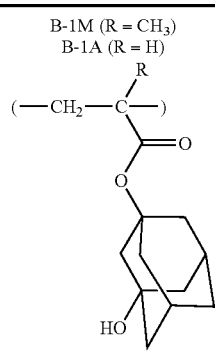
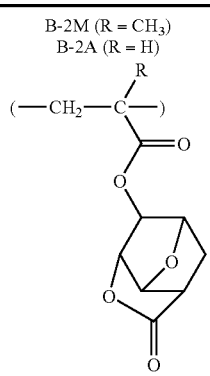
TABLE 5-continued
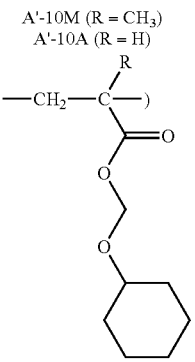
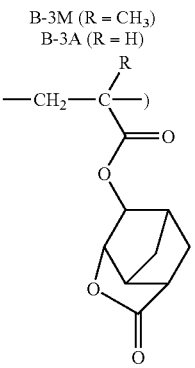
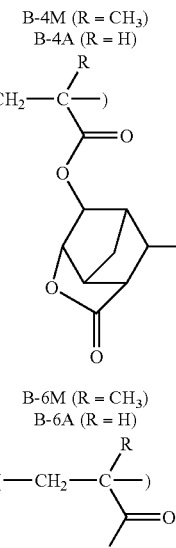
TABLE 6
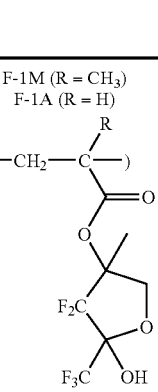
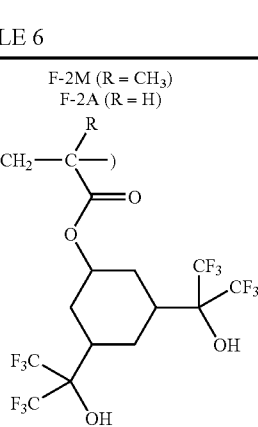
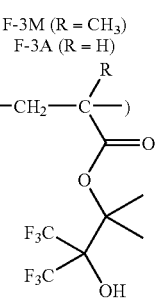
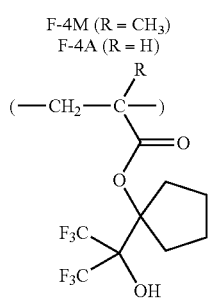
Resolution Test
Examples 1-57 and Comparative Examples 1-6
On silicon wafers having an antireflective coating (ARC29A, Nissan Chemical Industries Ltd.) of 78 nm thick, the resist solutions (R-01 to 57) of the invention and comparative resist solutions (R-58 to 63) were spin coated, then baked on a hot plate at 110° C. for 60 seconds to give resist films having a thickness of 170 nm. Using an ArF excimer laser stepper (Nikon Corp., NA 0.85), the resist films were exposed, baked (PEB) for 60 seconds and then puddle developed for 30 seconds with a 2.38 wt % aqueous solution of tetramethylammonium hydroxide. In this way, 1:1 line-and-space patterns and 1:10 isolated line patterns were formed. The PEB step used an optimum temperature for a particular resist composition.

The pattern-bearing wafers were observed under a top-down scanning electron microscope (TDSEM). The optimum exposure was an exposure dose (mJ/cm$^2$) which provided a 1:1 resolution at the top and bottom of a 90-nm 1:1 line-and-space pattern. The maximum resolution of the resist was defined as the minimum line width (on-mask size, in increments of 5 nm) of a 1:1 line-and-space pattern that separated at the optimum exposure, with smaller values indicating better resolution. The 1:10 isolated line pattern at the optimum exposure was also observed for determining an actual on-wafer size of the isolated line pattern with an on-mask size of 140 nm, which was reported as mask fidelity (on-wafer size, a larger size difference is better).

Tables 7 and 8 tabulate the test results (maximum resolution and mask fidelity) of the inventive and comparative resist compositions, respectively.

TABLE 7

| Example | Resist | PEB temp. | Optimum exposure | Maximum resolution | Pattern profile | Mask fidelity |
|---|---|---|---|---|---|---|
| 01 | R-01 | 110° C. | 40.0 mJ/cm$^2$ | 70 nm | rectangular | 89 nm |
| 02 | R-02 | 115° C. | 40.0 mJ/cm$^2$ | 70 nm | rectangular | 88 nm |
| 03 | R-03 | 115° C. | 41.0 mJ/cm$^2$ | 70 nm | rectangular | 91 nm |
| 04 | R-04 | 115° C. | 38.0 mJ/cm$^2$ | 70 nm | rectangular | 86 nm |
| 05 | R-05 | 120° C. | 39.0 mJ/cm$^2$ | 70 nm | rectangular | 85 nm |
| 06 | R-06 | 120° C. | 40.0 mJ/cm$^2$ | 70 nm | rectangular | 84 nm |
| 07 | R-07 | 120° C. | 42.0 mJ/cm$^2$ | 70 nm | rectangular | 90 nm |
| 08 | R-08 | 120° C. | 44.0 mJ/cm$^2$ | 75 nm | rectangular | 84 nm |
| 09 | R-09 | 110° C. | 42.0 mJ/cm$^2$ | 70 nm | rectangular | 87 nm |
| 10 | R-10 | 115° C. | 41.0 mJ/cm$^2$ | 70 nm | rectangular | 85 nm |
| 11 | R-11 | 115° C. | 41.0 mJ/cm$^2$ | 70 nm | rectangular | 83 nm |
| 12 | R-12 | 120° C. | 42.0 mJ/cm$^2$ | 70 nm | rectangular | 83 nm |
| 13 | R-13 | 120° C. | 45.0 mJ/cm$^2$ | 70 nm | rectangular | 88 nm |
| 14 | R-14 | 115° C. | 37.0 mJ/cm$^2$ | 70 nm | rectangular | 84 nm |
| 15 | R-15 | 115° C. | 39.0 mJ/cm$^2$ | 70 nm | rectangular | 82 nm |
| 16 | R-16 | 110° C. | 39.0 mJ/cm$^2$ | 75 nm | slightly rounded top | 80 nm |
| 17 | R-17 | 110° C. | 41.0 mJ/cm$^2$ | 70 nm | rectangular | 90 nm |
| 18 | R-18 | 115° C. | 43.0 mJ/cm$^2$ | 70 nm | rectangular | 90 nm |
| 19 | R-19 | 115° C. | 40.0 mJ/cm$^2$ | 70 nm | rectangular | 88 nm |
| 20 | R-20 | 120° C. | 40.0 mJ/cm$^2$ | 70 nm | rectangular | 86 nm |
| 21 | R-21 | 120° C. | 44.0 mJ/cm$^2$ | 70 nm | slightly rounded top | 93 nm |
| 22 | R-22 | 110° C. | 40.0 mJ/cm$^2$ | 70 nm | rectangular | 89 nm |
| 23 | R-23 | 115° C. | 39.0 mJ/cm$^2$ | 70 nm | rectangular | 89 nm |
| 24 | R-24 | 115° C. | 39.0 mJ/cm$^2$ | 70 nm | rectangular | 87 nm |
| 25 | R-25 | 120° C. | 40.0 mJ/cm$^2$ | 70 nm | rectangular | 85 nm |
| 26 | R-26 | 120° C. | 43.0 mJ/cm$^2$ | 70 nm | slightly rounded top | 89 nm |
| 27 | R-27 | 115° C. | 39.0 mJ/cm$^2$ | 70 nm | rectangular | 86 nm |
| 28 | R-28 | 120° C. | 38.0 mJ/cm$^2$ | 70 nm | rectangular | 83 nm |
| 29 | R-29 | 115° C. | 40.0 mJ/cm$^2$ | 75 nm | rectangular | 86 nm |
| 30 | R-30 | 120° C. | 40.0 mJ/cm$^2$ | 75 nm | rectangular | 84 nm |
| 31 | R-31 | 115° C. | 39.0 mJ/cm$^2$ | 70 nm | rectangular | 87 nm |
| 32 | R-32 | 120° C. | 39.0 mJ/cm$^2$ | 70 nm | rectangular | 84 nm |
| 33 | R-33 | 105° C. | 38.0 mJ/cm$^2$ | 80 nm | slightly rounded top | 84 nm |
| 34 | R-34 | 110° C. | 37.0 mJ/cm$^2$ | 80 nm | rectangular | 82 nm |
| 35 | R-35 | 110° C. | 36.0 mJ/cm$^2$ | 80 nm | slightly rounded top | 82 nm |
| 36 | R-36 | 115° C. | 36.0 mJ/cm$^2$ | 80 nm | rectangular | 80 nm |
| 37 | R-37 | 115° C. | 38.0 mJ/cm$^2$ | 80 nm | slightly rounded top | 86 nm |
| 38 | R-38 | 110° C. | 45.0 mJ/cm$^2$ | 70 nm | rectangular | 92 nm |
| 39 | R-39 | 115° C. | 44.0 mJ/cm$^2$ | 70 nm | rectangular | 91 nm |
| 40 | R-40 | 115° C. | 44.0 mJ/cm$^2$ | 70 nm | rectangular | 90 nm |
| 41 | R-41 | 120° C. | 45.0 mJ/cm$^2$ | 70 nm | rectangular | 90 nm |
| 42 | R-42 | 120° C. | 48.0 mJ/cm$^2$ | 70 nm | rectangular | 96 nm |
| 43 | R-43 | 110° C. | 42.0 mJ/cm$^2$ | 70 nm | rectangular | 90 nm |
| 44 | R-44 | 115° C. | 41.0 mJ/cm$^2$ | 70 nm | rectangular | 90 nm |
| 45 | R-45 | 115° C. | 40.0 mJ/cm$^2$ | 70 nm | rectangular | 88 nm |
| 46 | R-46 | 120° C. | 40.0 mJ/cm$^2$ | 70 nm | rectangular | 87 nm |
| 47 | R-47 | 120° C. | 44.0 mJ/cm$^2$ | 70 nm | rectangular | 94 nm |
| 48 | R-48 | 110° C. | 41.0 mJ/cm$^2$ | 70 nm | rectangular | 89 nm |
| 49 | R-49 | 115° C. | 40.0 mJ/cm$^2$ | 70 nm | rectangular | 89 nm |
| 50 | R-50 | 115° C. | 39.0 mJ/cm$^2$ | 70 nm | rectangular | 86 nm |
| 51 | R-51 | 120° C. | 39.0 mJ/cm$^2$ | 70 nm | rectangular | 86 nm |
| 52 | R-52 | 120° C. | 42.0 mJ/cm$^2$ | 70 nm | rectangular | 91 nm |
| 53 | R-53 | 110° C. | 41.0 mJ/cm$^2$ | 70 nm | rectangular | 89 nm |
| 54 | R-54 | 115° C. | 41.0 mJ/cm$^2$ | 70 nm | rectangular | 89 nm |
| 55 | R-55 | 115° C. | 39.0 mJ/cm$^2$ | 70 nm | rectangular | 85 nm |
| 56 | R-56 | 120° C. | 39.0 mJ/cm$^2$ | 70 nm | rectangular | 86 nm |
| 57 | R-57 | 120° C. | 41.0 mJ/cm$^2$ | 70 nm | rectangular | 90 nm |

TABLE 8

| Comparative Example | Resist | PEB temp. | Optimum exposure | Maximum resolution | Pattern profile | Mask fidelity |
|---|---|---|---|---|---|---|
| 01 | R-58 | 105° C. | 34.0 mJ/cm$^2$ | 85 nm | slightly rounded top | 44 nm |
| 02 | R-59 | 105° C. | 36.0 mJ/cm$^2$ | 80 nm | rectangular | 53 nm |
| 03 | R-60 | 110° C. | 36.0 mJ/cm$^2$ | 80 nm | rectangular | 55 nm |
| 04 | R-61 | 130° C. | 44.0 mJ/cm$^2$ | 85 nm | rectangular | 49 nm |
| 05 | R-62 | 125° C. | 41.0 mJ/cm$^2$ | 75 nm | rectangular | 67 nm |
| 06 | R-63 | 105° C. | 35.0 mJ/cm$^2$ | 80 nm | slightly rounded top | 51 nm |

It is seen from the results of Table 7 that the resist compositions within the scope of the invention have a high maximum resolution and improved mask fidelity. In contrast, Table 8 reveals that Comparative Examples 01 to 03 and 06, which use as the protective group for carboxylic acid an acetal protective group which is deprotected by way of β-elimination reaction, are inferior in mask fidelity to Examples. It has been demonstrated that resist compositions using an acetal protective group which is deprotected without resorting to β-elimination reaction according to the invention have excellent resolution and mask fidelity, as compared with compositions using ordinary acetal protective groups or constructed according to the prior art formulation.

Japanese Patent Application No. 2006-186302 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A positive resist composition comprising
(A) a resin component, and
(B) a compound which generates an acid in response to actinic light or radiation,
said resin compound comprising recurring units of the following formula:

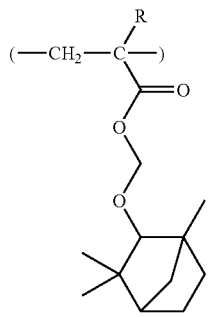

recurring units of the following formula:

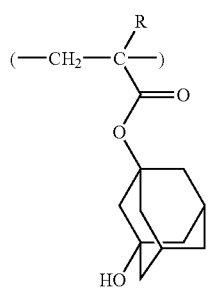

and recurring units selected from the group consisting of the following formulae:

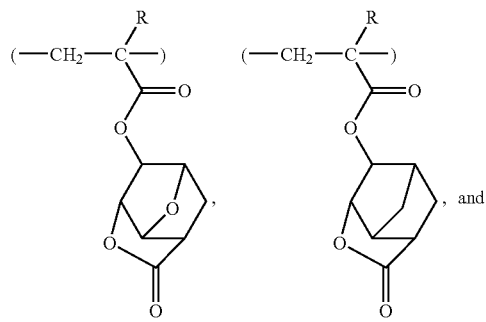

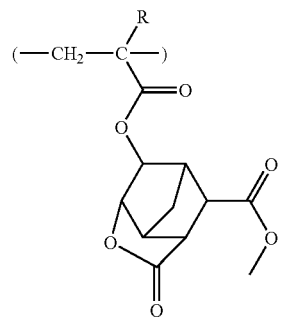

wherein R is hydrogen atom or methyl group.

2. The positive resist composition of claim 1, wherein said resin component further comprises recurring units of the following formula:

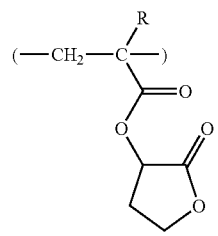

wherein R is hydrogen atom or methyl group.

* * * * *